US012777908B2

(12) United States Patent
Liaw

(10) Patent No.: US 12,777,908 B2
(45) Date of Patent: Oct. 27, 2026

(54) SEMICONDUCTOR STRUCTURE HAVING BACK-SIDE INTERCONNECT AND MANUFACTURING METHOD THEREOF

(71) Applicant: Taiwan Semiconductor Manufacturing Company, Ltd., Hsinchu (TW)

(72) Inventor: Jhon Jhy Liaw, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 674 days.

(21) Appl. No.: 18/193,052

(22) Filed: Mar. 30, 2023

(65) Prior Publication Data

US 2024/0194567 A1 Jun. 13, 2024

Related U.S. Application Data

(60) Provisional application No. 63/386,674, filed on Dec. 9, 2022.

(51) Int. Cl.

| | |
|---|---|
| ***H10W 20/20*** | (2026.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2026.01) |
| ***H10D 84/03*** | (2025.01) |
| ***H10D 84/85*** | (2025.01) |

(52) U.S. Cl.

CPC .......... *H10W 20/20* (2026.01); *H10D 30/014* (2025.01); *H10D 30/43* (2025.01); *H10D 30/6735* (2025.01); *H10D 30/6757* (2025.01); *H10D 62/121* (2025.01); *H10D 64/017* (2025.01); *H10D 84/0167* (2025.01); *H10D 84/017* (2025.01); *H10D 84/0186* (2025.01); *H10D 84/038* (2025.01); *H10D 84/85* (2025.01)

(58) Field of Classification Search

CPC . H01L 23/481; H01L 23/5286; H10D 30/014; H10D 30/43; H10D 30/6735; H10D 30/6757; H10D 62/121; H10D 64/017; H10D 84/0167; H10D 84/017; H10D 84/0186; H10D 84/038; H10D 84/85; H10D 62/151

See application file for complete search history.

(56) References Cited

U.S. PATENT DOCUMENTS 7,816,231 B2 * 10/2010 Dyer .................... G03F 9/7084 438/675
9,209,247 B2 12/2015 Colinge et al.
9,236,267 B2 1/2016 De et al.

(Continued)

*Primary Examiner* — Caleb E Henry
*Assistant Examiner* — Pratiksha Jayant Lohakare
(74) *Attorney, Agent, or Firm* — Cooper Legal Group, LLC

(57) ABSTRACT

A method includes forming a plurality of semiconductor sheets on a front-side of a semiconductive layer; forming a gate strip surrounding each of the semiconductor sheets; forming a plurality of source/drain structures on either side of each of the semiconductor sheets; doping the semiconductive layer with a dopant, the dopant has a same conductivity type as the source/drain structures; forming a power supply voltage line on a back-side of the doped semiconductive layer.

20 Claims, 91 Drawing Sheets

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 * | 11/2016 | Jiang | H01L 21/31053 |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 9,613,953 | B2 | 4/2017 | Liaw | |
| 9,793,273 | B2 | 10/2017 | Liaw | |
| 9,805,985 | B2 * | 10/2017 | Liaw | H10D 84/0158 |
| 10,090,325 | B1 | 10/2018 | Liaw | |
| 10,312,332 | B2 * | 6/2019 | Liaw | H10D 30/024 |
| 10,515,967 | B2 | 12/2019 | Liaw | |
| 2007/0138588 | A1 * | 6/2007 | Wilson | H10F 77/206 257/458 |
| 2008/0054313 | A1 * | 3/2008 | Dyer | G03F 9/7084 257/E21.597 |
| 2008/0206977 | A1 * | 8/2008 | Frank | H10D 30/021 438/597 |
| 2012/0187492 | A1 * | 7/2012 | Chou | H10D 86/01 257/E27.06 |
| 2014/0145264 | A1 * | 5/2014 | Frank | H10D 30/021 438/151 |
| 2014/0342529 | A1 * | 11/2014 | Goktepeli | H10D 30/6734 438/458 |
| 2021/0336063 | A1 * | 10/2021 | Liao | H01L 23/5286 |
| 2023/0069501 | A1 * | 3/2023 | Yeh | H10D 30/6735 |
| 2023/0093101 | A1 * | 3/2023 | Xie | H10D 30/43 257/690 |
| 2023/0197503 | A1 * | 6/2023 | Xie | H10D 64/017 257/288 |

* cited by examiner

C8-C8'

C2-C2'

C1-C1'

C1-C1'

C1-C1'

C1-C1'

C5-C5'

C5-C5'

SEMICONDUCTOR STRUCTURE HAVING BACK-SIDE INTERCONNECT AND MANUFACTURING METHOD THEREOF

PRIORITY CLAIM AND CROSS-REFERENCE

This application claims priority to U.S. Provisional Application Ser. No. 63/386,674, filed Dec. 9, 2022, which is herein incorporated by reference.

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
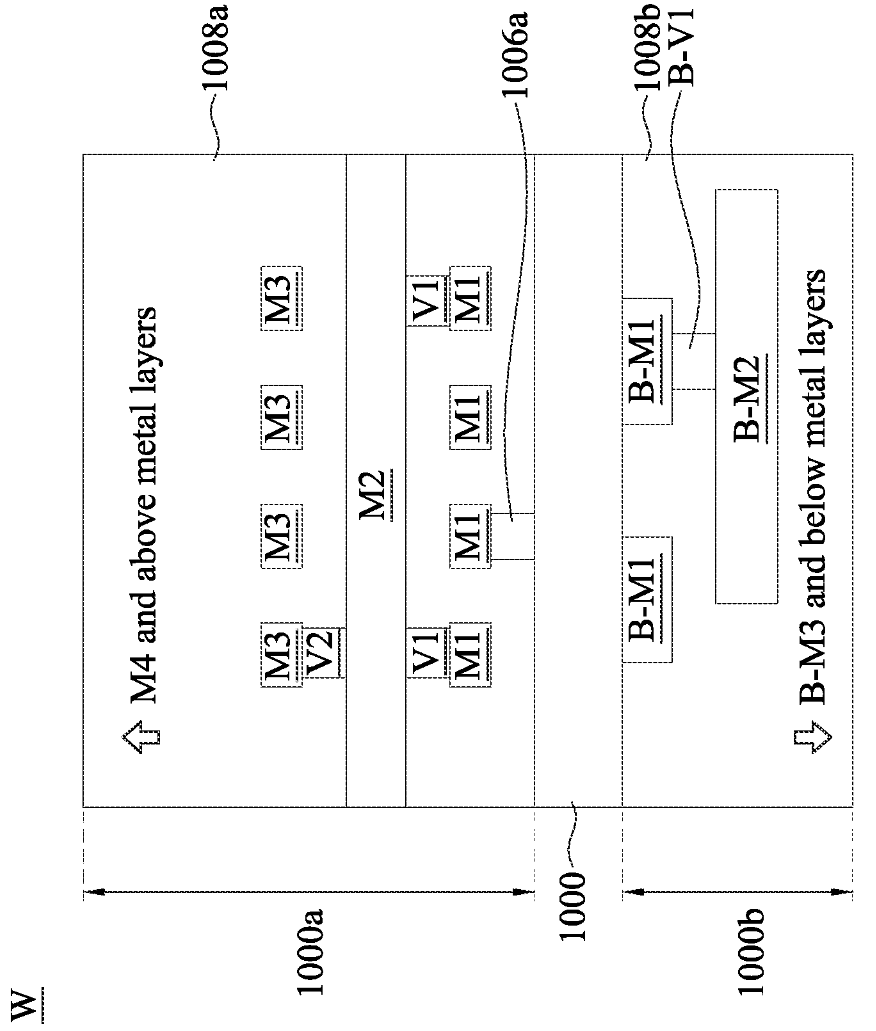
FIG. 1 is schematic view of a wafer including a front-side interconnect structure and a back-side interconnect structure on a device region thereof in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to integrated circuit (IC) structures and methods of forming the same. More particularly, some embodiments of the present disclosure are related to gate-all-around (GAA) devices including improved isolation structures to reduce current leakage from channels to the substrate. A GAA device includes a device that has its gate structure, or portions thereof, formed on four-sides of a channel region (e.g., surrounding a portion of a channel region). The channel region of a GAA device may include nanosheet channels, bar-shaped channels, and/or other suitable channel configurations. In some embodiments, the channel region of a GAA device may have multiple horizontal nanosheets or horizontal bars vertically spaced, making the GAA device a stacked horizontal GAA (S-HGAA) device. The GAA devices presented herein include a p-type metal-oxide-semiconductor GAA device and an n-type metal-oxide-semiconductor GAA device stack together. Further, the GAA devices may have one or more channel regions (e.g., nanosheets) associated with a single, contiguous gate structure, or multiple gate structures. One of ordinary skill may recognize other examples of semiconductor devices that may benefit from aspects of the present disclosure. In some embodiments, the nanosheets can be interchangeably referred to as nanowires, nanoslabs, nanorings, or nanostructures having nano-scale size (e.g., a few nanometers), depending on their geometry. In addition, the embodiments of the disclosure may also be applied, however, to a variety of metal oxide semiconductor transistors (e.g., complementary-field effect transistor (CFET) and fin field effect transistor (FinFET)).

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (FinFETs). For example, FinFETs may include fins on a substrate, with the fins acting as channel regions for the FinFETs. Similarly, planar FETs may include a substrate, with portions of the substrate acting as channel regions for the planar FETs.

In the course of IC evolution, functional density (i.e., the number of interconnected devices per chip area) has generally increased while geometry size (i.e., the smallest component (or line) that can be created using a fabrication process) has decreased. However, the smaller and more dense the metal lines in the IC structure will result in worse resistant thereof, thereby wasting processing power and processing speed during the operation of the IC structure. For example, in a cell routing of the IC structure, Vdd and Vss power routing may occupy too many routing resources and therefore impact the cell scaling as well as the performance of the IC structure (e.g., RC delay or IR drop). Hence, a part of power lines and power conductive vias are moved to wafer back-side, so as to reduce the routing loading and improve the circuit density in a same chip area. Nevertheless, the power conductive via on the wafer back-side may not be aligned with the source/drain region when forming thereof, which in turn non-overlaps with the source/drain region and/or overlaps with the gate, such that an unwanted connection may occur and therefore impacts the performance of IC structure.

Therefore, the present disclosure in various embodiments provides a metal line routing method to improve the functional density and operation performance on the IC structure. A doped semiconductive layer is formed to underlie the semiconductor sheet and extending along a lengthwise direction of the semiconductor sheet. Specifically, the doped semiconductive layer is formed by doping a fin-like structure underlying the semiconductor sheet with a dopant having a same conductivity type as the source/drain region formed overlying thereof. Subsequently, the source/drain region formed on the semiconductor sheet can self-align with the doped semiconductive layer. The source/drain region can be electrically connected to the back-side metal line through the doped semiconductive layer acting a power conductor path, and thus a manufacturing of a back-side power conductive via can be omitted and the doped semiconductive layer can be interchangeably referred to as a self-aligned connection structure. The fabrication of the doped semiconductive layer will not result in additional back-side power conductive via process and hence additional cost, such that an isolation margin issue of back-side power conductive via to gate electrode can be solved, which in turn allows for scaling the contacted poly pitch (CPP).

Reference is made to FIG. 1. FIG. 1 is schematic view of a wafer including a front-side interconnect structure and a back-side interconnect structure on a device region thereof in accordance with some embodiments of the present disclosure. As shown in FIG. 1, a device region 1000 is provide in the wafer W and includes, such as gate, channel, and source/drain regions. A front-side interconnect structure 1000*a* is formed after the device region formation. Specifically, the front-side interconnect structure 1000*a* is formed to have a front-side gate via 1006*a*, and a front-side source/drain via 1004*a*. The front-side interconnect structure 1000*a* may further include, for example, two metallization layers, labeled as M1, M2, and M3, with two layer of metallization via or interconnect, labeled as V1 and V2. Other embodiments may contain more or fewer metallization layers and corresponding more or fewer number of vias. The metal line illustrated here just for an example, and the metal line may be otherwise oriented (rotated 90 degrees or at other orientations). The front-side interconnect structure 1000*a* includes a full metallization stack, including a portion of each of metallization layers M1, M2, and M3 connected by the interconnect V1 and V2, with the front-side gate via 1006*a*, and the front-side source/drain via 1004*a* connecting the stack to the source/drain region and the gate of the transistor in the device region 1000. Also included in the front-side interconnect structure 1000*a* shown in FIG. 1 is a front-side IMD (inter-metal dielectric) layer 1008*a*. The front-side IMD layer 1008*a* may provide electrical insulation as well as structural support for the various features in the front-side interconnect structure 1000*a*.

As shown in FIG. 1, a back-side interconnect structure 1000*b* is formed after device region formation. The back-side interconnect structure 1000*b* is formed to include, for example, two metallization layers, labeled as B-M1 and B-M2, with one layer of metallization via B-V1 connected between the metallization layers B-M1 and B-M2. Other embodiments may contain more or fewer metallization layers and corresponding more or fewer number of vias. The metal line illustrated here just for an example, and the metal line may be otherwise oriented (rotated 90 degrees or at other orientations). The back-side interconnect structure

1000*b* may include a full metallization stack including the metallization layer and the metallization layer B-M1 connecting the stack to the source/drain region of the transistor in the device region 1000. Also included in the back-side interconnect structure 1000*b* shown in FIG. 1 can be a back-side IMD layer 1008*b*. The back-side IMD layer 1008*b* may provide electrical insulation as well as structural support for the various features in the back-side interconnect structure 1000*b*.

Figure 2A:
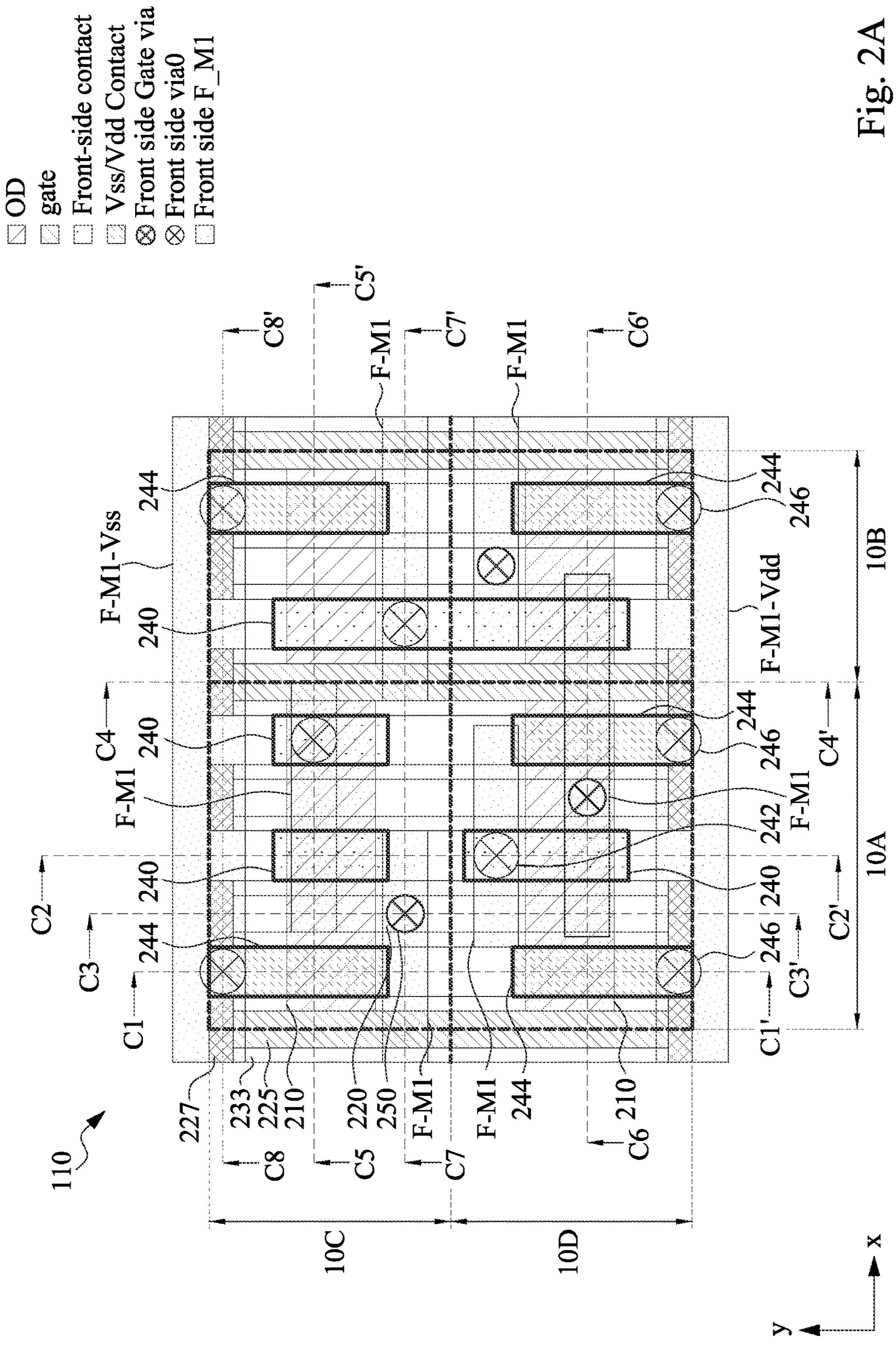
FIGS. 2A and 2B illustrate a layout diagram of a logic circuit on a front side and a back side of a semiconductor structure without showing a doped semiconductive layer, respectively, according to some embodiments of the present disclosure.
Figure 2B:
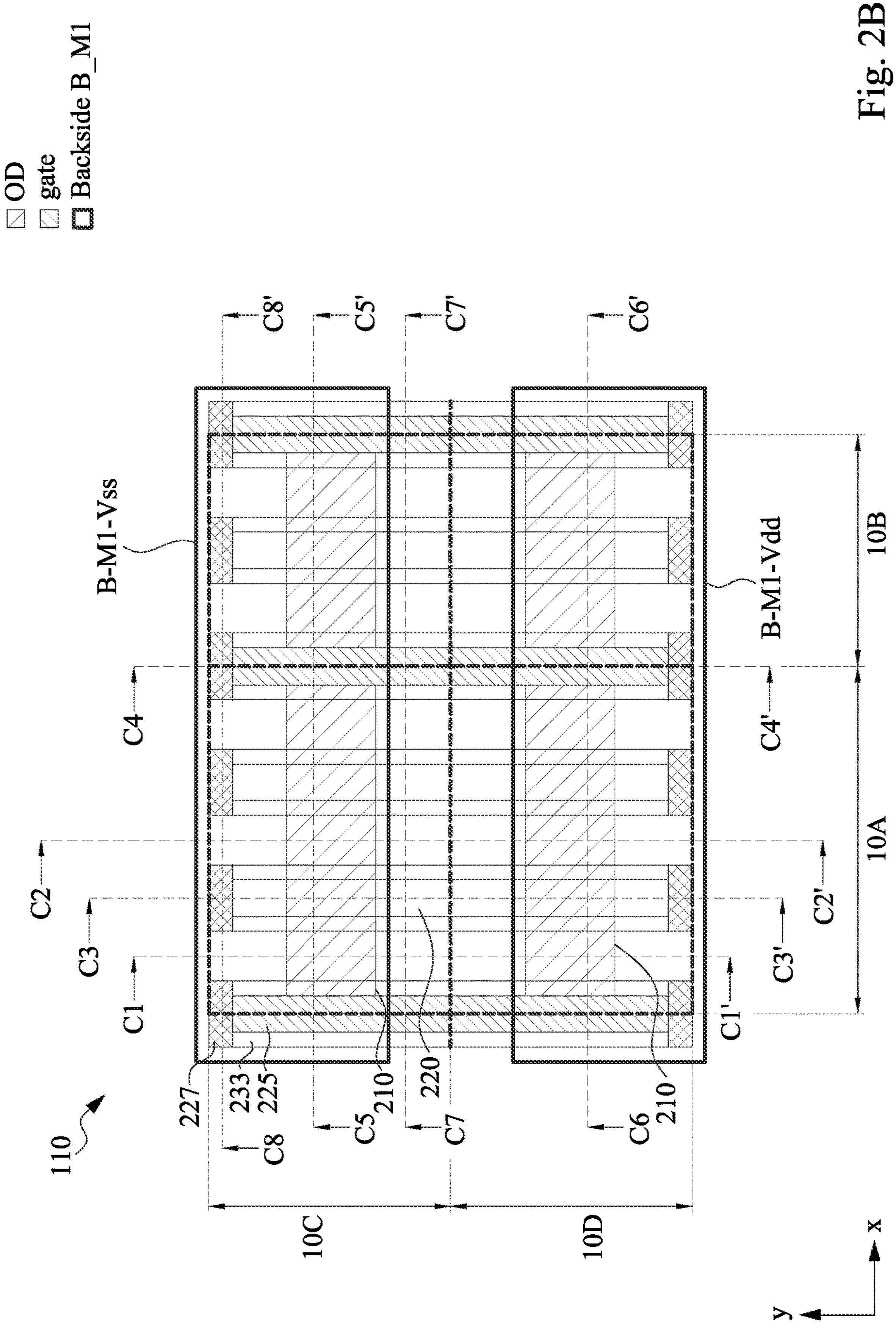
Figure 2C:
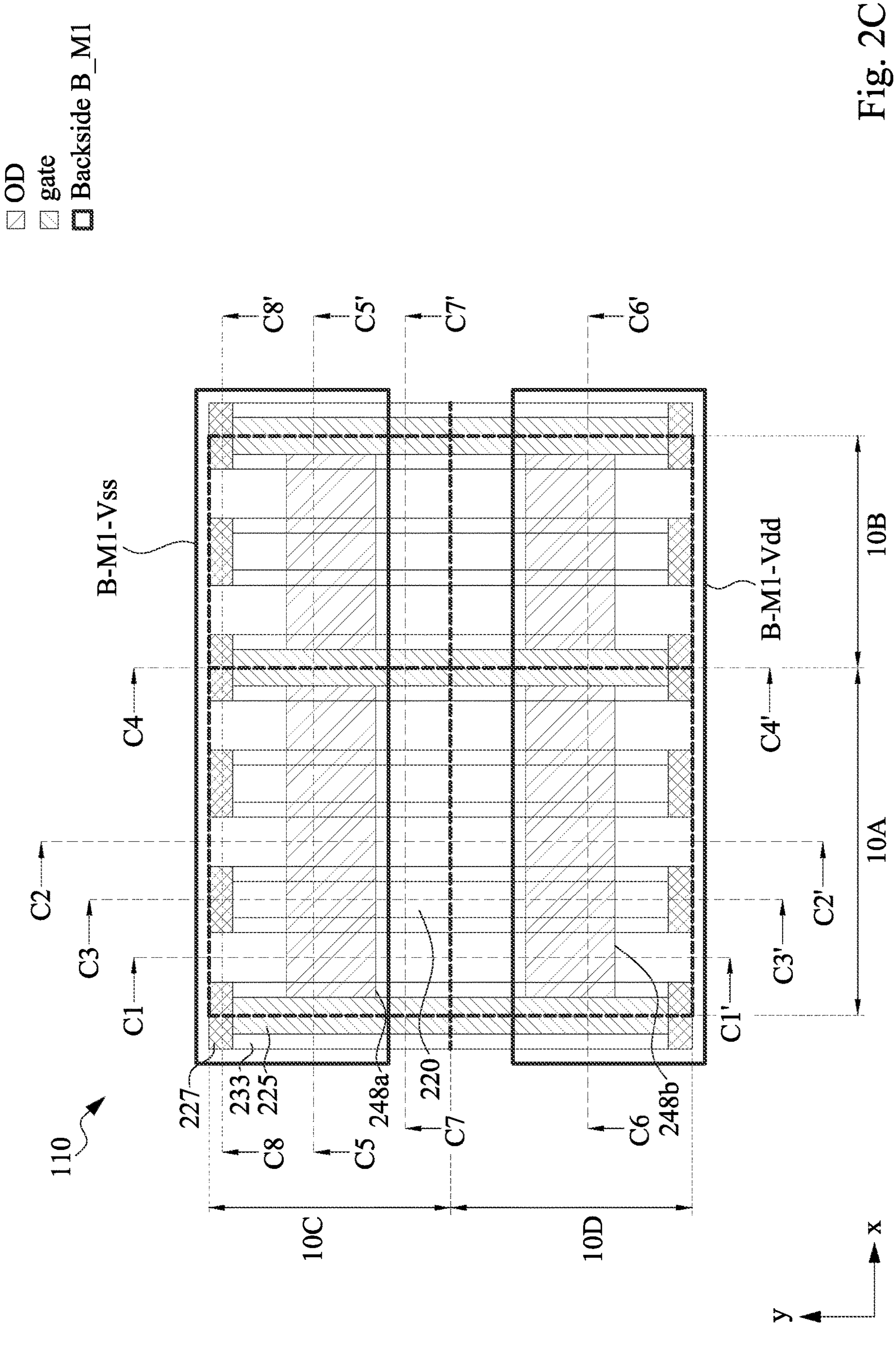
FIG. 2C illustrates a layout diagram of a semiconductor structure corresponding to FIG. 2B including a doped semiconductive layer according to some embodiments of the present disclosure, in which the doped semiconductive layer is fully broken by a dielectric gate.

Reference is made to FIGS. 2A-2C, 3A-3E, 3G, 3I, and 3J. FIGS. 2A and 2B illustrate a layout diagram of a logic circuit on a front side and a back side of a semiconductor structure without showing a doped semiconductive layer, respectively, according to some embodiments of the present disclosure. FIG. 2C illustrates a layout diagram of a semiconductor structure corresponding to FIG. 2B including a doped semiconductive layer according to some embodiments of the present disclosure, in which the doped semiconductive layer is fully broken by a dielectric gate. FIGS. 3A-3E, 3G, 3I, and 3J illustrate cross-sectional views obtained from reference cross-section C1-C1', C2-C2', C3-C3', C4-C4', C5-C5', C6-C6', C7-C7', and C8-C8' in FIGS. 2A-2C.

As shown in FIGS. 2A and 2B, a first logic circuit region 10A and a second circuit region 10B are arranged in the same row in the cell. The outer boundary of each of the first logic circuit region 10A and the second circuit region 10B is illustrated using dashed lines. In some embodiments, the first logic circuit region 10A and the second circuit region 10B may have the same cell height H. In some embodiments, the cell width W1 of the first logic circuit region 10A may be wider than the cell width W2 of the second circuit region 10B. In FIGS. 2A and 2B, it should be noted that the configuration of the first logic circuit region 10A and the second circuit region 10B in the logic circuit 110 is used as an illustration, and not to limit the disclosure. In some embodiments, the row in the cell of the logic circuit 110 may include more logic cells or fewer logic cells than the layout shown in FIGS. 2A and 2B. In some embodiments, the cell of the logic circuit 110 may include more rows or fewer rows and more columns or fewer columns than the layout shown in FIGS. 2A and 2B. Each logic cell provides a circuit or portion thereof, exemplary functionality provided by the cells includes, but are not limited to NAND, NOR, AND, XOR, XNOR, SACN, inverter, Flip-Flop, latch, and/or other suitable logic or storage functions. For example, the first logic circuit region 10A may have a first one of logic circuits shown in FIGS. 5A-5E, and the second circuit region 10B may have a second one of the logic circuits shown in FIGS. 5A-5E.

Figure 5A:
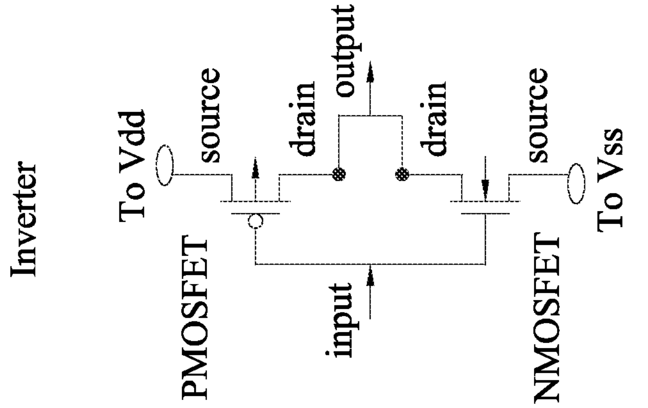
FIGS. 5A-5E are circuit schematics of various logic gates according to some embodiments of the present disclosure.
Figure 5B:
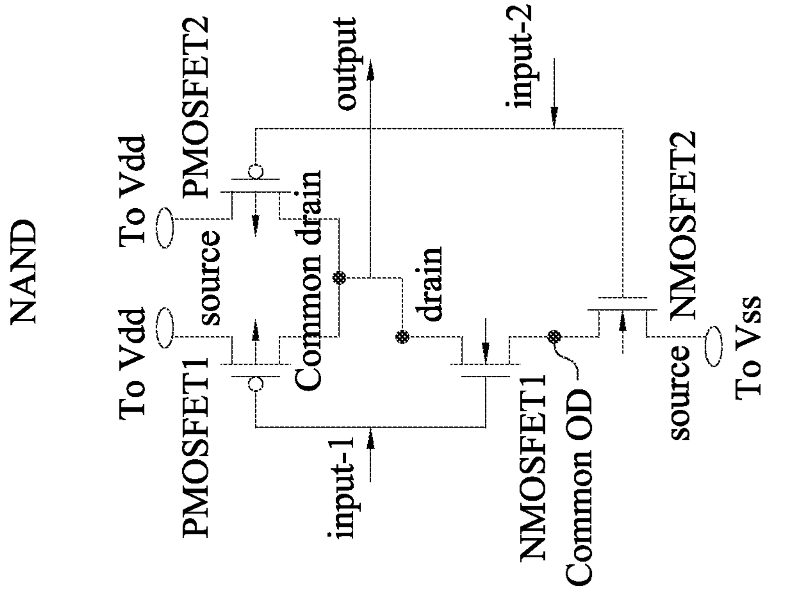
Figure 5C:
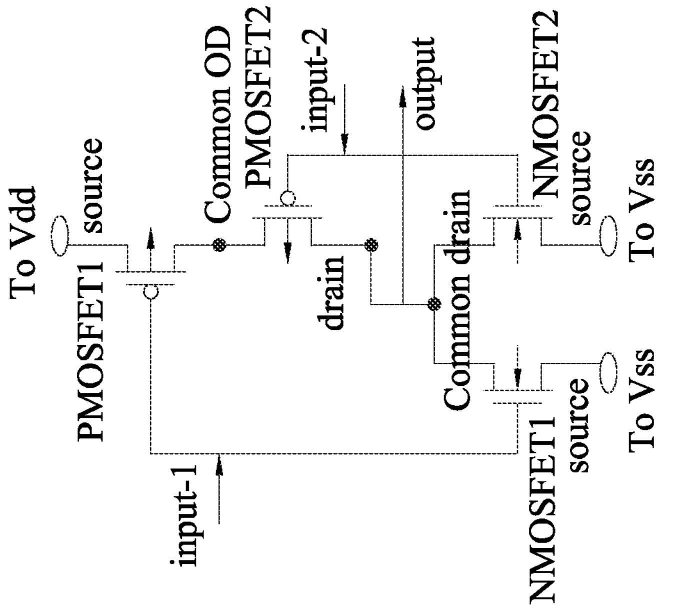
Figure 5D:
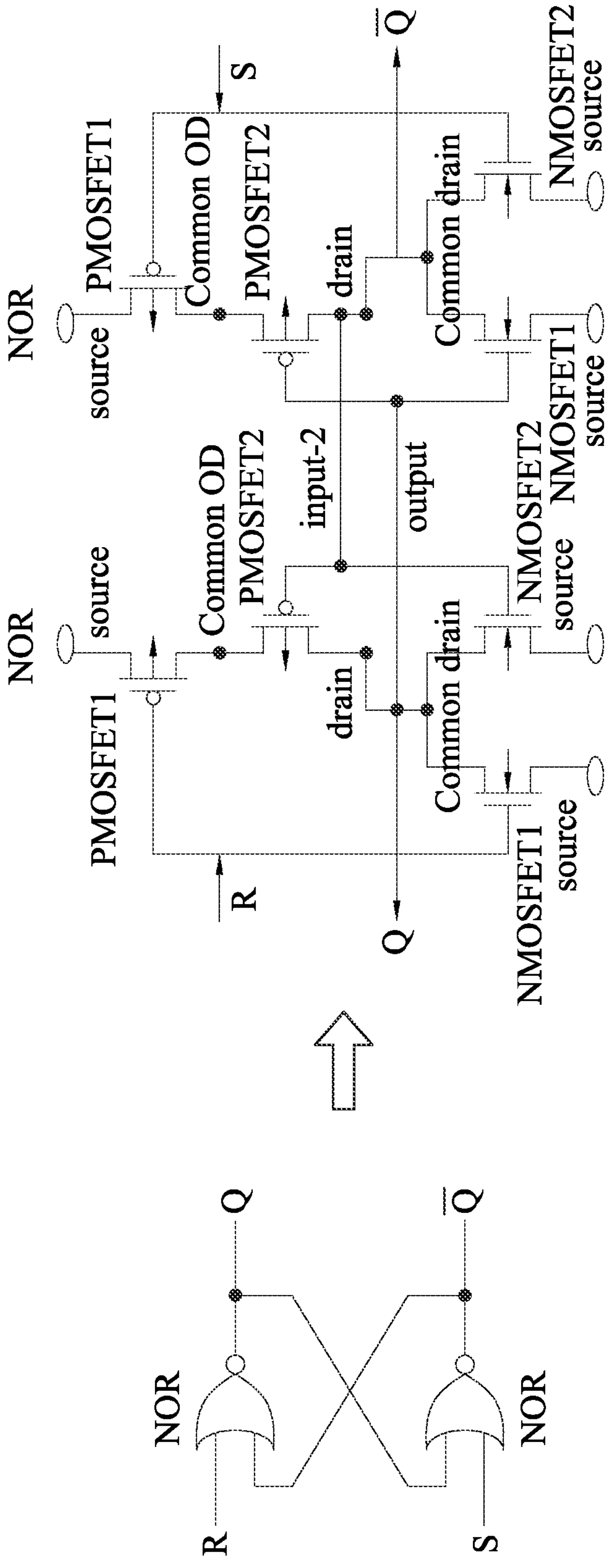
Figure 5E:
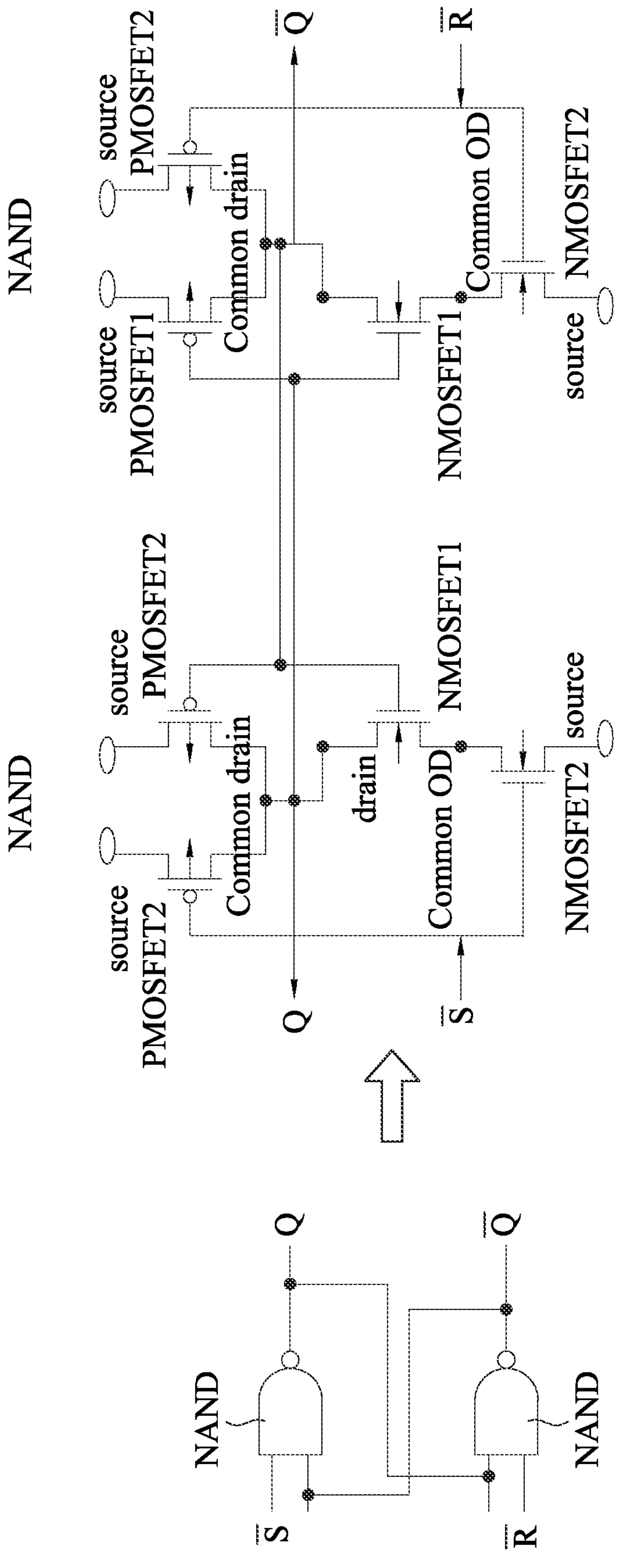

As examples, the logic gates shown in FIGS. 5A, 5B, and 5C include inverter, NAND, and NOR circuit schematics, respectively, and the logic gates shown in FIGS. 5D and 5E include Flip-Flop circuit schematics for NOR and NAND. It is understood that the top view layout of FIGS. 5A-5E may correspond to one or more of the circuit region shown in FIGS. 2A and 2B. The particular type of logic gate is determined by coupling the gate, source, and drain of the NMOSFETs and PMOSFETs in a specific configuration as shown in FIGS. 5A-5E. The input terminal and output terminal of each logic gate is also labeled in FIGS. 5A-5E as such. In the example configuration in FIGS. 5A-5E, many aspects of the channels, the gate electrode layers, gate dielectric layers, and gate spacers, etc. of the circuit schematics are the same as or similar to those shown in FIGS. 2A-3J. By way of example but not limiting the present disclosure, the first logic circuit region 10A may have a NAND circuit, and the second circuit region 10B may have an inverter.

In some embodiments, the logic circuit 110 may include transistors in a first conductivity type device region 10C and a second conductivity type device region 10D. In some embodiments, the transistors in the first conductivity type device region 10C may be NMOSFET transistors with silicon channel regions, and the transistors in the second conductivity type device region 10D may be PMOSFET transistors with silicon channel regions. In some embodiments, the transistors may be GAA FETs. The silicon channel regions of the NMOS and PMOS transistors are formed by semiconductor sheets 210. The semiconductor sheets 210 are stacked along the Z-direction (not shown) and are wrapped by the gate electrode, and the Z-direction is perpendicular to the plane formed by the X-direction and Y-direction. In some embodiments, the semiconductor sheets 210 has a length extending in the X-direction in a range from about 4 nm to about 12 nm, such as about 4, 5, 6, 7, 8, 9, 10, 11, or 12 nm. The semiconductor sheets 210 are on the front-sides 248*f*/248*s* of the doped semiconductive layer 248*a*/248*b* (see FIGS. 3E and 3G).

As shown in FIGS. 2A and 2B, the logic circuit 110 includes dielectric-base gates 225 extending in the Y-direction. The logic circuit 110 further includes gate electrodes 220 extending in the Y-direction and being arranged between adjacent two of the dielectric-base gates 225. In other words, the gate electrodes 220 extend in parallel with each other, and the dielectric-base gates 225 extend in parallel with a lengthwise direction of the gate electrodes 220. The transistors are surrounded by the dielectric-base gates 225. In other words, the dielectric-base gates 225 are formed in the boundary of the first logic circuit region 10A and in the boundary of the second circuit region 10B. Moreover, one of the dielectric-base gates 225 between the first and second logic circuit regions 10A and 10B is shared by the first and second logic circuit regions 10A and 10B, i.e., the first logic circuit region 10A and the second circuit region 10B in the same row are isolated (or separated) from each other by said dielectric-base gate 225. The material of the dielectric-base gates 225 is different from that of the gate electrodes 220. In some embodiments, the dielectric-base gates 225 can be interchangeably referred to dummy gates, dummy gate pattern, dummy gate strip, isolation structures/dielectric gates serving as circuit boundaries. Also included in FIGS. 2A and 2B, spacers 233 are formed on sidewalls of the dielectric-base gates 225 and the gate electrodes 220. In some embodiments, the electrodes 220 has a length extending in the Y-direction in a range from about 4 nm to about 70 nm, such as about 4, 5, 10, 15, 20, 25, 30, 35, 40, 45, 50, 55, 60, 65, or 70 nm.

As shown in FIG. 2A illustrating the logic circuit 110 on the front side of the semiconductor structure/wafer, the gate electrodes 220 are connected to an overlying level (e.g., metal line F-M1) through gate vias 250. Source/drain regions 218*a*/218*b* (see FIGS. 3A, 3B, 3E, and 3G) are formed on opposite sides of the semiconductor sheets 210 wrapping around by the gate electrodes 220. The source/drain regions 218*a* (see FIGS. 3A, 3E, and 3G) which are of Vdd node and Vss node can be electrically coupled to overlying power supply voltage line F-M1-Vdd/F-M1-Vss through a power supply voltage contact 244 and a conductive via 246. The source/drain regions 218*b* (see FIGS. 3B, 3E, and 3G) which are not of Vdd node and Vss node can be electrically coupled to overlying metal lines F-M1 through source/drain contacts 240 and source/drain vias 242.

In some embodiments, the power supply voltage line F-M1-Vdd can be interchangeably referred to as a Vdd line that is provided with positive a power supply voltage Vdd, and the power supply voltage line F-M1-Vss can be interchangeably referred to as a Vss line that is provided with power supply voltage Vss. In some embodiments, the cell can be powered through the positive power supply node Vdd that has a positive power supply voltage (also denoted as VDD). The cell can be also connected to power supply voltage Vss (also denoted as VSS), which may be an electrical ground. In some embodiments, the power supply voltage contact 244 can be interchangeably referred to as a Vss/Vdd contact. In some embodiments, the source/drain region 218*a* can be interchangeably referred to as a power conductor connection.

In some embodiments, a dopant in the source/drain regions 218*a* and 218*b* (see FIGS. 3A, 3B, and 3E) of the first conductivity type device region 10C (see FIGS. 2A-2C) has an opposite conductivity type to another dopant in the source/drain regions 218*a* and 218*b* of the second conductivity type device region 10D. For example, the source/drain regions 218*a* and 218*b* of the first conductivity type device region 10C may have an n-type dopant, and the source/drain regions 218*a* and 218*b* of the second conductivity type device region 10D may have a p-type dopant. In some embodiments, the source/drain regions 218*a* and 218*b* of the first conductivity type device region 10C may include SiP, SiC, SiPC, SiAs, Si, or a combination thereof. In some embodiments, the source/drain regions 218*a* and 218*b* of the first conductivity type device region 10C may have a phosphorus concentration within a range from about 2E19/$cm^3$ to about 3E21/$cm^3$. In some embodiments, the source/drain regions 218*a* and 218*b* of the second conductivity type device region 10D may include boron, $BF_2$, SiGe, or a combination thereof. In some embodiments, the source/drain regions 218*a* and 218*b* (see FIGS. 3A, 3B, and 3G) of the second conductivity type device region 10D (see FIGS. 2A-2C) may have a boron concentration within a range from about 1E19/$cm^3$ to about 6E20/$cm^3$. In some embodiments, the source/drain regions 218*a* and 218*b* of the second conductivity type device region 10D may have a Ge atomic percentage within a range of about 36% to about 85%. In some embodiments, the source/drain regions 218*a* and 218*b* of the second conductivity type device region 10D may include a carbon-containing material.

Throughout the description, the notations of metal lines may be followed by the metal line levels they are in, wherein the respective metal line level is placed in parenthesis. As shown in FIG. 2A, metal lines disposed at the M1 level on the front-side of the semiconductor structure may include the power supply voltage lines F-M1-Vdd and F-M1-Vss and the metal lines F-M1 laterally between the power supply voltage lines F-M1-Vdd and F-M1-Vss. The metal lines disposed at the M1 level on the front-side of the semiconductor structure may have lengthwise directions parallel to the X-direction (e.g., column direction). In some embodiments, the power supply voltage line F-M1-Vdd/F-M1-Vss disposed at the M1 level can be interchangeably referred to a power supply voltage landing pad or a power supply voltage landing line. In some embodiments, the lines can be interchangeably referred to metal layers, conductive lines, conductive layers, or conductors.

As shown in FIG. 2C illustrating the logic circuit 110 on the back side of the semiconductor structure with a doped semiconductive layer 248*a* in the first conductivity type device region 10C and a doped semiconductive layer 248*b* in the second conductivity type device region 10D, the source/drain regions 218*a* (see FIGS. 3A, 3E, and 3G) which are of Vdd node and Vss node can be electrically coupled to the underlying power supply voltage line B-M1-Vdd/B-M1-Vss through the doped semiconductive layer 248*a*/248*b*. The doped semiconductive layer 248*b* is on the back-side 218*k* of the source/drain region 218*a*. In some embodiments, the source/drain regions 218*a* (see FIGS. 3E and 3G) can extend into the doped semiconductive layer 248*a*/248*b*. In other words, the source/drain region 218*a* has the back-side 218*k* in a position lower than a front-side surface of the doped semiconductive layer 248*a*/248*b*. On the other hand, dielectric layers 249 can be formed between the source/drain regions 218*b* and the doped semiconductive layer 248*a*/248*b*, such that the source/drain regions 218*b* (sec FIGS. 3B, 3E, and 3G) which are not of Vdd node and Vss node can be isolated from doped semiconductive layers 248*a* and 248*b*. In some embodiments, a first portion of the doped semiconductive layer 248*a*/248*b* underlying the dielectric layer 249 has a thicker thickness than a thickness of a second portion of the doped semiconductive layer 248*a*/248*b* underlying the source/drain regions 218*a*. In some embodiments, the dielectric layer 249 can be interchangeably referred to a dielectric barrier layer or a leakage barrier.

Throughout the description, the notations of metal lines may be followed by the metal line levels they are in, wherein the respective metal line level is placed in parenthesis. As shown in FIG. 2C, metal lines disposed at the M1 level on the back-side of the semiconductor structure may include the power supply voltage lines B-M1-Vdd, and B-M1-Vss. The metal lines disposed at the M1 level on the back-side of the semiconductor structure may have lengthwise directions parallel to the X-direction (e.g., column direction) and perpendicular to a lengthwise direction of the gate electrode layer 220. In some embodiments, the power supply voltage line B-M1-Vss/B-M1-Vdd disposed at the M1 level on the back-side of the semiconductor structure can be interchangeably referred to a power supply voltage landing pad or a power supply voltage landing line. In some embodiments, the lines can be interchangeably referred to metal layers, conductive lines, conductive layers, or conductors. The back-side power supply voltage line B-M1-Vdd/B-M1-Vss are on the back-side 248*c*/248*k* of the doped semiconductive layer 248*a*/248*b* (see FIGS. 3E and 3G). The back-side power supply voltage line B-M1-Vdd/B-M1-Vss is electrically connected to the front-side power supply voltage line F-M1-Vdd/F-M1-Vss through the doped semiconductive layer 248*a*/248*b*, the source/drain region 218*a* (see FIGS. 3A, 3E, and 3G), the front-side power supply voltage contact 244, and the front-side conductive via 246. In some embodiments, materials of the power supply voltage lines F-M1. F-M1-Vdd, F-M1-Vss, B-M1-Vdd. B-M1-Vss, the conductive via 246, 244, and/or the contact 240, 244 of the semiconductor structure may be made of Cu, Co, Ru, Pt, Al, W, Ti, TaN, TiN, Molybdenum (Mo), Ruthenium (Ru), Iridium (Ir), rhodium (Rh), or any combinations thereof. In some embodiments, the back-side power supply voltage line B-M1-Vdd/B-M1-Vss has a length in a range from about 200 nm to about 200 μm.

In the course of IC evolution, functional density (i.e., the number of interconnected devices per chip area) has generally increased while geometry size (i.e., the smallest component (or line) that can be created using a fabrication process) has decreased. However, the smaller and more dense the metal lines in the IC structure will result in worse resistant thereof, thereby wasting processing power and processing speed during the operation of the IC structure. For example, in a cell routing of the IC structure, power supply voltage lines may occupy too many routing resources and therefore impact the cell scaling as well as the performance of the IC structure (e.g., RC delay or IR drop). Hence, a part of power supply voltage lines and power conductive vias are moved to wafer back-side, so as to reduce the routing loading and improve the circuit density in a same chip area. Nevertheless, the power conductive via on the wafer back-side may not be aligned with the source/drain region 218*a* when forming thereof, which in turn non-overlaps with the source/drain region 218*a* and/or overlaps with the gate electrode layer 220, such that an unwanted connection may occur and therefore impact the performance of IC structure.

Therefore, the present disclosure in various embodiments provides a metal line routing method to improve the functional density and operation performance on the IC structure. As shown in FIG. 2C, the doped semiconductive layers 248*a* and 248*b* are formed to underlie the semiconductor sheet 210 and extending along a lengthwise direction of the semiconductor sheet 210. Specifically, the doped semiconductive layer 248*a*/248*b* is formed by doping a fin-like structure underlying the semiconductor sheet 210 with a dopant having a same conductivity type as the source/drain region 218*a* formed subsequently overlying thereof, and the dopant can be either n-type or p-type doping species. Subsequently, the source/drain region 218*a* is formed on the semiconductor sheet 210 and self-aligns with the doped semiconductive layer 248*a*/248*b* underlying the semiconductor sheet 210. The source/drain region 218*a* can be electrically connected to the back-side metal line (e.g., power supply voltage lines B-M1-Vss, B-M1-Vdd) through the doped semiconductive layer 248*a*/248*b* acting a power conductor path, and thus a manufacturing of a back-side power conductive via can be omitted and the doped semiconductive layer 248*a*/248*b* can be interchangeably referred to as a self-aligned connection structure. The fabrication of the doped semiconductive layer 248*a*/248*b* will not result in additional back-side power conductive via process and hence additional cost, such that an isolation margin issue of back-side power conductive via to gate electrode can be solved, which in turn allows for scaling the contacted poly pitch (CPP). In addition, the power conductor path including the source/drain region 218*a* and the doped semiconductive layer 248*a*/248*b* can save an extra strap area (i.e., an area for connecting back-side metal to front-side metal) and hence additional connection process and cost, and thus a functional density of the IC structure can be improved. In some embodiments, the doped semiconductive layer 248*a*/248*b* can be interchangeably referred to as a bottom silicon region, a doped silicon layer, or a semiconductor strip.

As shown in FIG. 2C, the power supply voltage lines B-M1-Vdd and B-M1-Vss can be electrically connected to the source/drain region 218*a* through the doped semiconductive layer 248*a*/248*b* having a larger contact area than a power conductive via that is omitted in the present disclosure. Therefore, the back-side M1 level landing on the doped semiconductive layers 248*a* and 248*b* can provide a low contact resistance, such that the speed of the IC structure can be improved. In addition, the power mesh (e.g., power supply voltage line B-M1-Vdd/B-M1-Vss) in the wafer back-side can be located at a lower level metal layer (e.g., back-side M1 level), and thus the IC structure can have a more robustness power mesh in the cell region.

In some embodiments, PMOSFET including $P^+$ doped (e.g., boron) source/drain region 218*a* is upon a p-type doped semiconductive layer 248*b*, and NMOSFET including $N^+$ doped (e.g., phosphorus) source/drain region 218*a* is upon an n-type doped semiconductive layer 248*a*. This is described in greater detail with reference to FIG. 2C, the doped semiconductive layers 248*a* in the first conductivity type device region 10C have a same conductivity type as the source/drain regions 218*a* in the first conductivity type device region 10C. By way of example but not limiting the present disclosure, if the source/drain region 218*a* in the first conductivity type device region 10C is formed with an n-type dopant, the doped semiconductive layer 248*a* is dopant with the n-type dopant. In some embodiments, the doped semiconductive layer 248*a* in the first conductivity type device region 10C may include SiP. SiC, SiPC, SiAs, Si, or a combination thereof. In some embodiments, the doped semiconductive layer 248*a* in the first conductivity type device region 10C may have a phosphorus concentration within a range from about $5\times10^{16}$ atoms/$cm^3$ to about $1\times10^{19}$ atoms/$cm^3$. The doped semiconductive layers 248*b* in the second conductivity type device region 10D have a same conductivity type as the source/drain regions 218*a* in the second conductivity type device region 10D. By way of example but not limiting the present disclosure, if the source/drain region 218*a* in the second conductivity type device region 10D is formed with a p-type dopant, the doped semiconductive layer 248*b* is dopant with the p-type dopant. In some embodiments, the doped semiconductive layer 248*b* in the second conductivity type device region 10D may include boron, $BF_2$, or a combination thereof. In some embodiments, the doped semiconductive layer 248*b* in the second conductivity type device region 10D may have a boron concentration within a range from about $5\times10^{16}$ atoms/$cm^3$ to about $1\times10^{19}$ atoms/$cm^3$.

In some embodiments, the doped semiconductive layer 248*a*/248*b* (see FIGS. 3E and 3G) overlaps the semiconductor sheet 210 and extends beyond opposite two edge of the semiconductor sheet 210 along the lengthwise direction of the semiconductor sheet 210. In some embodiments, the dielectric-base gate 225 penetrates the doped semiconductive layer 248*a*/248*b* and is in contact with the back-side silicide region 258. In some embodiments, the doped semiconductive layer 248*a*/248*b* extends from one of the dielectric-base gates 225 across the gate electrodes 220 to another one of the dielectric-base gates 225. In some embodiments, a back-side silicide region 258 is form on a back-side surface of the doped semiconductive layer 248*a*/248*b*, and the power supply voltage line B-M1-Vdd/B-M1-Vss physically contacts the doped semiconductive layer 248*a*/248*b* with the back-side silicide region 258. In some embodiments, the doped semiconductive layer 248*a*/248*b* may have a thickness T2 in a range from about 5 nm to about 100 nm, such as about 5, 10, 20, 30, 40, 50, 60, 70, 80, 90, or 100 nm.

Figure 3A:
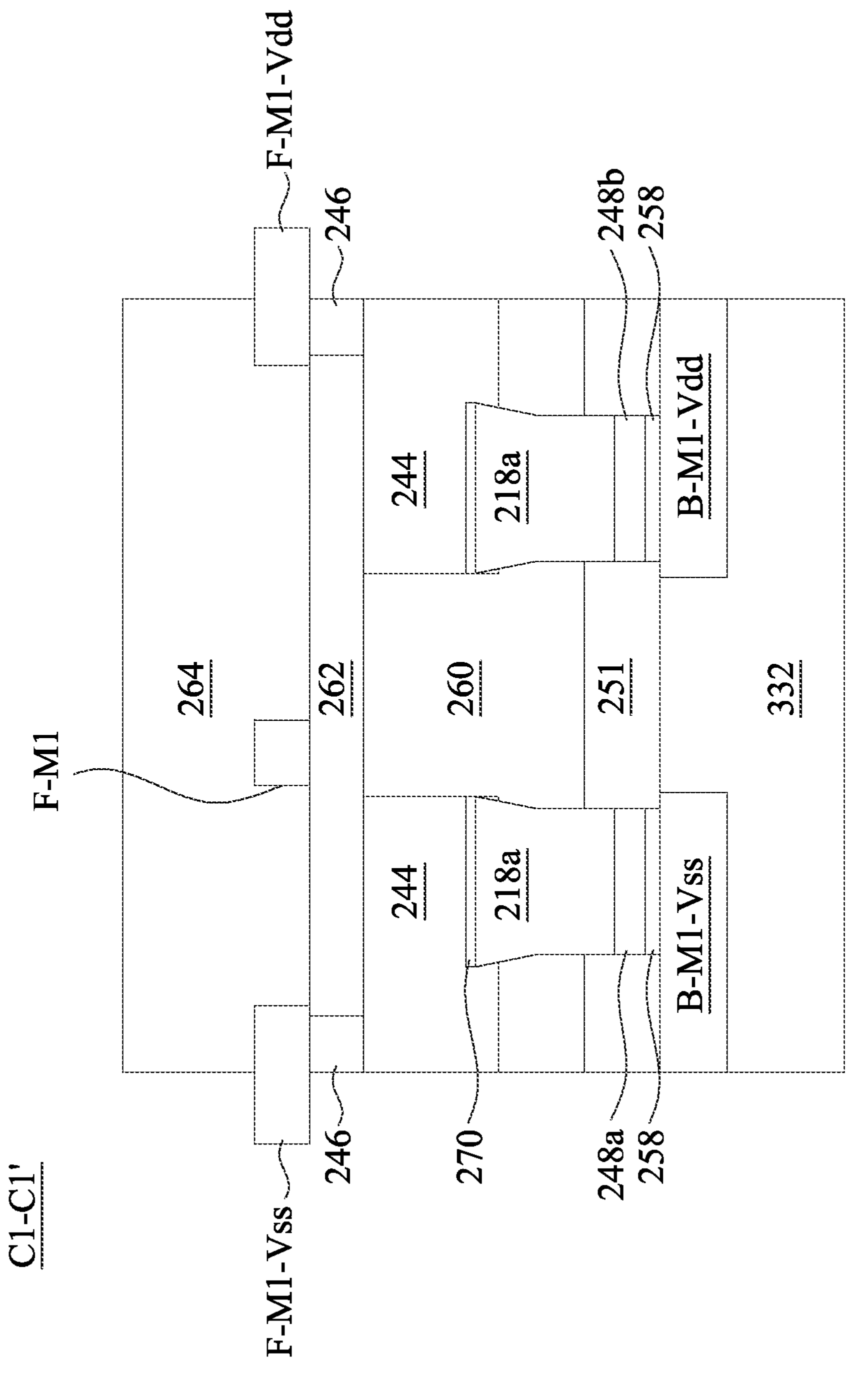
FIGS. 3A-3E, 3G, 3I, and 3J illustrate cross-sectional views obtained from reference cross-sections C1-C1', C2-C2', C3-C3', C4-C4', C5-C5', C6-C6', C7-C7', and C8-C8' in FIGS. 2A-2C.
Figure 3B:
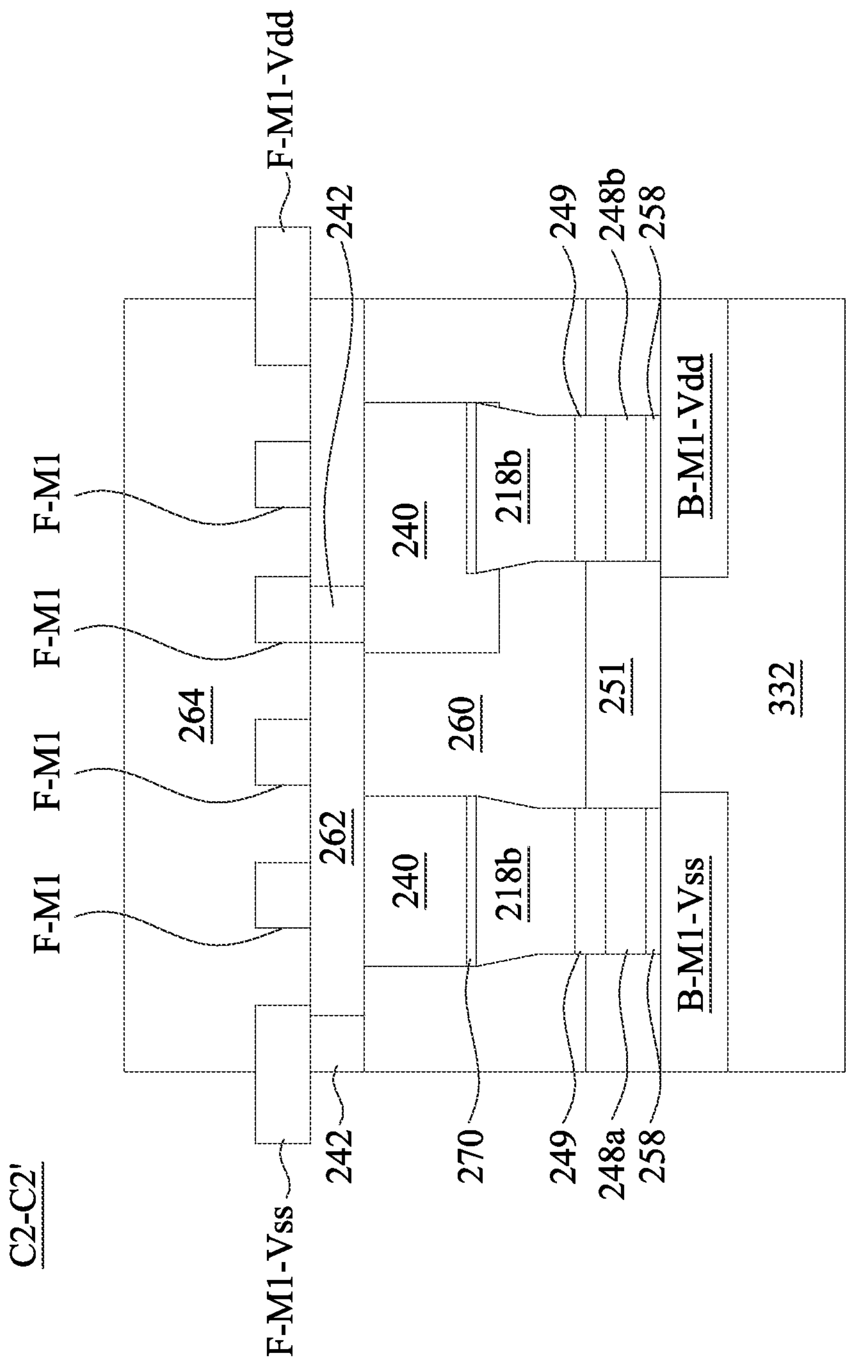
Figure 3C:
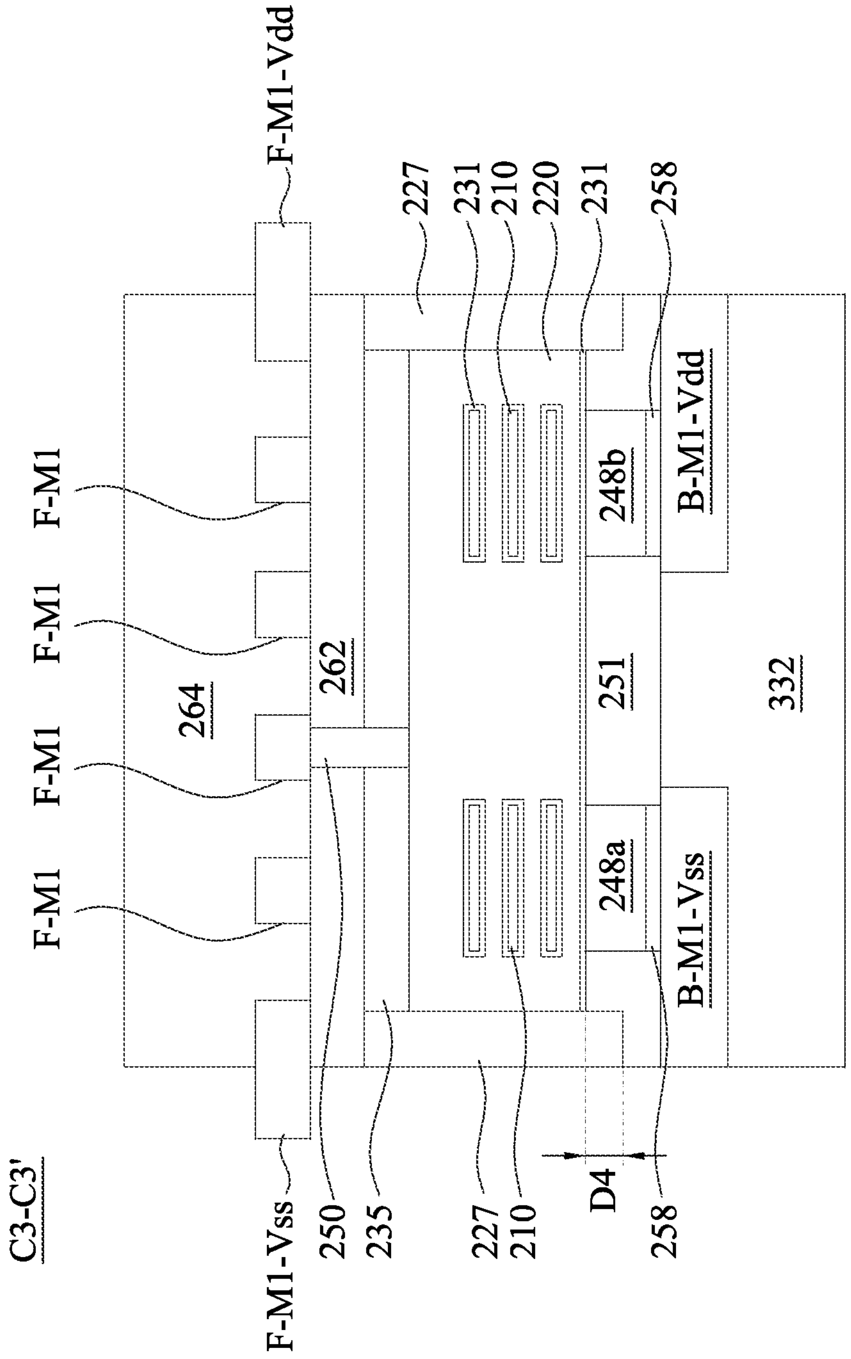
Figure 3D:
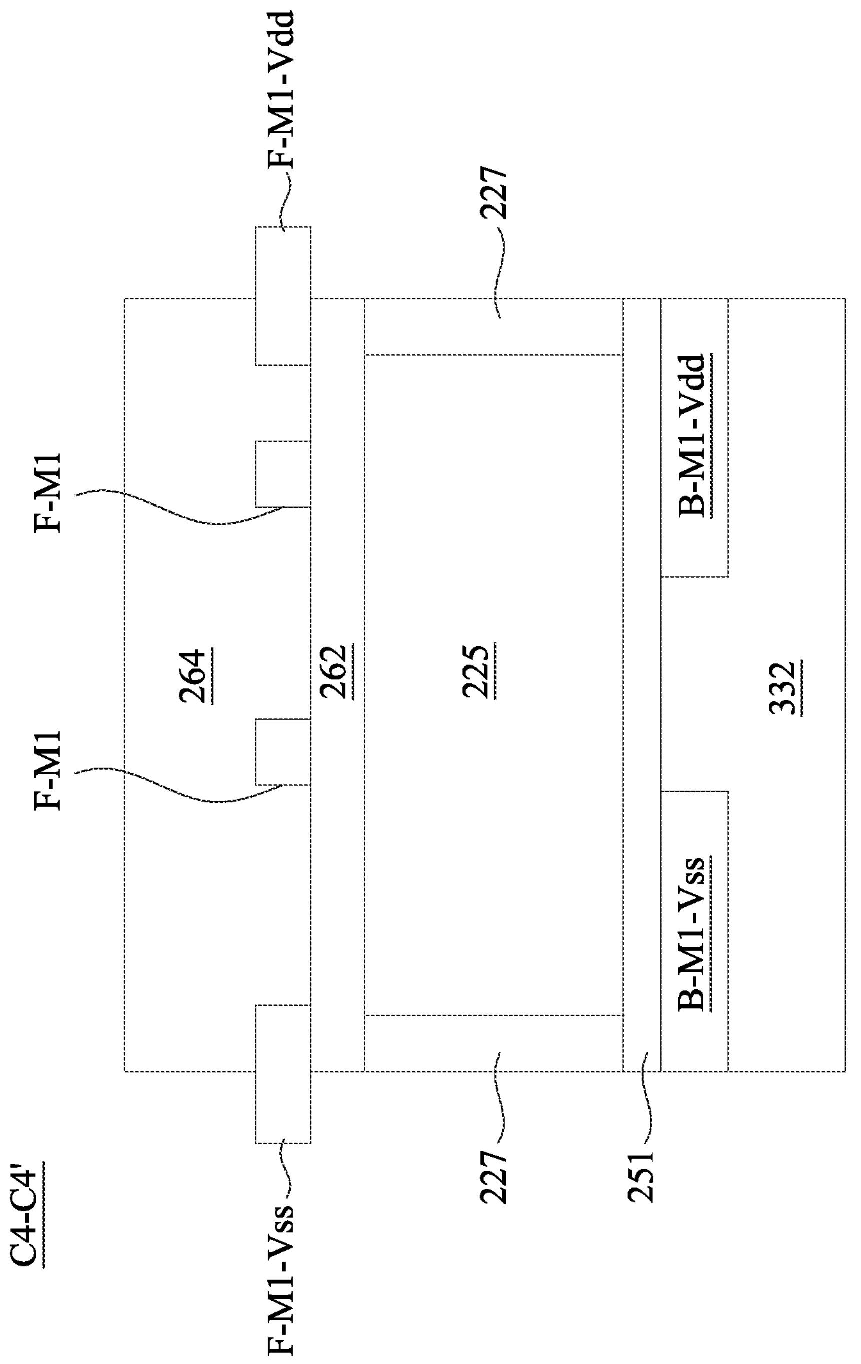
Figure 3E:
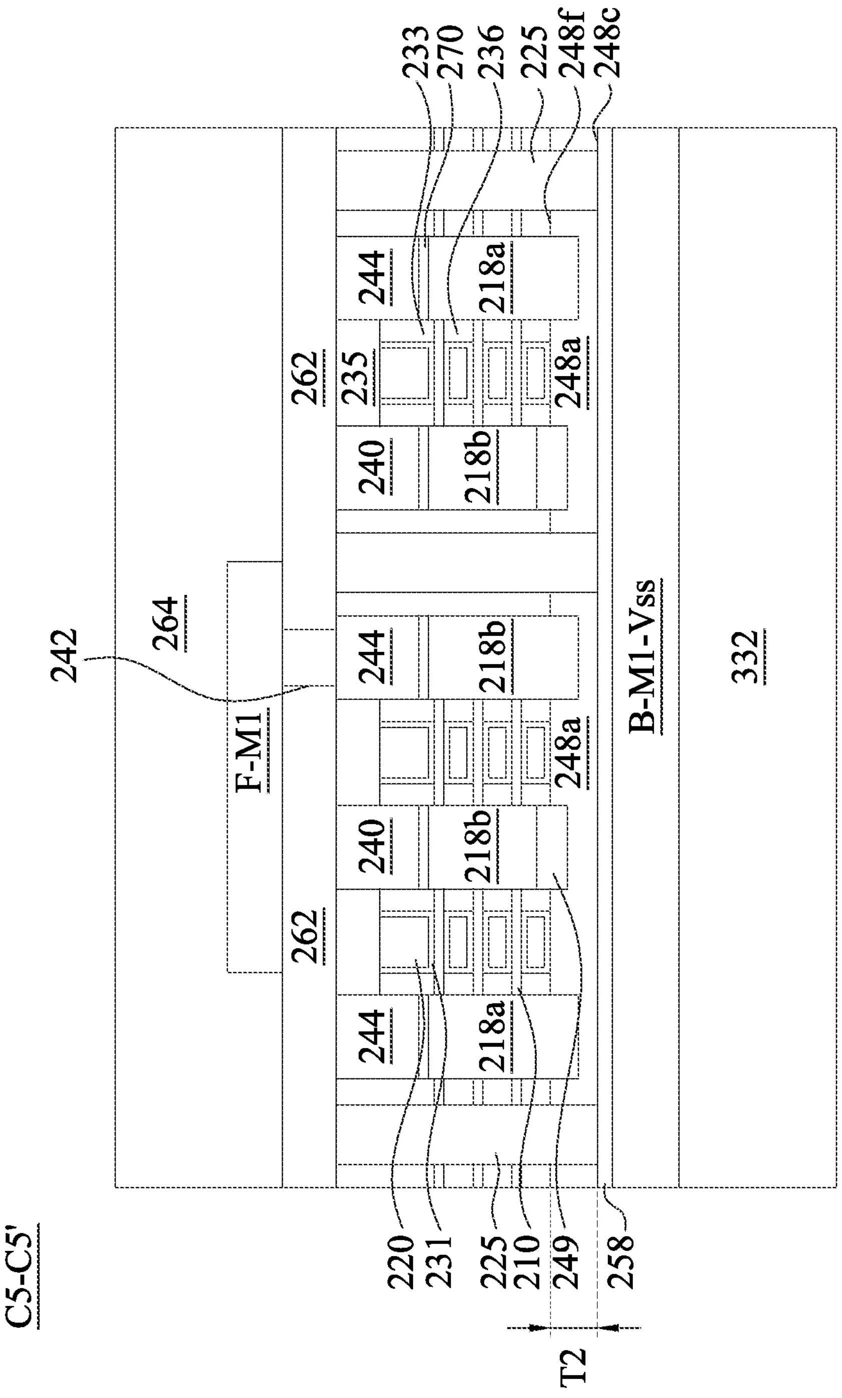

In FIGS. 2C, 3C, 3D, and 3J, dielectric regions 227 are formed on opposite ends of the gate electrode layers 220. In some embodiments, each dielectric region 227 is a gate-cut structure for the gate structure, and the gate-cut structure is formed by a cut metal gate (CMG) process. In some embodiments, the dielectric region 227 may be made of dielectric material, such as $SiO_2$, $Si_3N_4$, SION, SiOC, SiOCN base dielectric material, or combinations thereof. In some embodiments, the dielectric region 227 may be made of an oxide, a nitride-based material, such as $Si_3N_4$, SiON, or a carbon-based material, such as SiC, SiOC, SiOCN, or combinations thereof. In some embodiments, the dielectric region 227 may be made of a material having a dielectric constant greater than about 9 (e.g., high dielectric constant (high-k) material). For example, the dielectric region 227 may be made of a high dielectric constant (high-k) material, such as be hafnium oxide ($HfO_2$), zirconium oxide ($ZrO_2$), lanthanum oxide ($La_2O_3$), yttrium oxide ($Y_2O_3$), aluminum oxide ($Al_2O_3$), tantalum oxide ($Ta_2O_5$), titanium oxide ($TiO_2$), another applicable material, or combinations thereof. In FIGS. 3E, 3G, and 3I, gate spacers 233 are formed on the sidewalls of the gate electrode layers 220. In some embodiments, the gate spacer 233 may be made of silicon nitride or silicon oxynitride, although any suitable material, such as low-dielectric constant (low-k) materials having a k-value less than about 3.5, may be utilized. In FIGS. 3E and 3G, inner spacers 236 can act as isolation features and may be formed between the source/drain regions 218*a* and 218*b* and the gate electrode layers 220. In some embodiments, the inner spacers 236 can be interchangeably referred to lower gate spacers. In some embodiments, the inner spacers 236 may have a lateral dimension in a range from about 4 nm to about 12 nm. In some embodiments, the inner spacers 236 may be made of silicon nitride or silicon oxynitride, although any suitable material, such as low-dielectric constant (low-k) materials having a k-value less than about 3.5, may be utilized. In some embodiments, the inner spacers 236 may be air gaps. In some embodiments, the inner spacer 236 may have a higher K (dielectric constant) value than the gate spacer 233. In FIGS. 3C, 3E, 3G, and 3I, hard mask layers 235 are formed over the gate electrode layers 220. In some embodiments, the hard mask layer 235 can be interchangeably referred to a gate top dielectric. In some embodiments, the hard mask layer 235 is made of a different material than the dielectric region 227. In some embodiments, the hard mask layer 235 may be made of dielectric material, such as $SiO_2$, $Si_3N_4$, SiON, SiOC, SiOCN base dielectric material, or combinations thereof.

In FIGS. 3A, 3B, 3I, and 3J, an inter-layer dielectric (ILD) layer 260 is formed between the gate electrode layers 220 and over the source/drain regions 218*a* and 218*b*. An ILD layer 262 is formed over the hard mask layers 235 and the ILD layer 260 and laterally surrounds the gate vias 250 and the source/drain vias 242. An inter-metal dielectric (IMD) layer 264 is formed over the ILD layer 262 and can provide electrical insulation as well as structural support for the various features therein, such as the metal line F-M1, the power supply voltage lines F-M1-Vdd. F-M1-Vss. In some embodiments, the ILD layer 260, the ILD layer 262, and/or the IMD layer 264 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like. In FIGS. 3A-3D and 3I, a shallow trench isolation (STI) structure 251 is formed to laterally surround the doped semiconductive layer 248*a*/248*b*. In some embodiments, the STI structure 251 is located between NMOSFET and PMOSFET. In some embodiments, the top surface of the STI structure 251 is coplanar (within process variations) with a top surface of the doped semiconductive layer 248*a*/248*b*. In some embodiments, the top surface of the STI structure 251 is above or below the top surface of the doped semiconductive layer 248*a*/248*b*. In some embodiments, the STI structure 251 may separate the features of adjacent devices.

In FIGS. 3A-3E, 3G, 3I, and 3J, an IMD layer 332 are deposited over the doped semiconductive layer 248*a*/248*b*. The power supply voltage lines B-M1-Vdd, B-M1-Vss are formed in the IMD layer 332. The IMD layer 332 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, the like, or combinations thereof, which may be formed by a chemical vapor deposition (CVD) process, such as high density plasma CVD (HDP-CVD), flowable chemical vapor deposition (FCVD), the like, or a combination thereof.

Figure 2D:
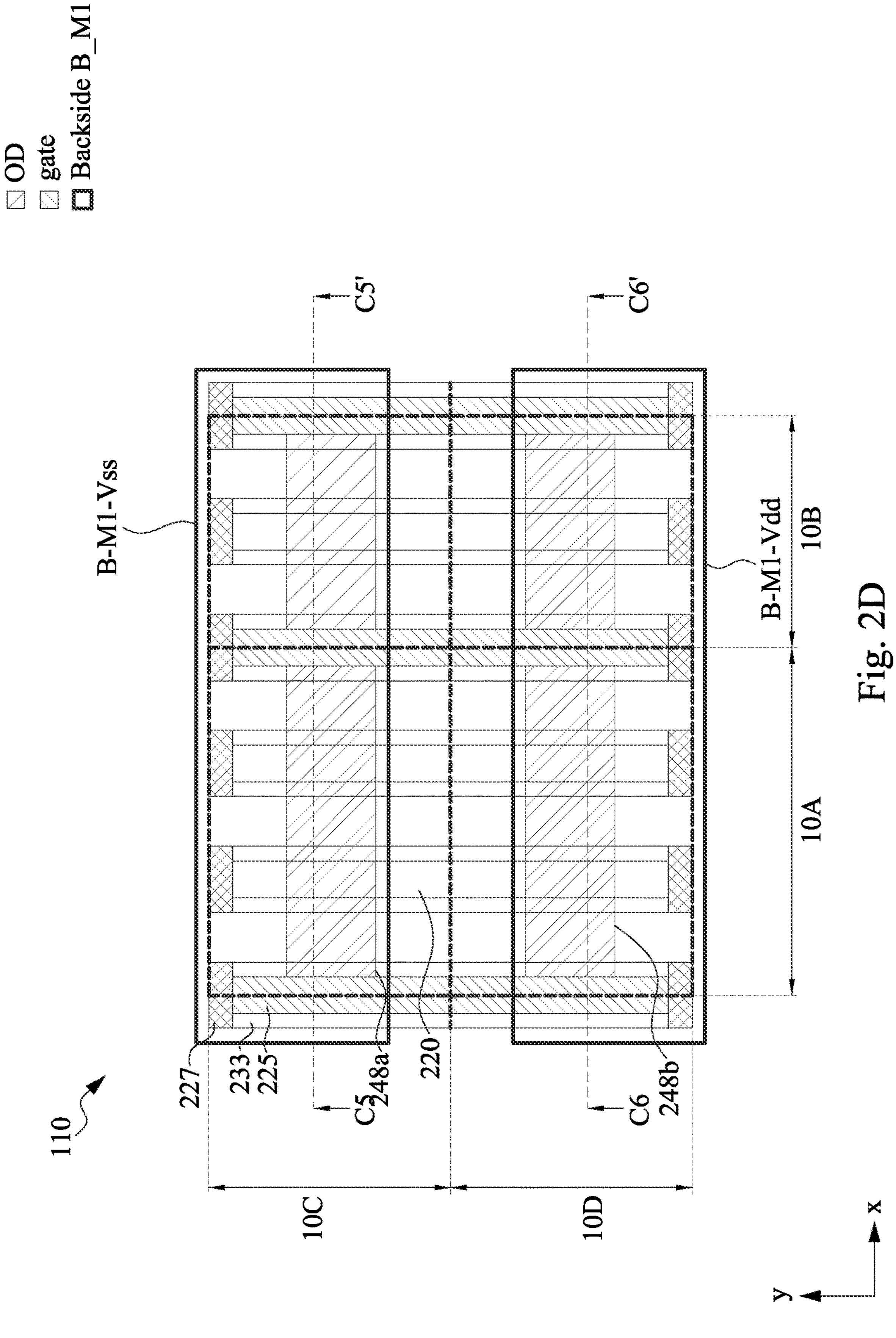
FIG. 2D illustrates a layout diagram of a semiconductor structure corresponding to FIG. 2B according to some embodiments of the present disclosure, in which the doped semiconductive layer partially breaks by a dielectric gate.
Figure 3F:
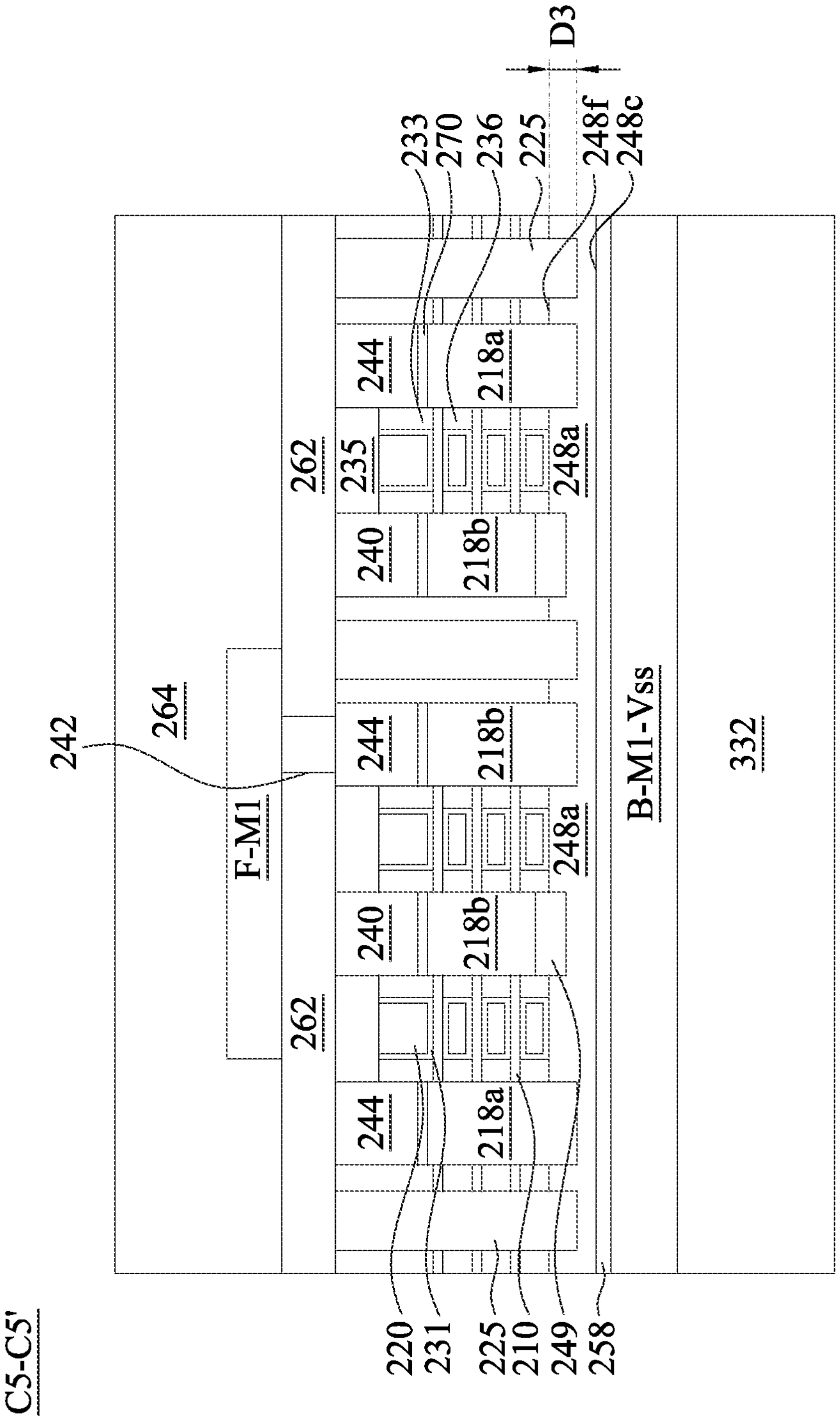
FIGS. 3F and 3H illustrate cross-sectional views obtained from reference cross-sections C5-C5' and C6-C6' in FIG. 2D.
Figure 3G:
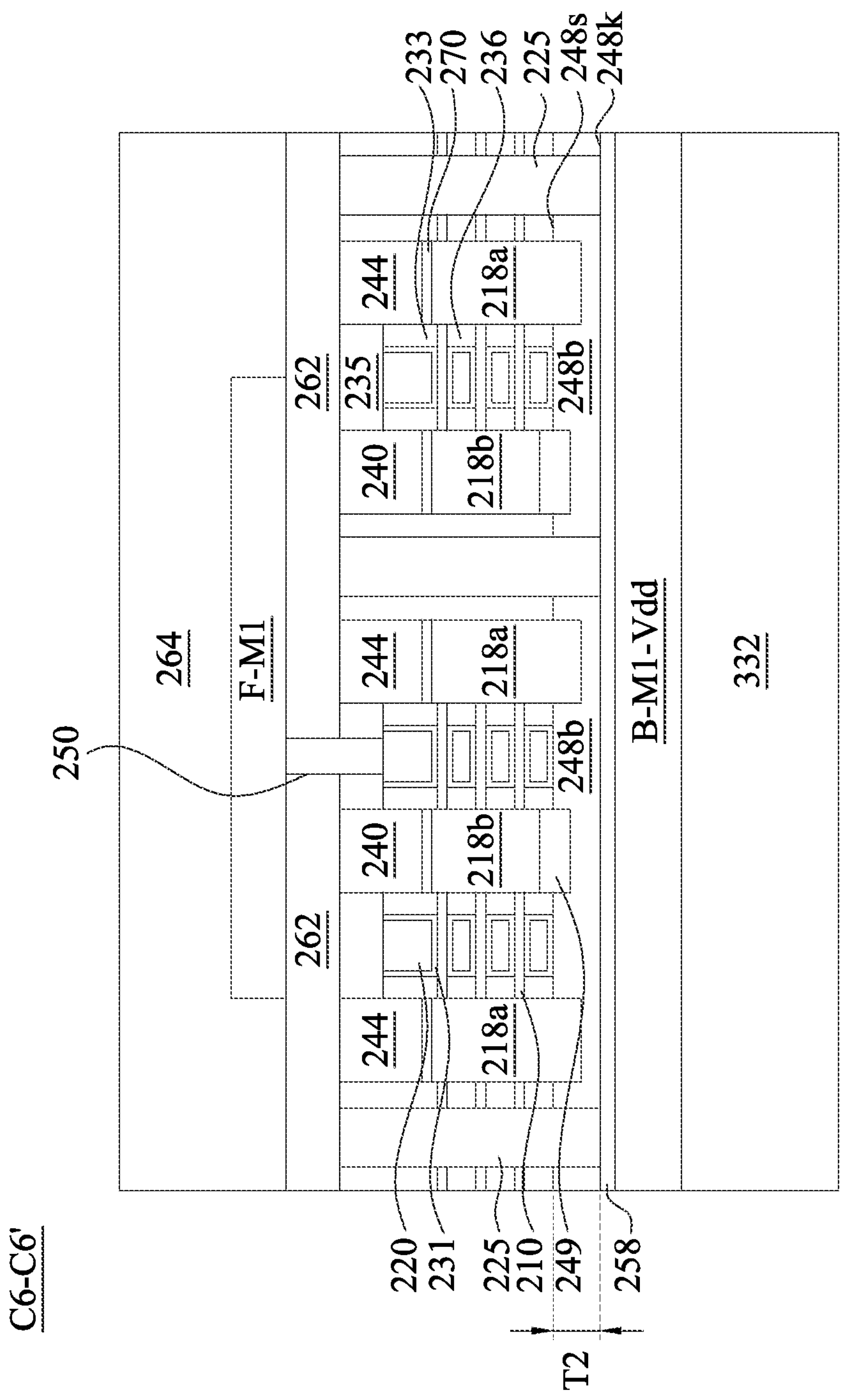
Figure 3H:
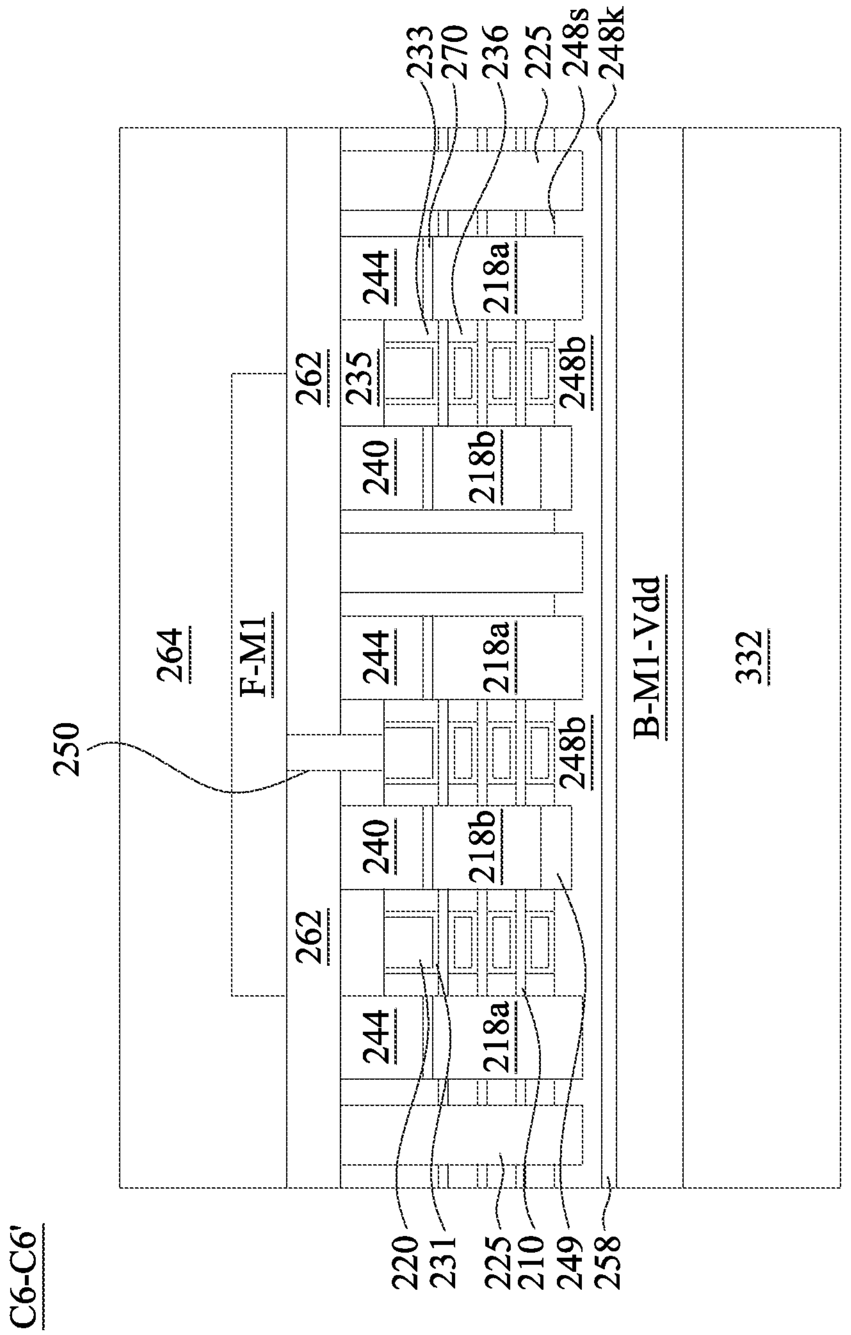
Figure 3I:
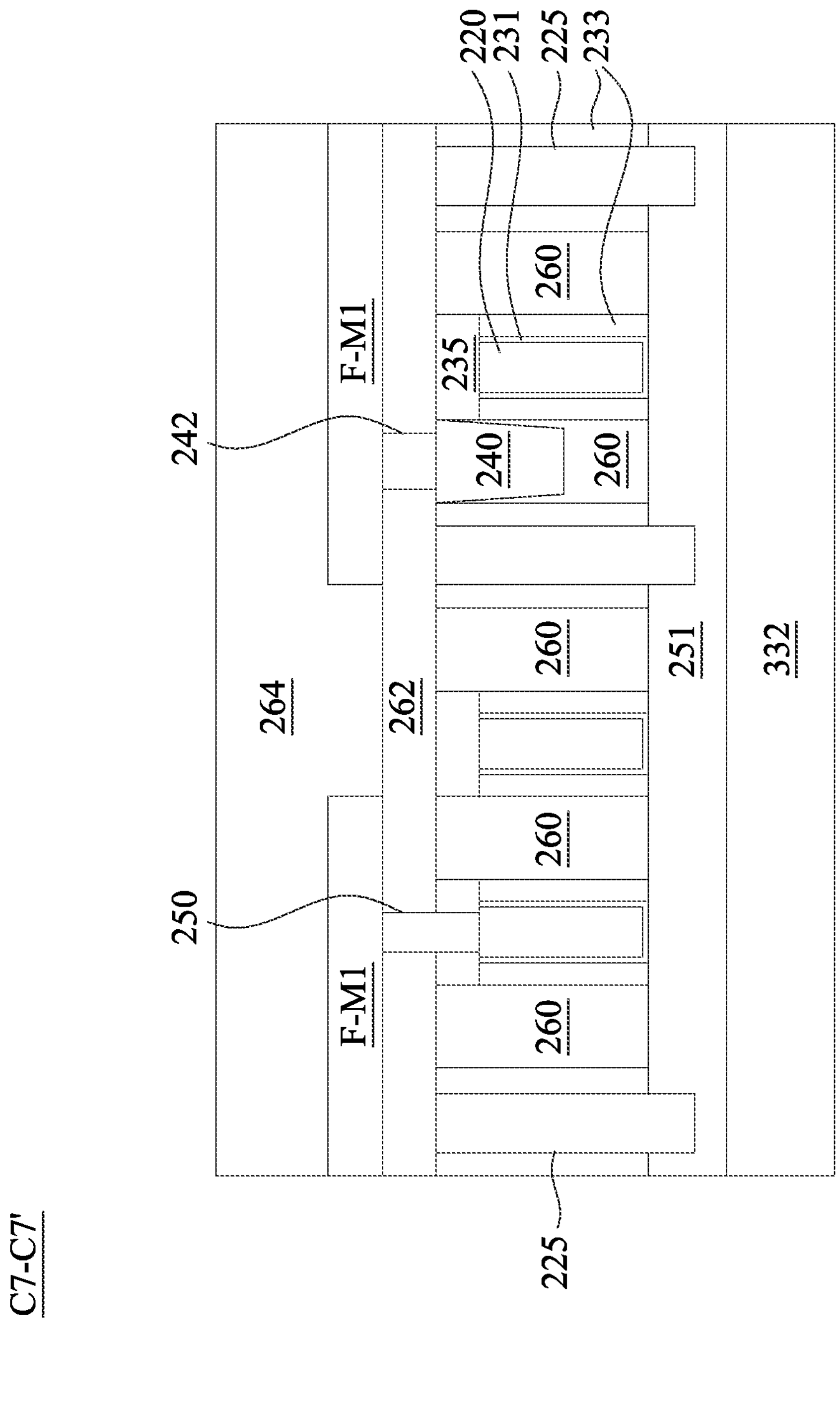
Figure 3J:
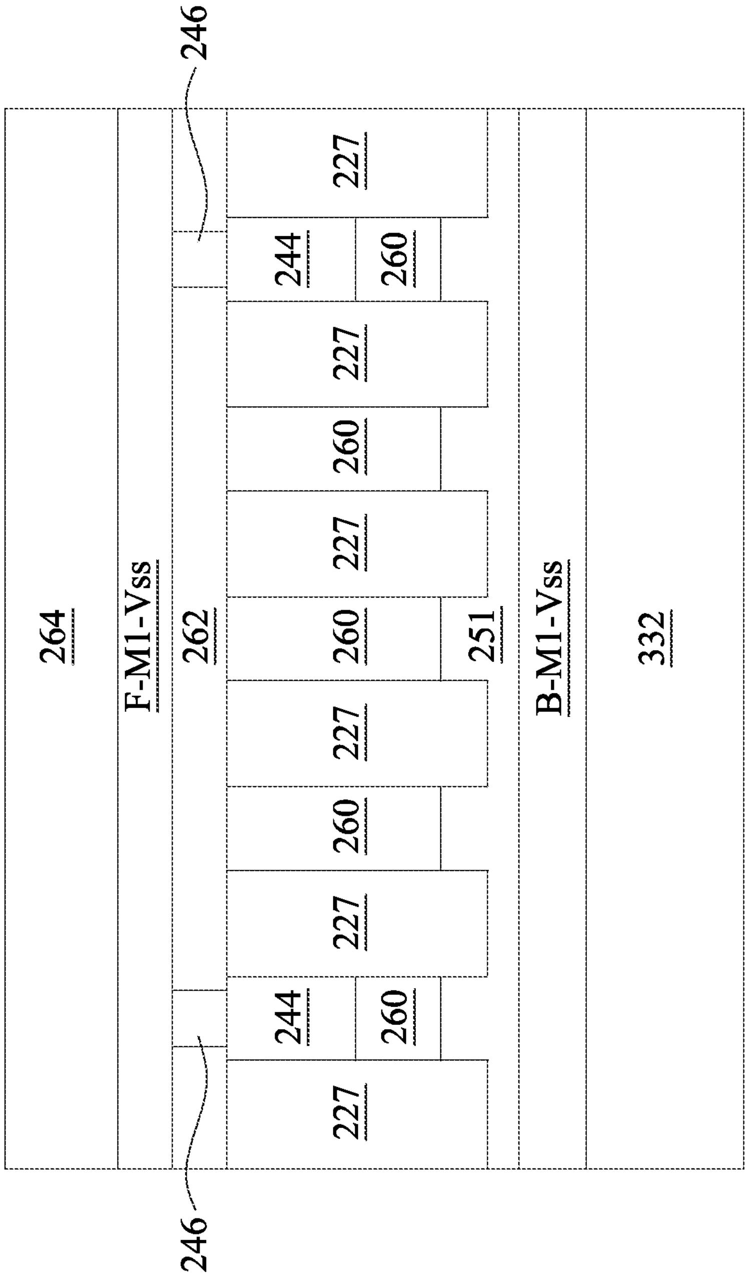

Reference is made to FIGS. 2D, 3F, and 3H. FIG. 2D illustrates a layout diagram of a semiconductor structure corresponding to FIG. 2B according to some embodiments of the present disclosure, in which the doped semiconductive layer is partially broken by a dielectric gate. FIGS. 3F and 3H illustrate cross-sectional views obtained from reference cross-sections C5-C5' and C6-C6' in FIG. 2D. While FIGS. 2D, 3F, and 3H show an embodiment of the semiconductor structure with a different metal line routing method than the semiconductor structure in FIGS. 2A-2C, 3A-3E, 3G, 3I, and 3J. In addition, the present disclosure may repeat reference numerals and/or letters in the various examples. This repetition is for the purpose of simplicity and clarity and does not in itself dictate a relationship between the various embodiments and/or configurations discussed. It is noted that, the difference between the present embodiment and the embodiment in FIGS. 2A-2C, 3A-3E, 3G, 3I, and 3J is in that the the doped semiconductive layer 248*a*/248*b* is partially broken by the dielectric-base gates 225, not fully broken by the dielectric-base gates 225. The dielectric-base gates 225 can have a vertical dimension D3 (see FIG. 3F) in the doped semiconductive layer 248*a*/248*b* about 2 nm to about 10 nm, such as about 2, 3, 4, 5, 6, 7, 8, 9, or 10 nm. As shown in FIG. 2D, the doped semiconductive layer 248*a*/248*b* laterally extends across the gate electrodes 220 and the dielectric-base gates 225. As shown in FIGS. 3F and 3H, a back-side of the dielectric-base gate 225 is inlaid in the doped semiconductive layer 248*a*/248*b*, and a first portion of the doped semiconductive layer 248*a*/248*b* underlying the dielectric-base gate 225 has a thicker thickness than a thickness of a second portion of the doped semiconductive layer 248*a*/248*b* underlying the source/drain regions 218*a* and a thinner thickness than a thickness of a third portion of the doped semiconductive layer 248*a*/248*b* underlying the dielectric layer 249.

Figure 4A:
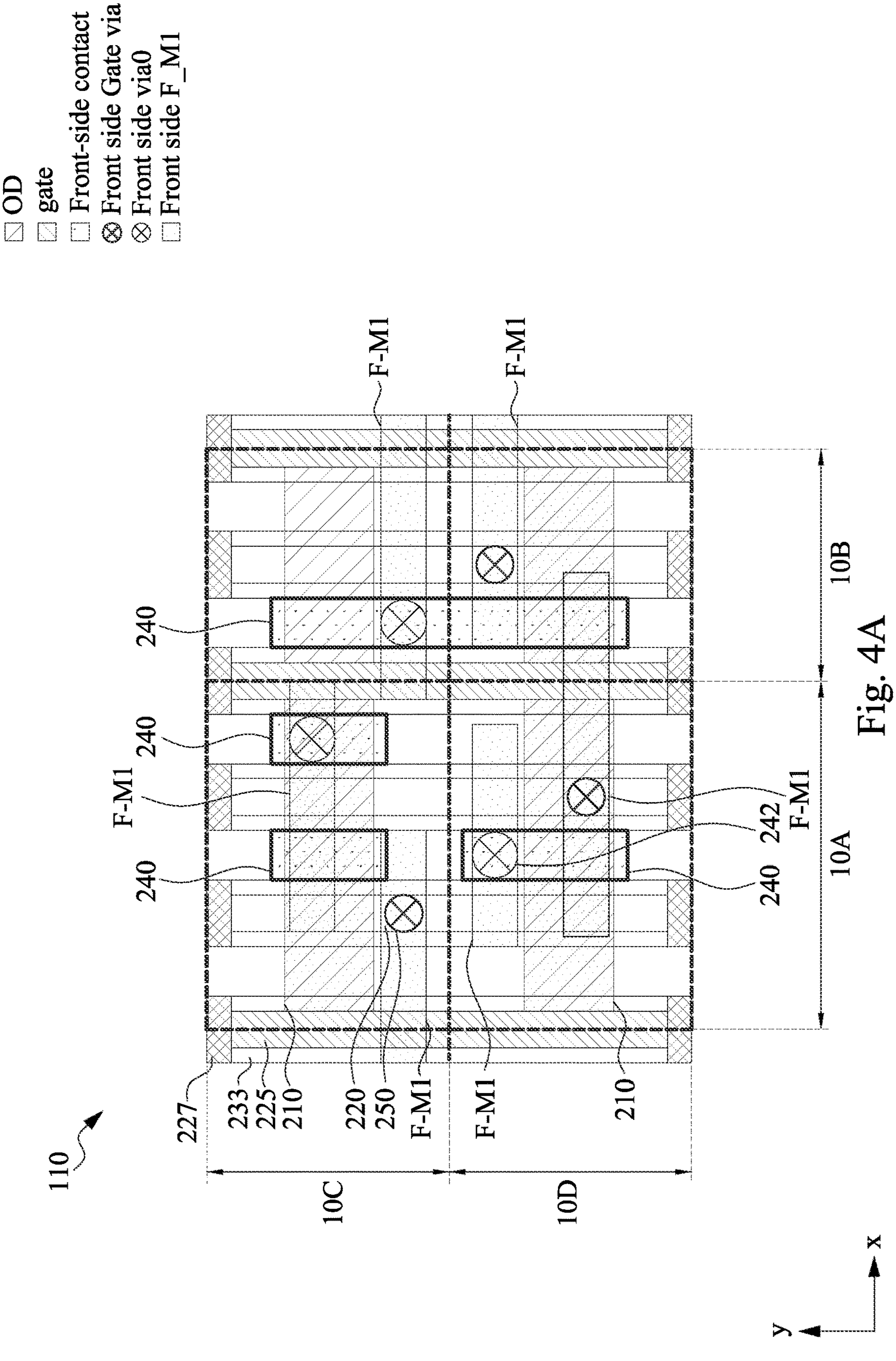
FIGS. 4A and 4B illustrate a layout diagram of a logic circuit on a front side and a back side of a semiconductor structure, respectively, according to some embodiments of the present disclosure.
Figure 4B:
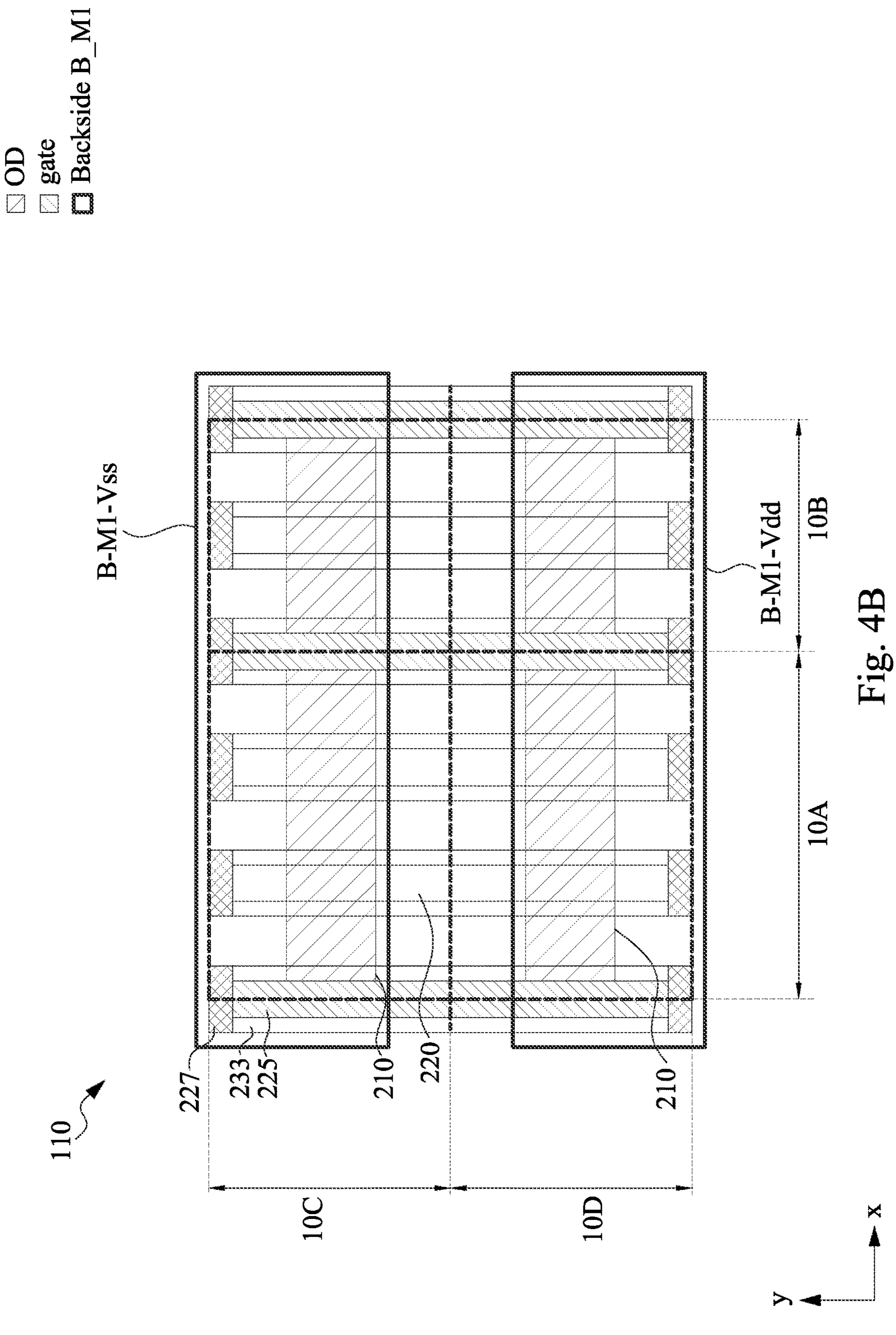

Reference is made to FIGS. 4A and 4B. FIGS. 4A and 4B illustrate a layout diagram of a logic circuit on a front side and a back side of a semiconductor structure, respectively, according to some embodiments of the present disclosure. While FIGS. 4A and 4B show an embodiment of the semiconductor structure with a different metal line routing method than the semiconductor structure in FIGS. 2A-3J. In addition, the present disclosure may repeat reference numerals and/or letters in the various examples. This repetition is for the purpose of simplicity and clarity and does not in itself dictate a relationship between the various embodiments and/or configurations discussed. It is noted that, the difference between the present embodiment and the embodiment in FIGS. 2A-3J is in that the wafer front-side is free of power supply voltage lines F-M1-Vdd, F-M1-Vss at the M1 level and the conductive via 246 and the source/drain contacts 240 associated with the power supply voltage lines F-M1-Vdd, F-M1-Vss and the conductive via 246 at the M1 level. A connection between the power supply voltage lines B-M1-Vss, B-M1-Vss and the source/drain regions 218*a* with the doped semiconductive layer 248*a*/248*b* can have an improved resistance-capacitance (RC), such that a contact resistance for a source node to Vdd/Vss connection can be improved.

In some embodiments, the layouts as shown in FIGS. 2A-2D, 4A, and 4B are represented by a plurality of masks generated by one or more processors and/or stored in one or more non-transitory computer-readable media. Other formats for representing the layout are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 6A:
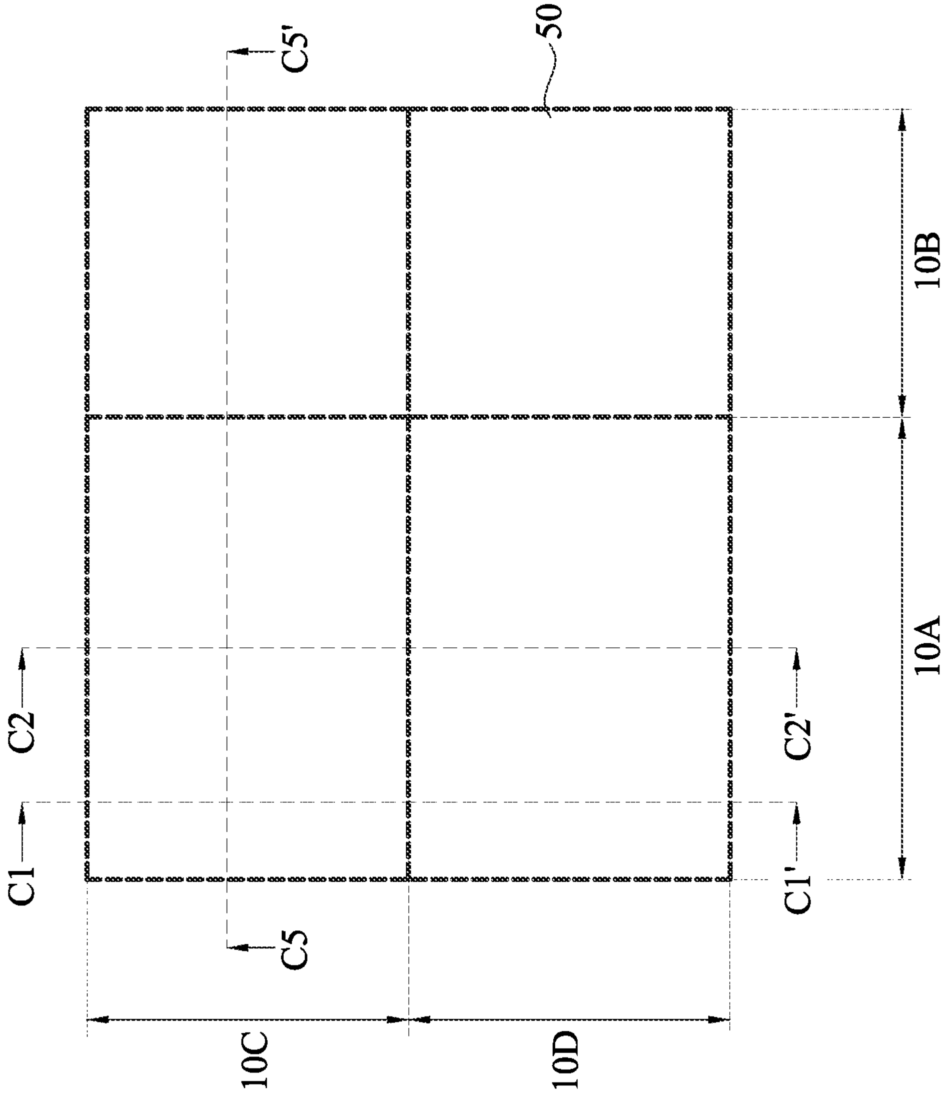
FIGS. 6A-21, 22A-24C, and 26A-27D illustrate cross-sectional views of intermediate stages in the formation of a semiconductor structure in accordance with some embodiments.
Figure 6B:
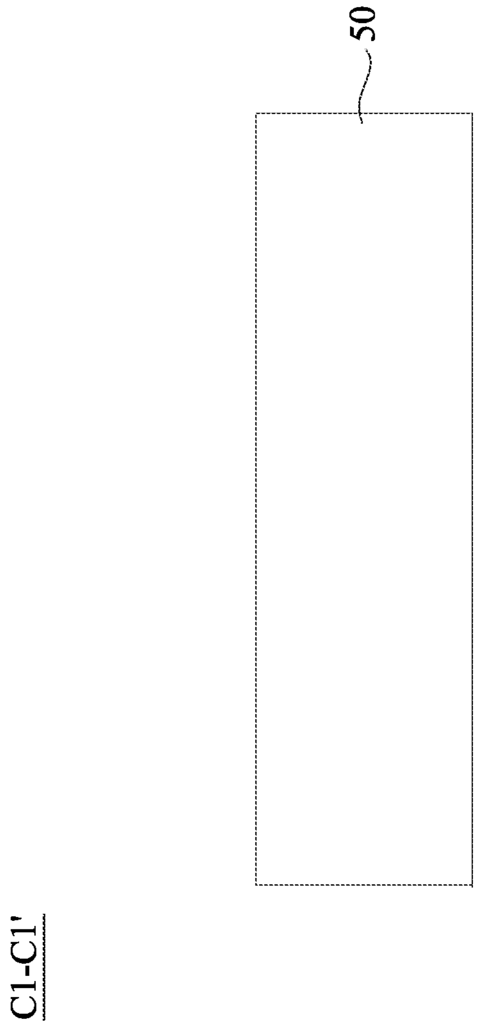
Figure 6C:
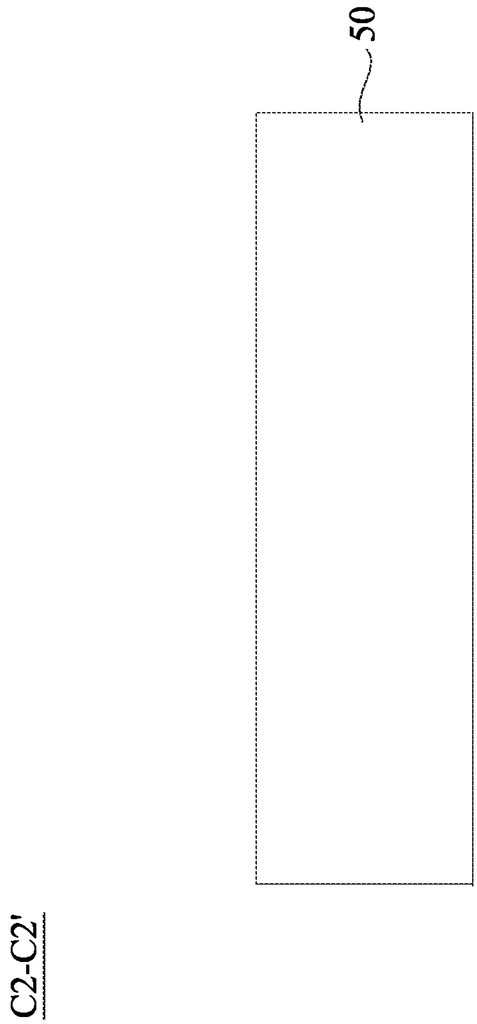
Figure 6D:
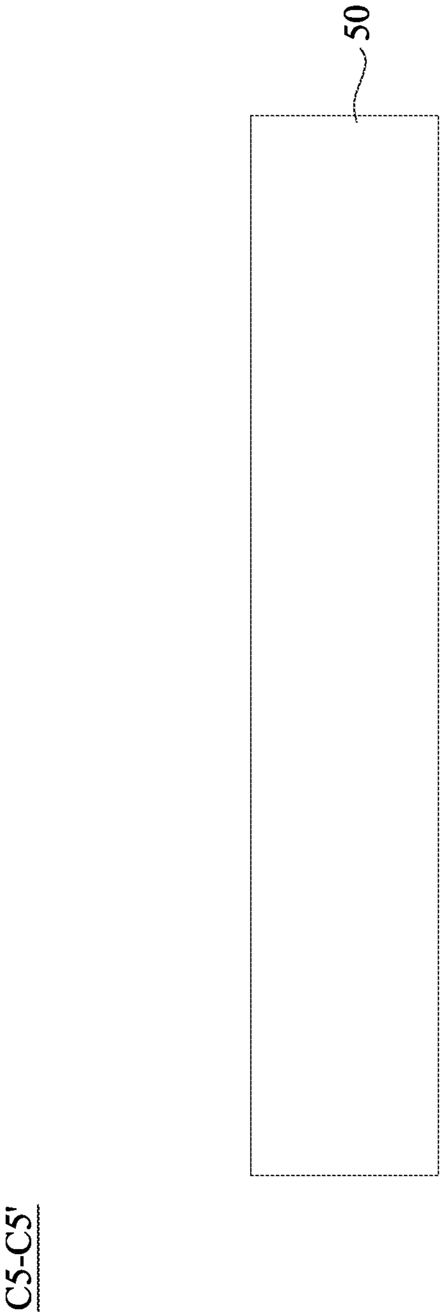
Figure 7A:
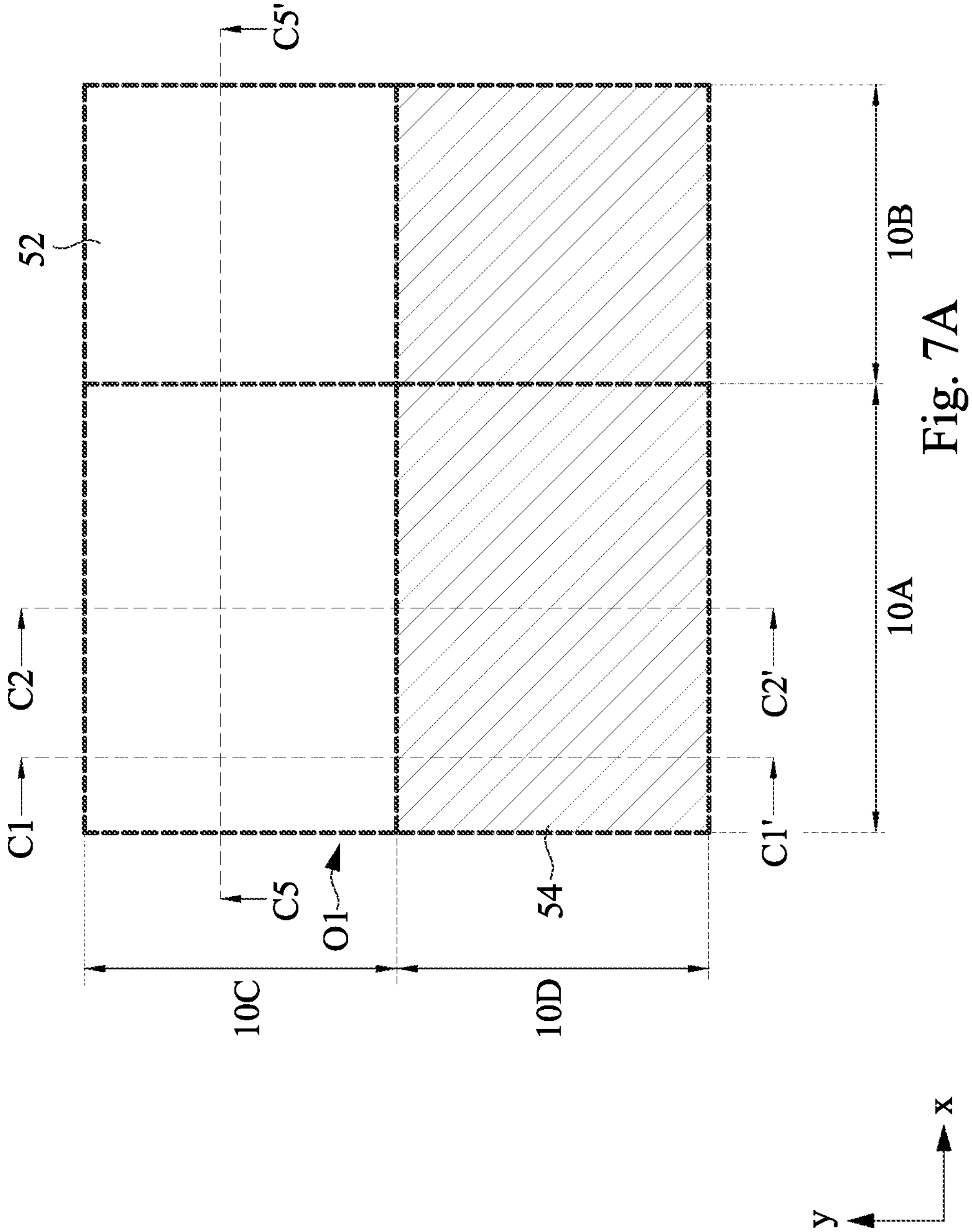
Figure 7B:
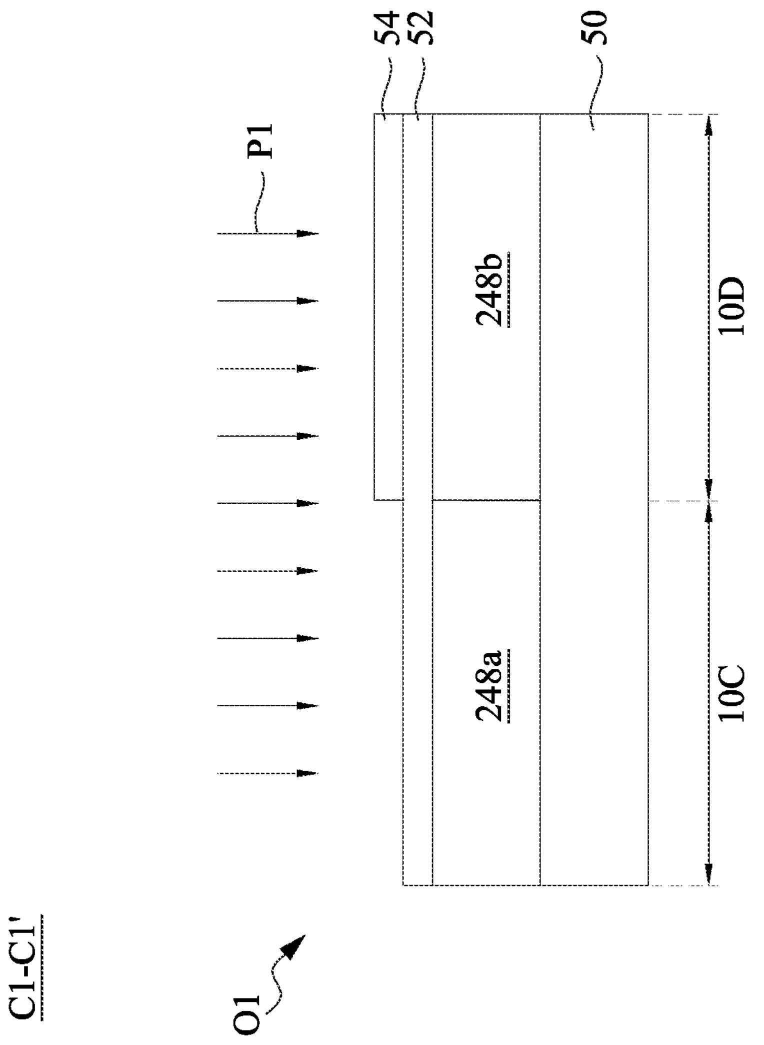
Figure 7C:
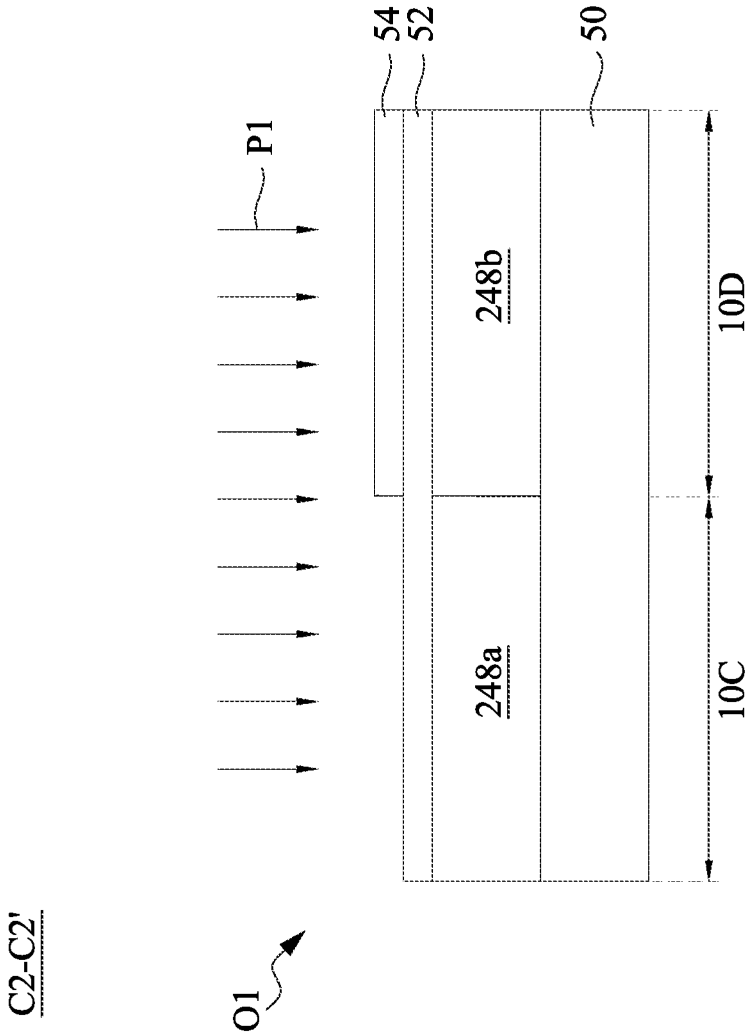
Figure 7D:
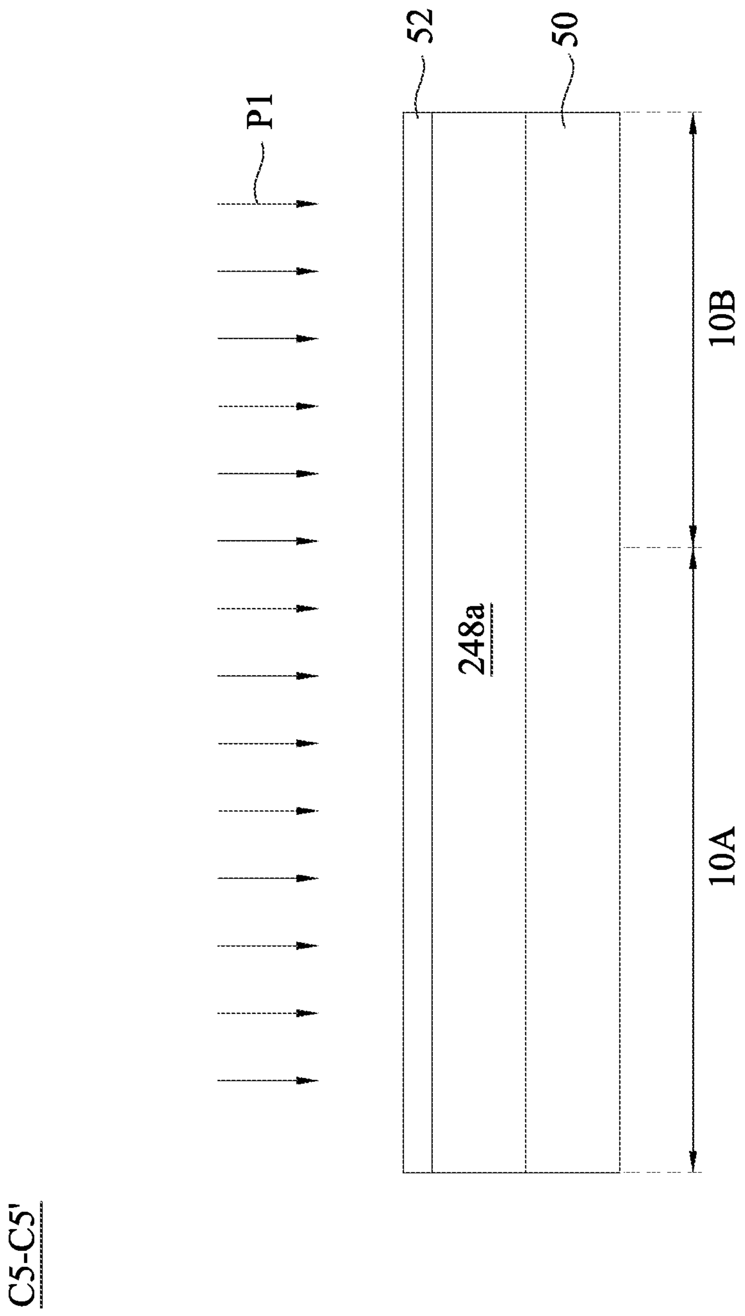

Reference is made to FIGS. 6A-27D. FIGS. 6A-24C and 26A-27D illustrate cross-sectional views of intermediate stages in the formation of a semiconductor structure in accordance with some embodiments. FIGS. 6A, 7A, 10A, 12A, 21, 23A, 25A, 27A illustrate top views of intermediate stages in the formation of a semiconductor structure in accordance with some embodiments, in which FIGS. 6A, 7A, 10A, 12A, 21, 23A are on a front side of the semiconductor structure, and FIGS. 25A and 27A are on a back side of the semiconductor structure. FIGS. 6B, 7B, 8A, 9A, 10B, 11A, 12B, 13A, 14A, 15A, 16A, 17A, 18A, 19A, 20A, 22A, 23B, 24A, 25B, 26A, and 27B illustrate cross-sectional views obtained from the reference cross-section C1-C1' as shown in FIG. 6A of intermediate stages in the formation of a semiconductor structure in accordance with some embodiments. FIGS. 6C, 7C, 8B, 9B, 10C, 11B, 12C, 13B, 14B, 15B. 16B, 17B, 18B, 19B, 20B, 22B, 23C. 24B, 25C. 26B, and 27C illustrate cross-sectional views obtained from the reference cross-section C2-C2' as shown in FIG. 6A of intermediate stages in the formation of a semiconductor structure in accordance with some embodiments. FIGS. 6D, 7D, 8C, 9C, 10D, 11C, 12D, 13C, 14C, 15C. 16C, 17C, 18C, 19C, 20C, 22C. 23D, 24C. 25D, 26C, and 27D illustrate cross-sectional views obtained from the reference cross-section C5-C5' as shown in FIG. 6A of intermediate stages in the formation of a semiconductor structure in accordance with some embodiments. It is understood that additional operations may be provided before, during, and after the operations shown by FIG. 1, and some of the operations described below can be replaced or eliminated for additional embodiments of the method. The order of the operations/processes may be interchangeable. The method M1 includes fabrication of a semiconductor structure. However, the fabrication of the semiconductor structure is merely an example for describing the manufacturing process according to some embodiments of the present disclosure.

Reference is made to FIGS. 6A, 6B, 6C, and 6D. A substrate 50 is provided for forming nano-FETs. The substrate 50 may be a semiconductor substrate, such as a bulk semiconductor, a semiconductor-on-insulator (SOI) substrate, or the like, which may be doped (e.g., with a p-type or an n-type impurity) or undoped. The substrate 50 may be a wafer, such as a silicon wafer. Generally, a SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon germanium, gallium arsenide phosphide, aluminum indium arsenide, aluminum gallium arsenide, gallium indium arsenide, gallium indium phosphide, and/or gallium indium arsenide phosphide; combinations thereof; or the like.

Reference is made to FIGS. 7A, 7B, 7C, and 7D. The substrate 50 may have a first conductivity type device region 10C and a second conductivity type device region 10D. The first conductivity type device region 10C can be for forming n-type devices, such as NMOS transistors, e.g., n-type nano-FETs, and the second conductivity type device region 10D can be for forming p-type devices, such as PMOS transistors, e.g., p-type nano-FETs. The first conductivity type device region 10C may be physically separated from the second conductivity type device region 10D (not separately illustrated), and any number of device features (e.g., other active devices, doped regions, isolation structures, etc.) may be disposed between the first conductivity type device region 10C and the second conductivity type device region 10D. Although one first conductivity type device region 10C and one second conductivity type device region 10D are illustrated, any number of n-type regions 50N and p-type regions 50P may be provided.

A first conductivity type device region 10C of the substrate 50 may be lightly doped with an n-type impurity by a first implantation process P1. This is described in greater detail with reference to FIGS. 7A and 7B, a photoresist layer 54 may be formed over a dielectric layer 52 on the second conductivity type device region 10D. In accordance with some embodiments, the photoresist layer 54 can be patterned so that an opening O1 may be formed over the first conductivity type device region 10C. Subsequently, the first implantation process P1 can be performed through the opening O1 to dope an n-type dopant in the substrate 50. In some embodiments, first conductivity type device region 10C is substantially aligned to the opening O1 because the photoresist layer 54 can act as an implant mask. In some embodiments, the n-type dopant may include arsenic (As), antimony (Sb), phosphorous (P), or the like. In some embodiments, the first implantation process P1 may have an implanting energy in a range from about 10 keV to 120 keV. In some embodiments, the first implantation process P1 may have a total dose in a range from about 1E14 to 5E14 atoms/$cm^2$. In some embodiments, the first conductivity type device region 10C can have a dopant concentration that is in a range from about $5\times10^{16}$ atoms/$cm^3$ to about $1\times10^{19}$ atoms/$cm^3$. The implantation region may extend under the source/drain regions in the nano-FETs that will be subsequently formed over the substrate 50. After the formation of first conductivity type device region 10C, the photoresist layer 54 can be removed with a wet clean process, an ashing process, or the like. In some embodiments, the implantation region in the first conductivity type device region 10C can be interchangeably referred to as a doped semiconductive layer 248*a*.

Subsequently, the substrate 50 may be lightly doped with a p-type impurity by a fourth implantation process. This is described in greater detail, a photoresist layer (not shown) may be formed over the dielectric layer 52. In accordance with some embodiments, the photoresist layer can be patterned so that an opening may be formed over the second conductivity type device region 10D. Subsequently, the second implantation can be performed through the opening to dope a p-type dopant in the substrate 50. In some embodiments, the second conductivity type device region 10D is substantially aligned to the opening because the photoresist layer can act as an implant mask. In some embodiments, the p-type dopant may include boron (B), or the like. In some embodiments, the second implantation may have an implanting energy in a range from about 5 keV to 50 keV. In some embodiments, the second implantation may have a total dose in a range from about 1E14 to 5E14 atoms/$cm^2$. In some embodiments, the second conductivity type device region 10D can have a dopant concentration that is in a range from about 5×10I6 atoms/$cm^3$ to about $1\times10^{19}$ atoms/cm$^3$. The implantation region may extend under the source/drain regions in the nano-FETs that will be subsequently formed over the substrate 50. After the formation of second conductivity type device region 10D, the photoresist layer can be removed with a wet clean process, an ashing process, or the like. In some embodiments, the implantation region in the second conductivity type device region 10D can be interchangeably referred to as a doped semiconductive layer 248*b*.

Figure 8A:
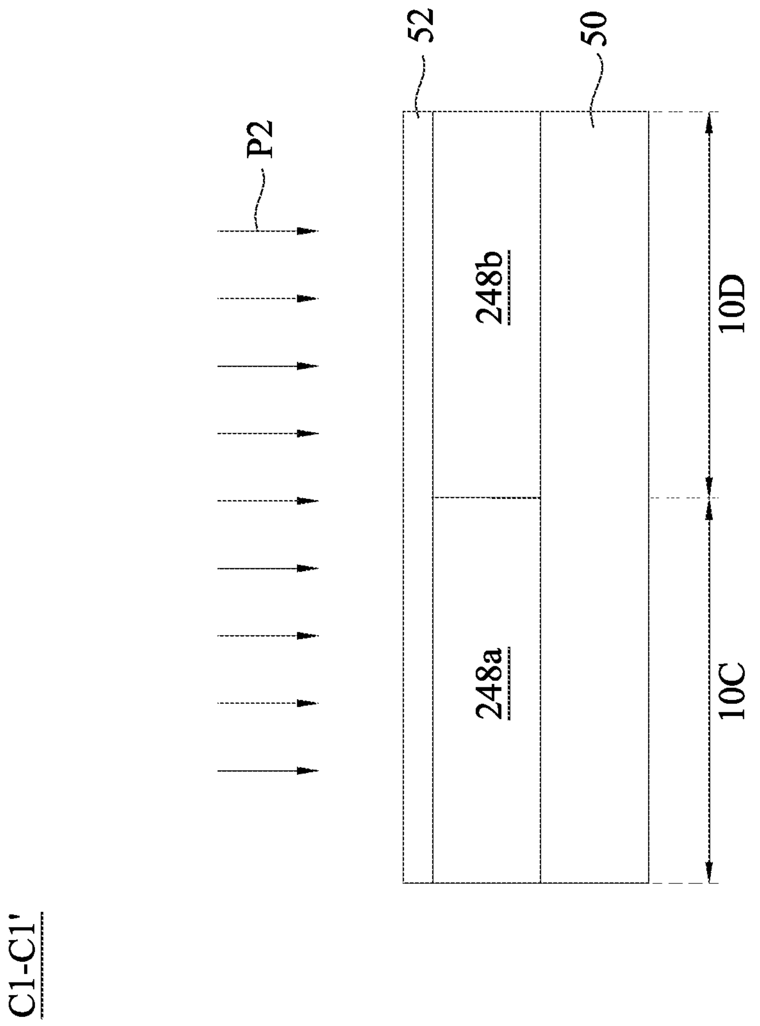
Figure 8B:
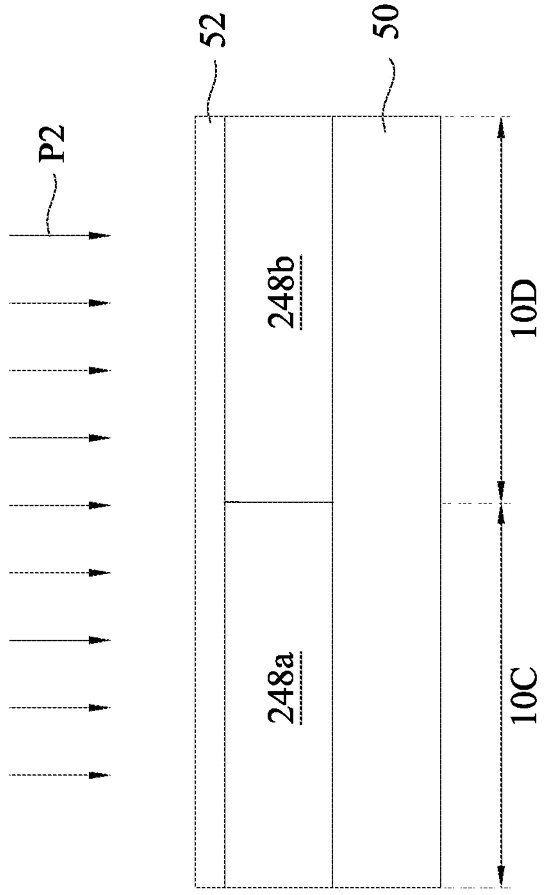
Figure 8C:
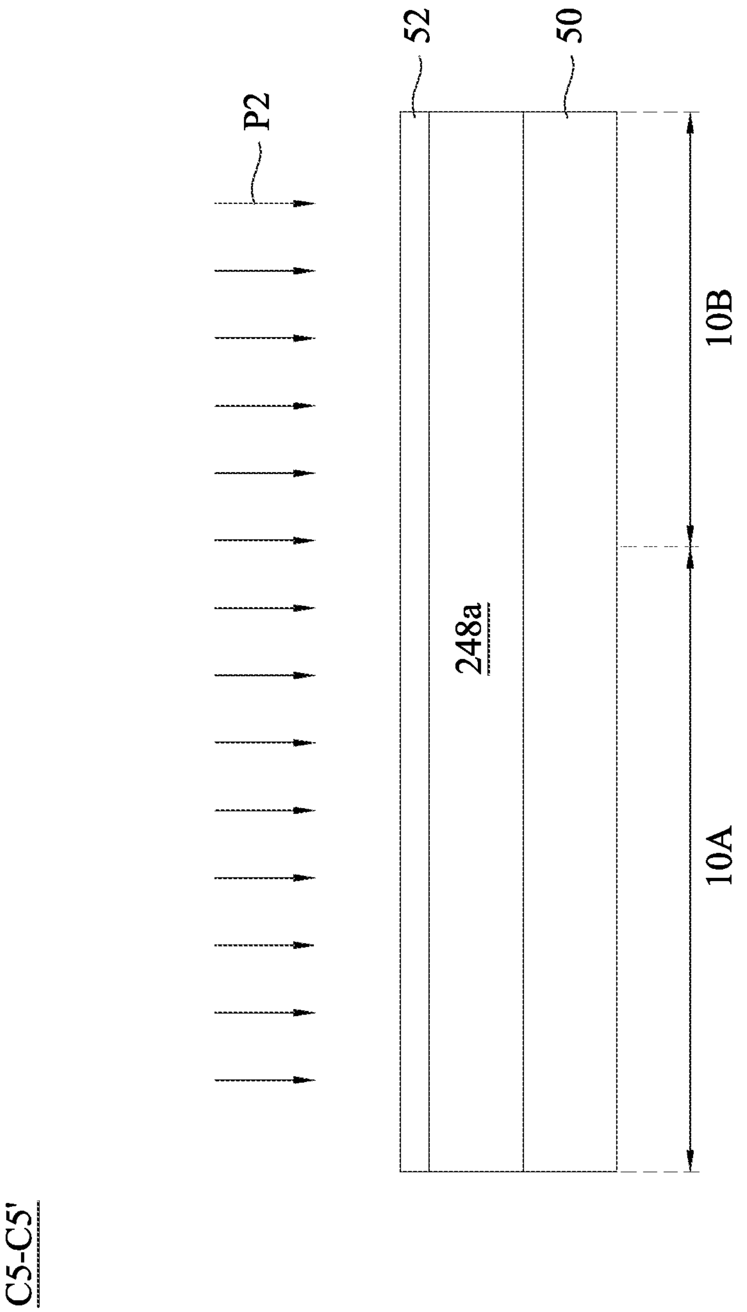

Reference is made to FIGS. 8A, 8B, and 8C. An annealing process P2 including a flash anneal (micro-second annealing, ussA) followed by a rapid thermal anneal (RTA) is performed on the substrate 50. In some embodiments, the RTA can be interchangeably referred to a spike anneal. The flash anneal is mainly performed to repair silicon interstitial defects and the RTA is mainly performed to activate the dopants in the first conductivity type device region 10C and the second conductivity type device region 10D after the silicon interstitial defects are eliminated by the flash anneal. The flash anneal used to remove silicon interstitial defects quickly heats up to a defect removal temperature without being in a temperature range, such as a temperature range about 700-1000 ° C. for longer than about 10 seconds, to avoid clustering of the silicon interstitial defects, which in turn allows for suppressing the dislocation loop formation.

This is described in greater detail, the flash anneal of the annealing process P2 which can be performed to repair silicon interstitial defects may include a preheat step and a annealing step following the preheat step. The preheat step is used to preheat the substrate 50. The annealing step following the preheat step is used to quickly heat up the substrate 50 to a defect removal temperature. A temperature ramp-up rate of the preheat step is lower than the temperature ramp-up rate of the annealing step. In some embodiments, the preheat step may have a temperature range, such as between about 700° C. and 1000° C. for a time duration less than about 10 seconds (e.g., 1, 2, 3, 4, 5, 6, 7, 8, 9, or 10 seconds). Therefore, the method to perform with a shortened time duration in a mid-temperature regime (about 700-1000° C.) can suppress silicon interstitial defects to cluster, which in turn allows for suppressing the dislocation loop formation and reducing an area density of dislocation loops. In some embodiments, the preheat step may have a temperature range which is less than about 750° C. (e.g. 700° C.) to avoid clustering of the silicon interstitial defects. In some embodiments, the preheat step does not have temperature within the temperature range, such as between about 700° C. and 1000° C. to avoid clustering of the silicon interstitial defects. In some embodiments, the flash anneal of the annealing process P2 can be performed on the substrate 50 at a temperature higher than about 1000° C., such that the silicon interstitial defects formed on the first conductivity type device region 10C and the second conductivity type device region 10D are repaired without forming of the dislocation loop and can be dissolved and recombined with vacancy, which in turn prevents defective epitaxy structures that are formed on the first conductivity type device region 10C and the second conductivity type device region 10D subsequently. In some embodiments, after the flash anneal of the annealing process P2 performed on the substrate 50 is complete, the first conductivity type device region 10C and the second conductivity type device region 10D can be defect-free. Subsequently, the dielectric layer 52 may be removed by an etching process including, such as dry etching, wet etching, such as dilute HF, and/or other etching methods (e.g., reactive ion etching).

Figure 9A:
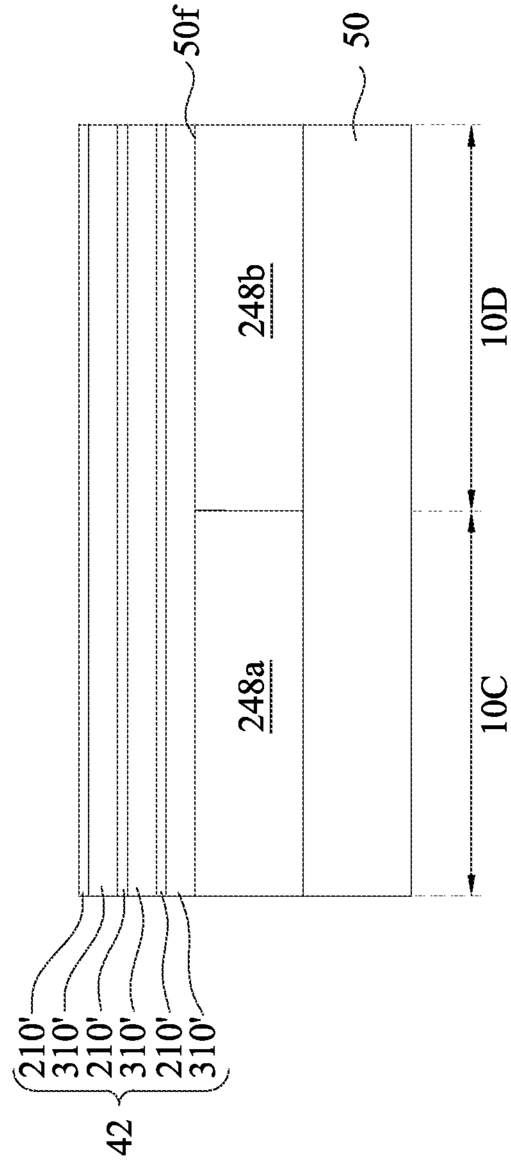
Figure 9B:
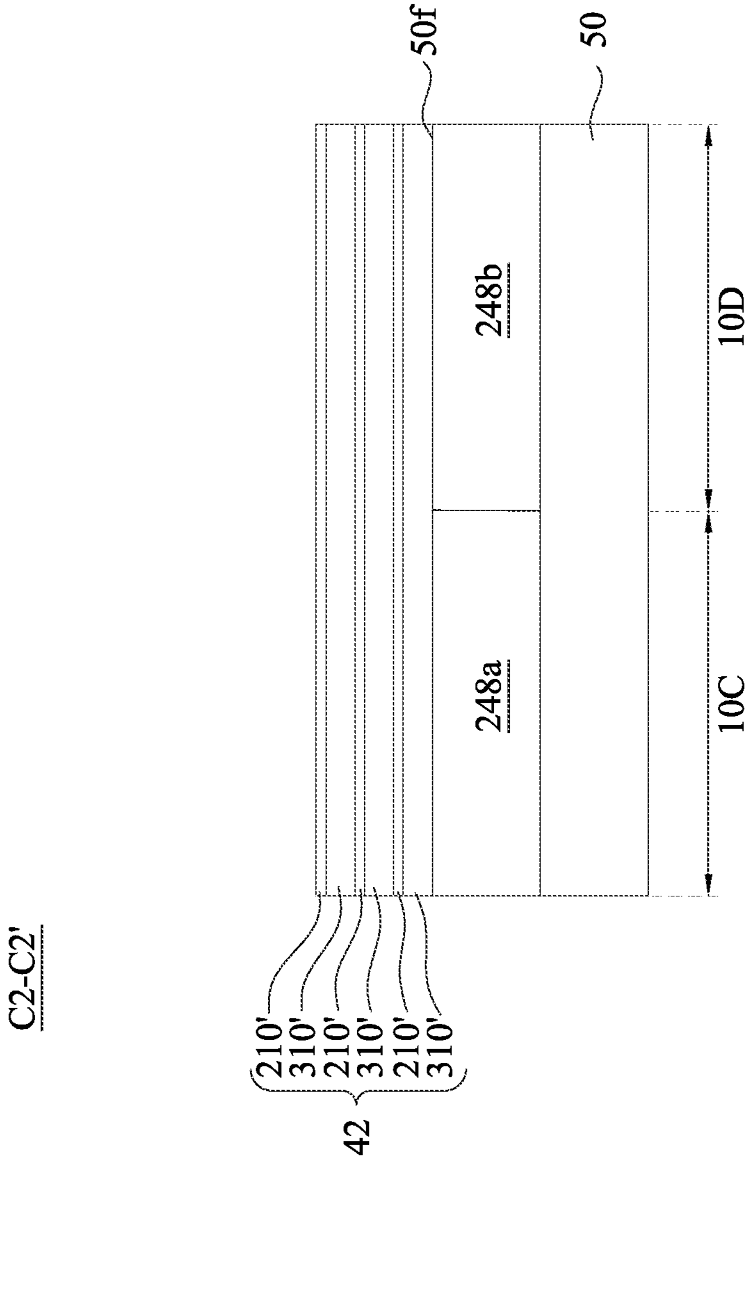
Figure 9C:
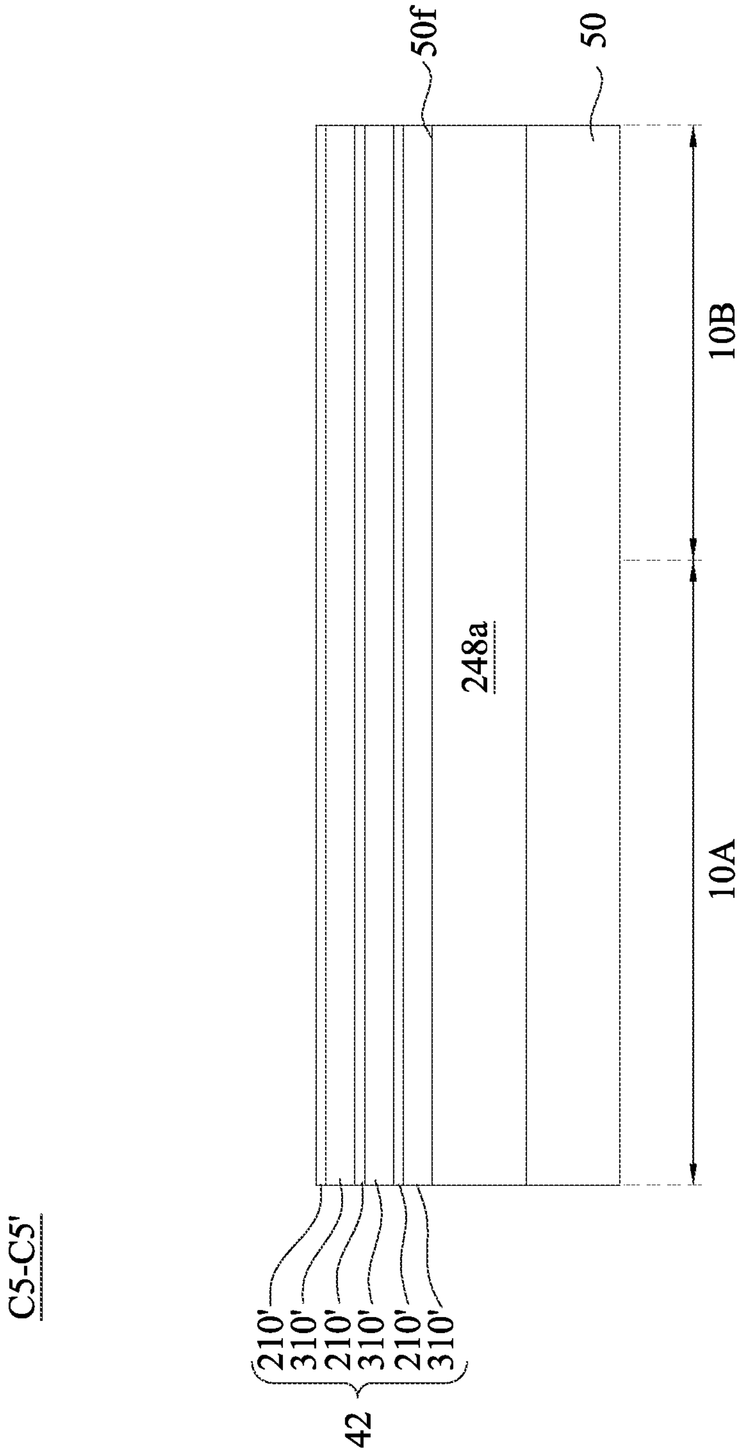
Figure 10A:
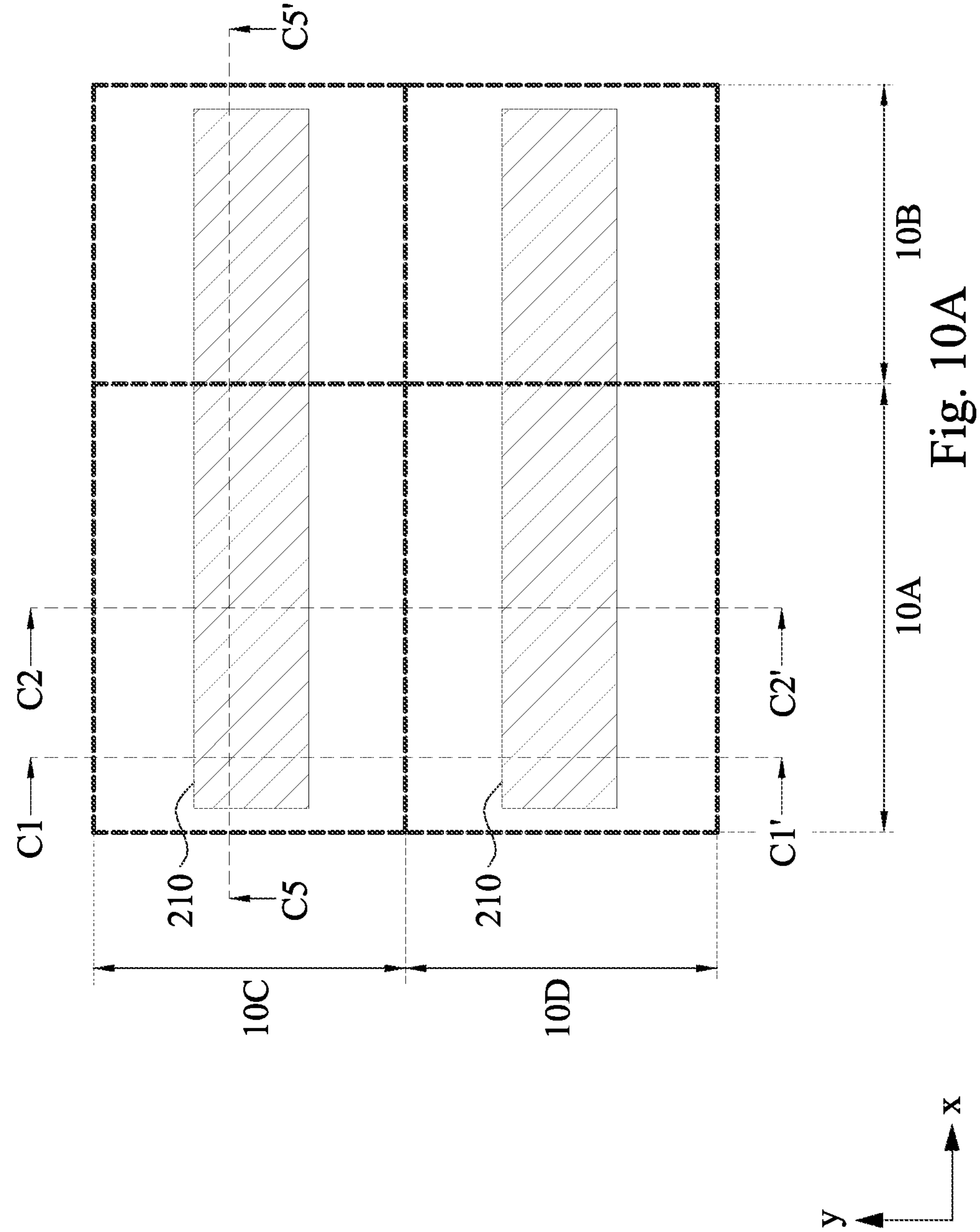
Figure 10B:
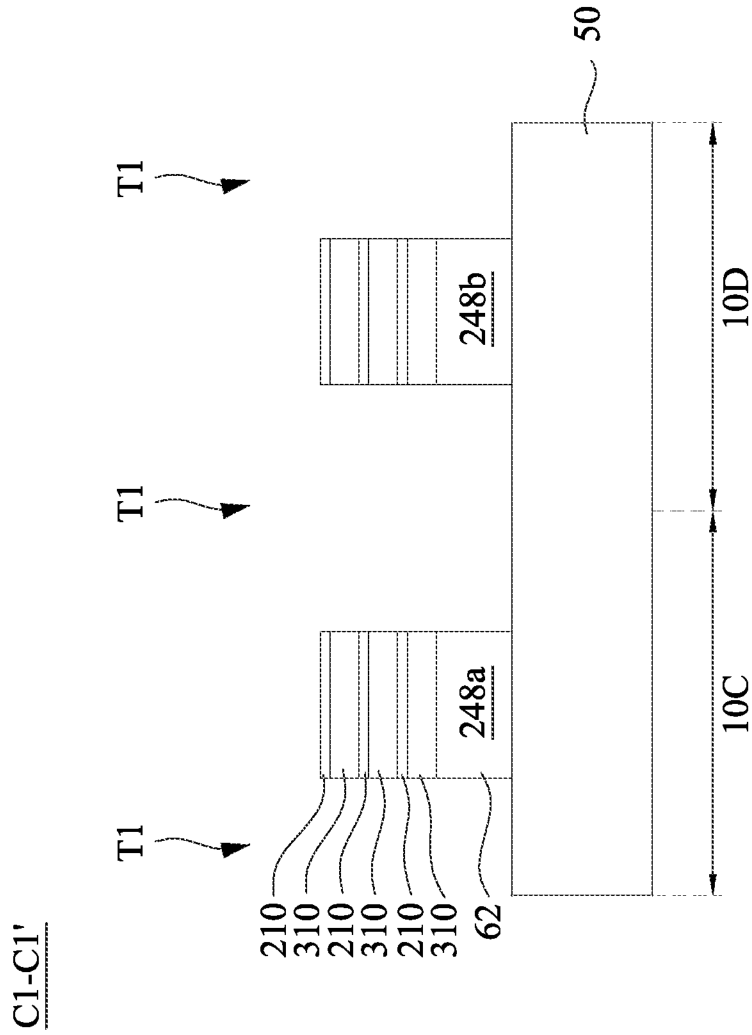
Figure 10C:
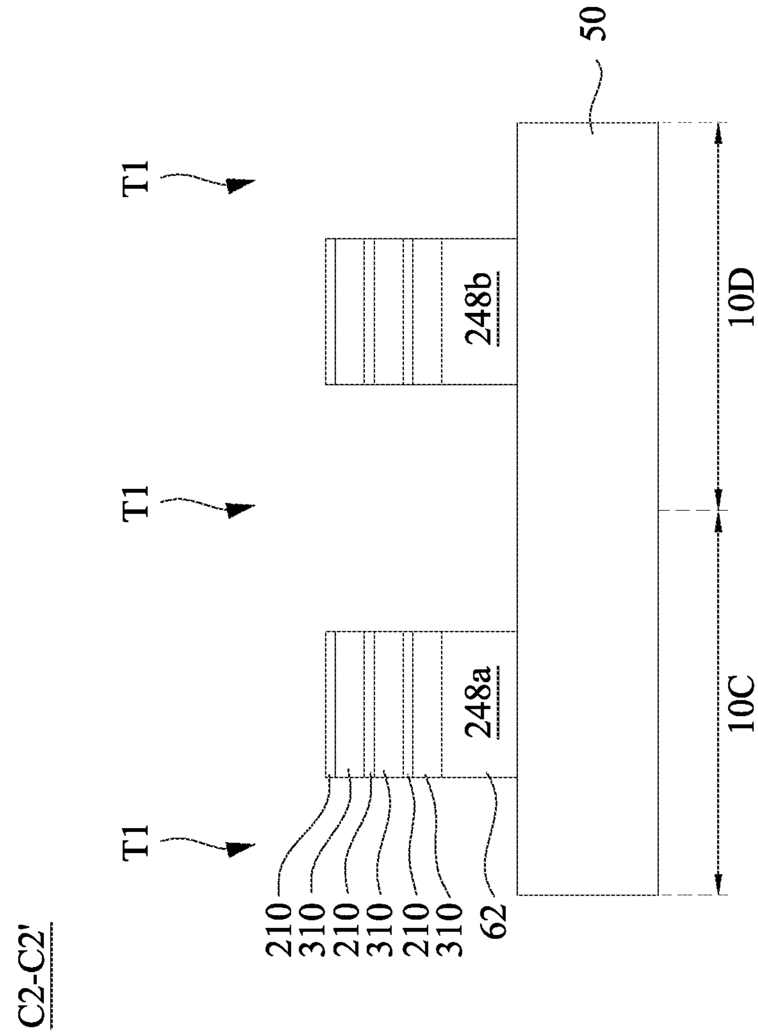
Figure 10D:
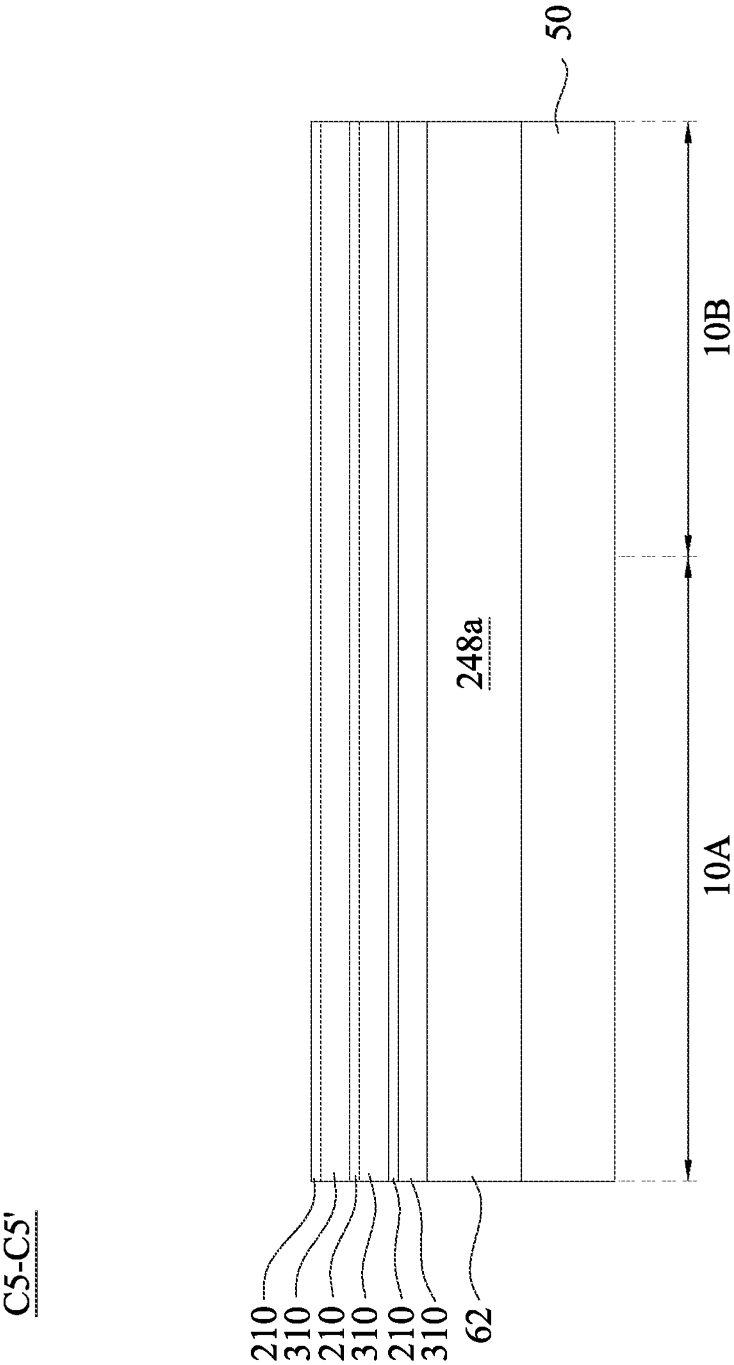

Reference is made to FIGS. 9A, 9B, and 9C. A multi-layer stack 42 is formed on the front-side 50*f* of the substrate 50. The multi-layer stack 42 includes alternating first semiconductor layers 310' and second semiconductor layers 210'. The first semiconductor layers 310' formed of a first semiconductor material, and the second semiconductor layers 210' are formed of a second semiconductor material. The semiconductor materials may each be selected from the candidate semiconductor materials of the substrate 50. In some embodiments, the multi-layer stack 42 includes three layers of each of the first semiconductor layers 310' and the second semiconductor layers 210'. It should be appreciated that the multi-layer stack 42 may include any number (e.g. about 2 to 6) of the first semiconductor layers 310' and the second semiconductor layers 210'.

In some embodiments, and as will be subsequently described in greater detail, the first semiconductor layers 310' will be removed and the second semiconductor layers 210' will patterned to form channel regions for the nano-FETs. The first semiconductor layers 310' are sacrificial layers (or dummy layers), which will be removed in subsequent processing to expose the top surfaces and the bottom surfaces of the second semiconductor layers 210'. The first semiconductor material of the first semiconductor layers 310' is a material that has a high etching selectivity from the etching of the second semiconductor layers 210', such as silicon germanium. The second semiconductor material of the second semiconductor layers 210' is a material suitable for both n-type and p-type devices, such as silicon.

In some embodiments, the first semiconductor material of the first semiconductor layers 310' may be made of a material, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 210' may be made of a material, such as silicon, silicon carbide, a III-V compound semiconductor, a II-VI compound semiconductor, or the like. The first semiconductor material and the second semiconductor material may have a high etching selectivity from the etching of one another. Each of the layers of the multi-layer stack 42 may be grown by a process such as vapor phase epitaxy (VPE) or molecular beam epitaxy (MBE), deposited by a process such as chemical vapor deposition (CVD) or atomic layer deposition (ALD), or the like. In some embodiments, the multi-layer stack 42 may have a thickness in a range from about 70 to 120 nm, such as about 70, 80, 90, 100, 110, or 120 nm. In some embodiments, each of the layers may have a small thickness, such as a thickness in a range of about 5 nm to about 40 nm. In some embodiments, some layers (e.g., the second semiconductor layers 210') are formed to be thinner than other layers (e.g., the first semiconductor layers 310'). For example, in embodiments in which the first semiconductor layers 310' are sacrificial layers (or dummy layers) and the second semiconductor layers 210' are patterned to form channel regions for the nano-FETs.

Reference is made to FIGS. 10A, 10B, 10C, and 10D. Trenches T1 are patterned in the substrate 50 and the multi-layer stack 42 to form fins 62, first semiconductor sheets 310, and second semiconductor sheets 210. The fins 62 are semiconductor strips patterned in the substrate 50. The first semiconductor sheets 310 and the second semiconductor sheets 210 include the remaining portions of the first semiconductor layers 310' and the second semiconductor layers 210', respectively. The trenches T1 may be patterned by any acceptable etch process, such as a reactive ion etch (RIE), neutral beam etch (NBE), the like, or a combination thereof. The etching may be anisotropic. The fins 62 and the first and second semiconductor sheets 310, 210 may be patterned by any suitable method. For example, the fins 62 and the first and second semiconductor sheets 310, 210 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as masks to pattern the fins 62 and the first and second semiconductor sheets 310, 210. In some embodiments, the mask (or other layer) may remain on the first and second semiconductor sheets 310, 210. The fins 62 and the first and second semiconductor sheets 310, 210 may each have widths in a range of about 8 nm to about 40 nm. In some embodiments, the fins 62 and the first and second semiconductor sheets 310, 210 have substantially equal widths.

Figure 11A:
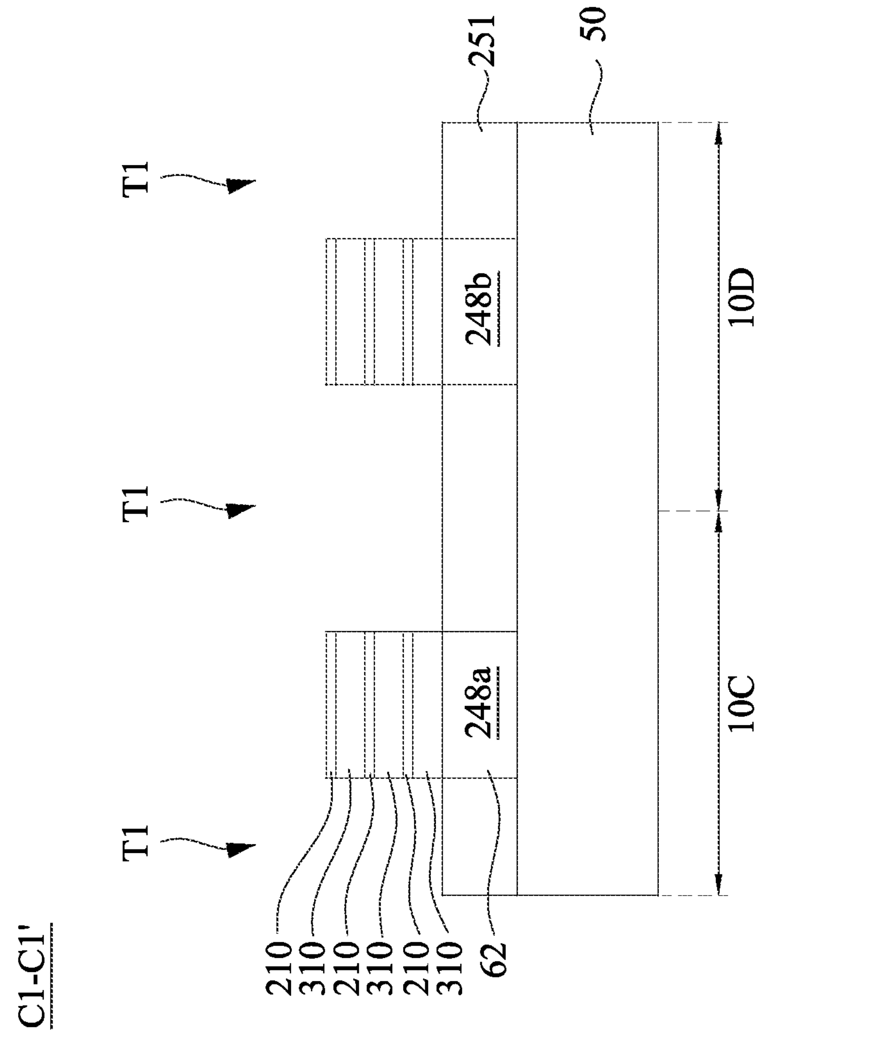
Figure 11B:
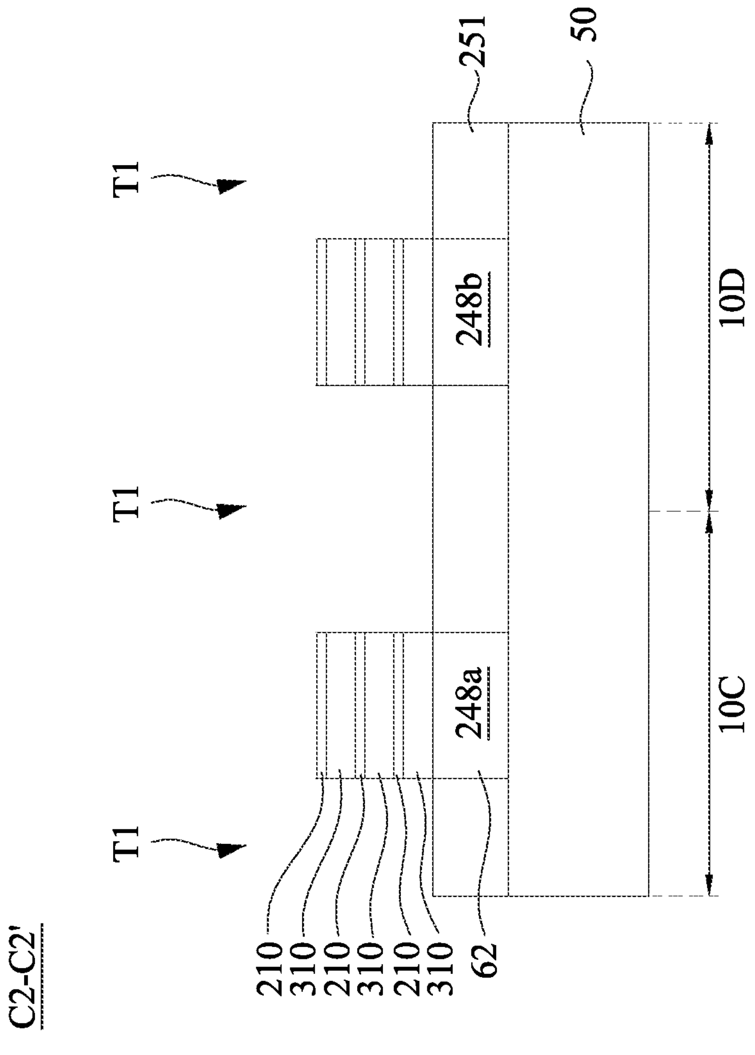
Figure 11C:
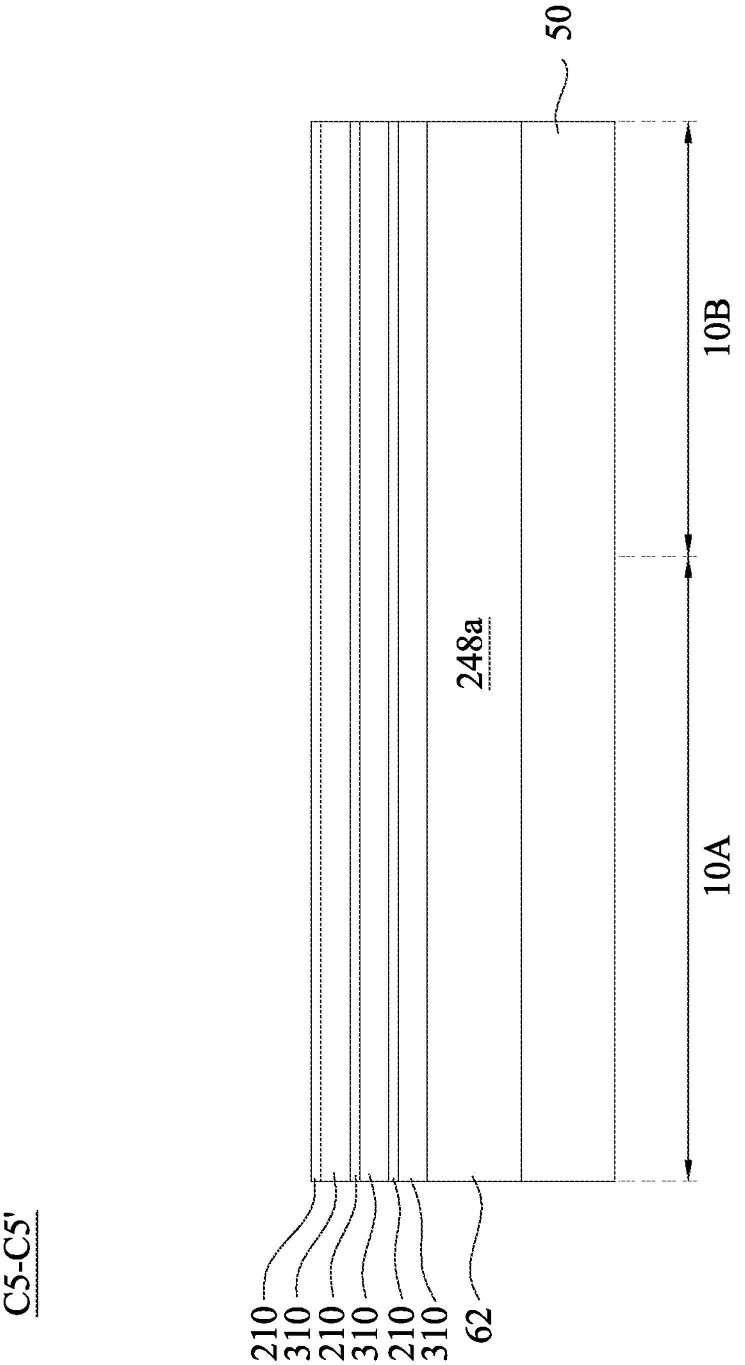
Figure 12A:
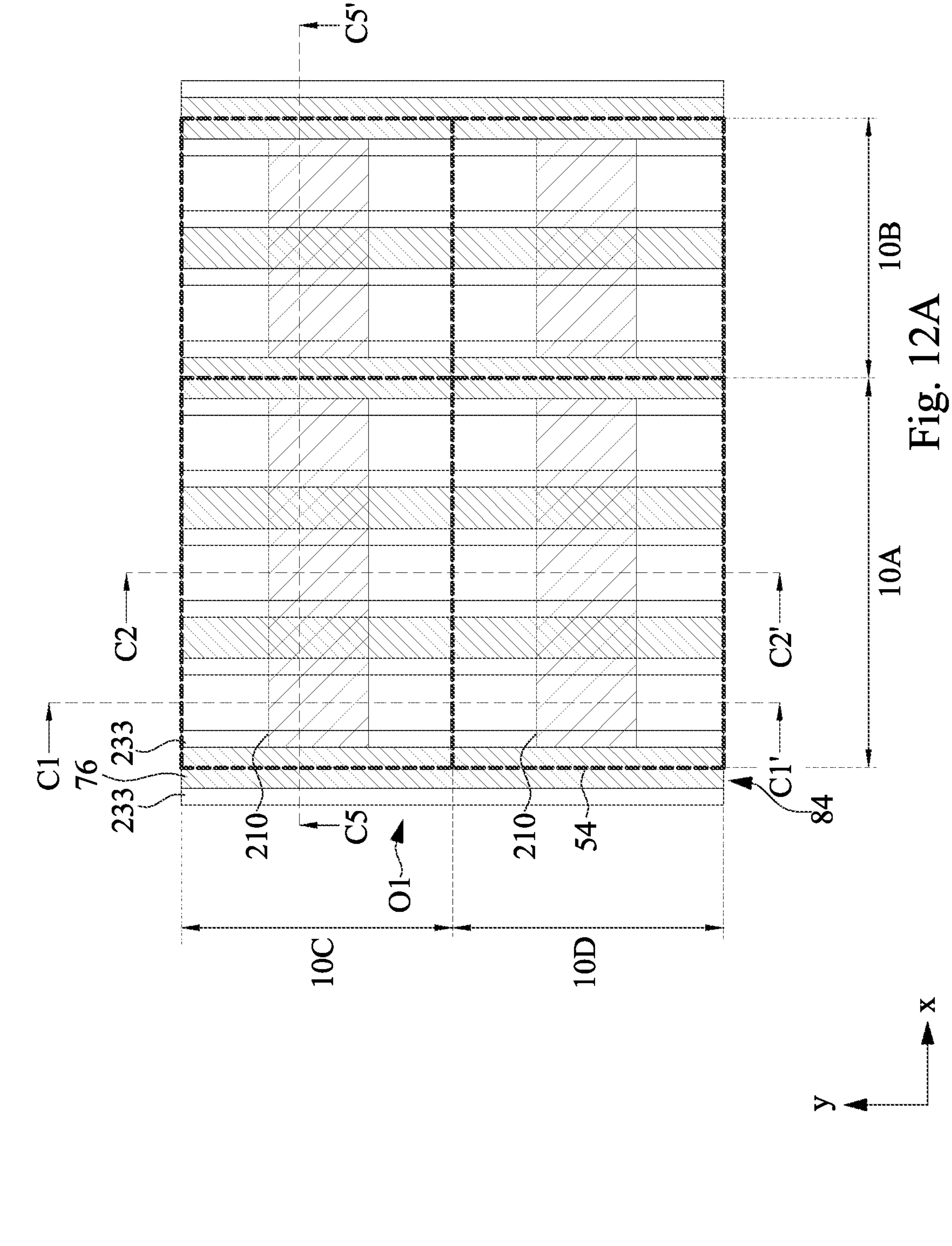
Figure 12B:
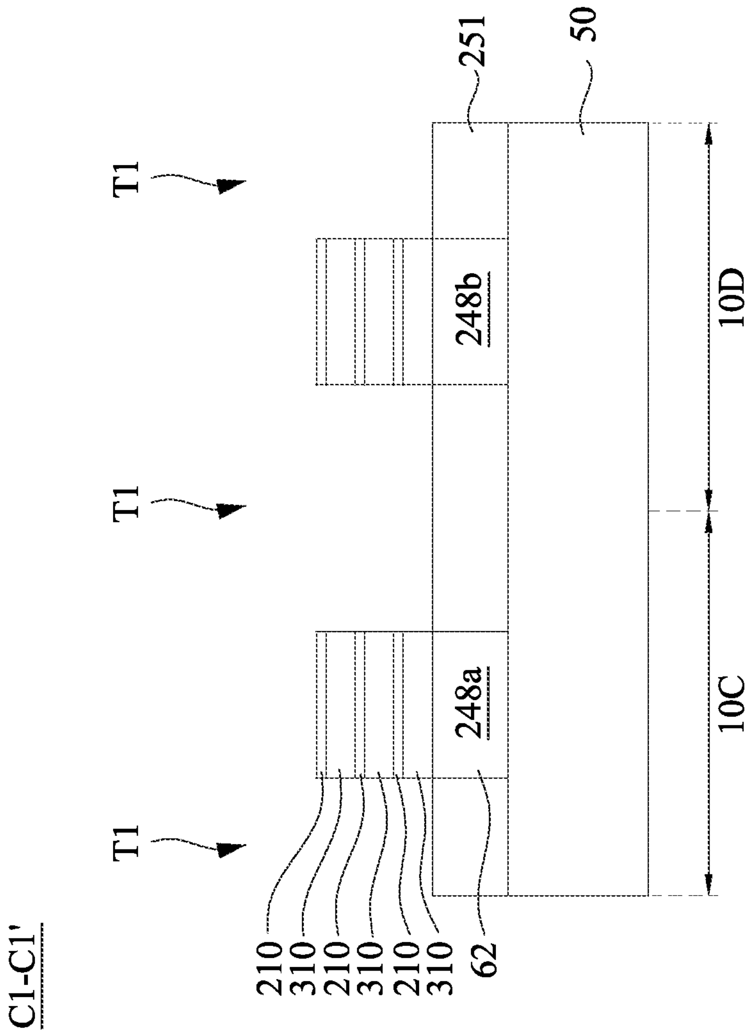
Figure 12C:
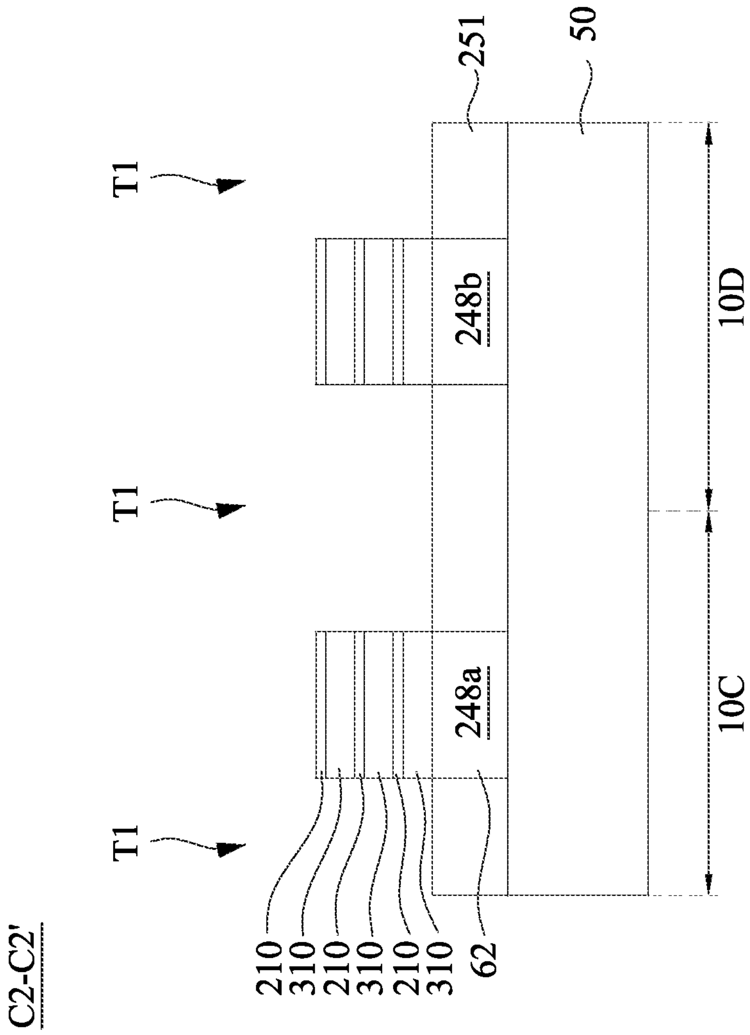
Figure 12D:
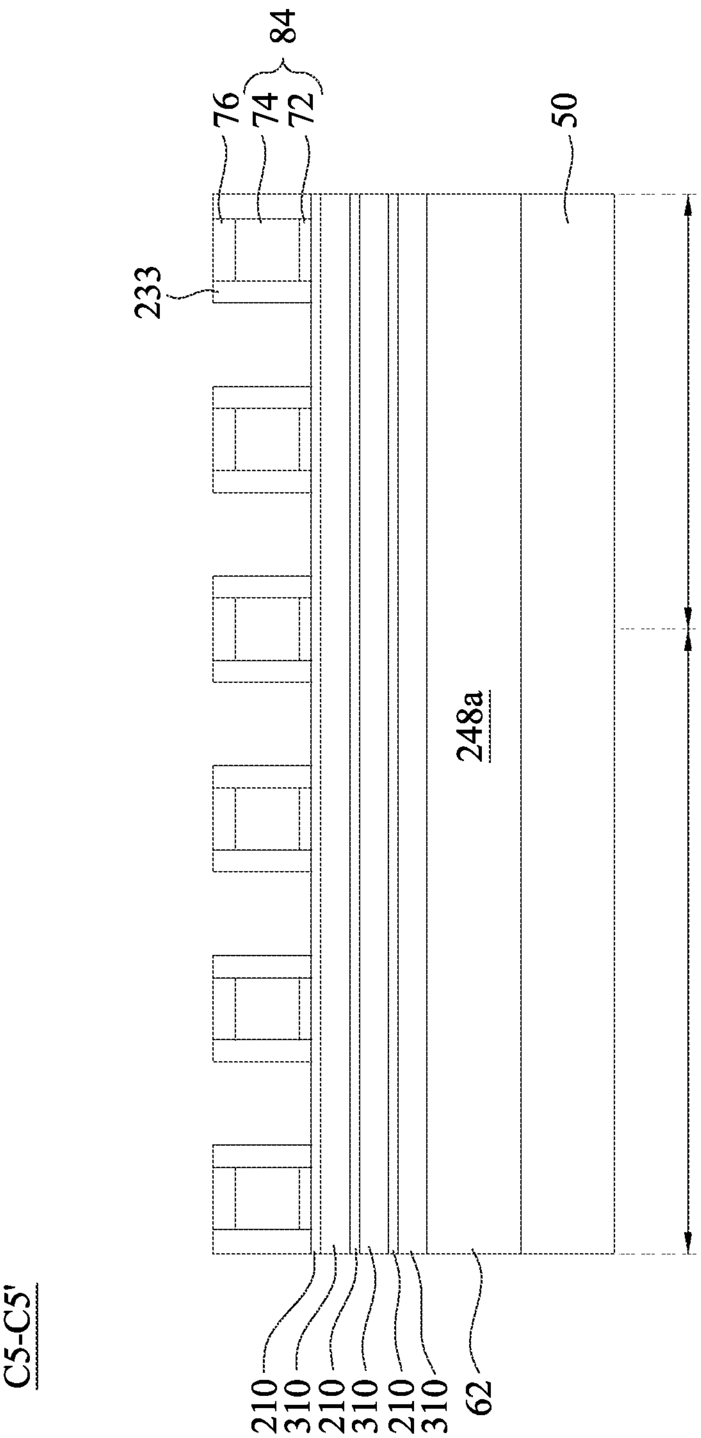

Reference is made to FIGS. 11A, 11B, and 11C. STI structures 251 are formed over the substrate 50 and between adjacent fins 62. The STI structures 251 are disposed around at least a portion of the fins 62 such that at least a portion of the first and second semiconductor sheets 310, 210 protrude from between adjacent STI structures 251. In some embodiments, the top surfaces of the STI structures 251 are coplanar (within process variations) with the top surfaces of the fins 62. In some embodiments, the top surfaces of the STI structures 251 are above or below the top surfaces of the fins 62. The STI structures 251 separate the features of adjacent devices.

The STI structures 251 may be formed by any suitable method. For example, an insulation material can be formed over the substrate 50 and the first and second semiconductor sheets 310, 210, and between adjacent fins 62. The insulation material may be an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof. Other insulation materials formed by any acceptable process may be used. In some embodiments, the insulation material is silicon oxide formed by FCVD. An anneal process may be performed once the insulation material is formed. In an embodiment, the insulation material is formed such that excess insulation material covers the first and second semiconductor sheets 310, 210. Although the STI structures 251 are each illustrated as a single layer, some embodiments may utilize multiple layers. For example, in some embodiments a liner (not separately illustrated) may first be formed along surfaces of the substrate 50, the fins 62, and the first and second semiconductor sheets 310, 210. Thereafter, a fill material, such as those previously described may be formed over the liner.

A removal process is then applied to the insulation material to remove excess insulation material over the first and second semiconductor sheets 310, 210. In some embodiments, a planarization process such as a chemical mechanical polish (CMP), an etch-back process, combinations thereof, or the like may be utilized. In embodiments in which a mask remains on the first and second semiconductor sheets 310, 210, the planarization process may expose the mask or remove the mask. After the planarization process, the top surfaces of the insulation material and the mask (if present) or the first and second semiconductor sheets 310, 210 are coplanar (within process variations). Accordingly, the top surfaces of the mask (if present) or the first and second semiconductor sheets 310, 210 are exposed through the insulation material. In some embodiments, no mask remains on the first and second semiconductor sheets 310, 210. The insulation material is then recessed to form the STI structures 251. The insulation material is recessed, such as in a range from about 30 nm to about 80 nm, such that at least a portion of the first and second semiconductor sheets 310, 210 protrude from between adjacent portions of the insulation material. Further, the top surfaces of the STI structures 251 may have a flat surface as illustrated, a convex surface, a concave surface (such as dishing), or a combination thereof. The top surfaces of the STI structures 251 may be formed flat, convex, and/or concave by an appropriate etch. The insulation material may be recessed using any acceptable etching process, such as one that is selective to the material of the insulation material (e.g., selectively etches the insulation material of the STI structures 251 at a faster rate than the materials of the fins 62 and the first and second semiconductor sheets 310, 210). For example, an oxide removal may be performed using dilute hydrofluoric (dHF) acid.

The process previously described is just one example of how the fins 62 and the first and second semiconductor sheets 310, 210 may be formed. In some embodiments, the fins 62 and/or the first and second semiconductor sheets 310, 210 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 62 and/or the first and second semiconductor sheets 310, 210. The epitaxial structures may include the alternating semiconductor materials previously described, such as the first semiconductor material and the second semiconductor material. In some embodiments where epitaxial structures are epitaxially grown, the epitaxially grown materials may be in situ doped during growth, which may obviate prior and/or subsequent implantations, although in situ and implantation doping may be used together.

Reference is made to FIGS. 12A, 12B, 12C, and 12D. A dummy dielectric layer, a dummy gate layer, and a mask layer are sequentially formed on the fins 62 and the first and second semiconductor sheets 310, 210. The dummy dielectric layer is formed on the fins 62 and the first and second semiconductor sheets 310, 210. The dummy dielectric layer may be formed of a dielectric material such as silicon oxide, silicon nitride, a combination thereof, or the like, which may be deposited or thermally grown according to acceptable techniques. Subsequently, a dummy gate layer is formed over the dummy dielectric layer. Subsequently, a mask layer is formed over the dummy gate layer. The dummy gate layer may be deposited over the dummy dielectric layer and then planarized, such as by a CMP. The mask layer may be deposited over the dummy gate layer. The dummy gate layer may be formed of a conductive or non-conductive material, such as amorphous silicon, polycrystalline-silicon (polysilicon), poly-crystalline silicon-germanium (poly-SiGe), a metal, a metallic nitride, a metallic silicide, a metallic oxide, or the like, which may be deposited by physical vapor deposition (PVD), CVD, or the like. The dummy gate layer may be formed of material(s) that have a high etching selectivity from the etching of insulation materials, e.g., the STI structures 251 and/or the dummy dielectric layer. The mask layer may be formed of a dielectric material such as silicon nitride, silicon oxynitride, or the like. In some embodiments, the dummy dielectric layer covers the fins 62, the first and second semiconductor sheets 310, 210, and the STI structures 251, such that the dummy dielectric layer extends over the STI structures 251 and between the dummy gate layer and the STI structures 251. In another embodiment, the dummy dielectric layer covers only the fins 62 and the first and second semiconductor sheets 310, 210.

The mask layer is patterned using acceptable photolithography and etching techniques to form masks 76. The pattern of the masks 76 is then transferred to the dummy gate layer by any acceptable etching technique to form dummy gates 74. The pattern of the masks 76 may optionally be further transferred to the dummy dielectric layer by any acceptable etching technique to form dummy dielectrics 72. The dummy gate 74 and the dummy dielectric 72 may be collectively referred to as a dummy gate structure 84. The dummy gate structures 84 cover portions of the first and second semiconductor sheets 310, 210 that will be exposed in subsequent processing to form channel regions. Specifically, the dummy gate structures 84 extend along the portions of the second semiconductor sheets 210 that will be patterned to form channel regions. The pattern of the masks 76 may be used to physically separate adjacent dummy gate structures 84. The dummy gate structures 84 may also have lengthwise directions substantially perpendicular (within process variations) to the lengthwise directions of the fins 62. The masks 76 can optionally be removed after patterning, such as by any acceptable etching technique.

Gate spacers 233 are formed over the first and second semiconductor sheets 310, 210, on exposed sidewalls of the masks 76, the dummy gates 74, and the dummy dielectrics 72. In some embodiments, the gate spacers 233 can be interchangeably referred to top spacers or upper gate spacers. In some embodiments, the gate spacers 233 may have a lateral dimension in a range from about 4 nm to about 12 nm. In some embodiments, the gate spacer 233 may include multiple dielectric material and selected from a group consist of $SiO_2$, $Si_3N_4$, carbon doped oxide, nitrogen doped oxide, porous oxide, air gap, or combinations thereof. The gate spacers 233 may be formed by conformally depositing one or more dielectric material(s) and subsequently etching the dielectric material(s). Acceptable dielectric materials may include silicon oxide, silicon nitride, silicon oxynitride, silicon oxycarbonitride, or the like, which may be formed by a conformal deposition process such as chemical vapor deposition (CVD), plasma-enhanced chemical vapor deposition (PECVD), atomic layer deposition (ALD), plasma-enhanced atomic layer deposition (PEALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gate structures 84 (thus forming the gate spacers 233).

Figure 13A:
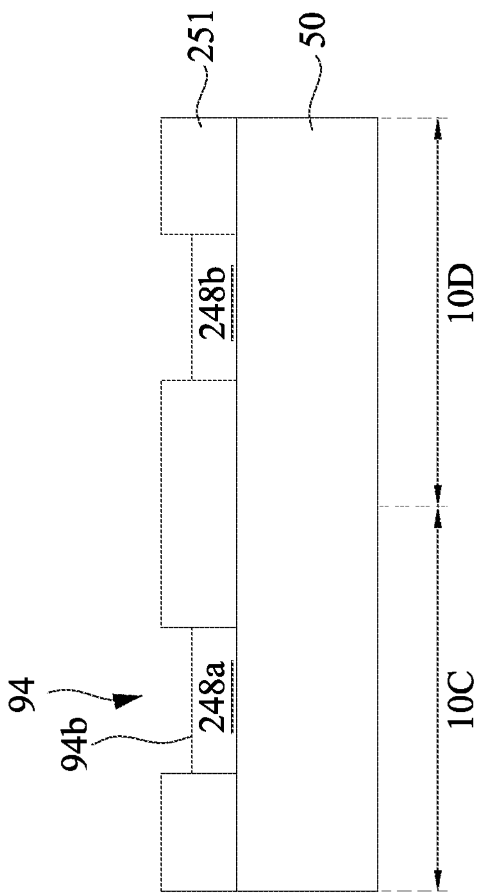
Figure 13B:
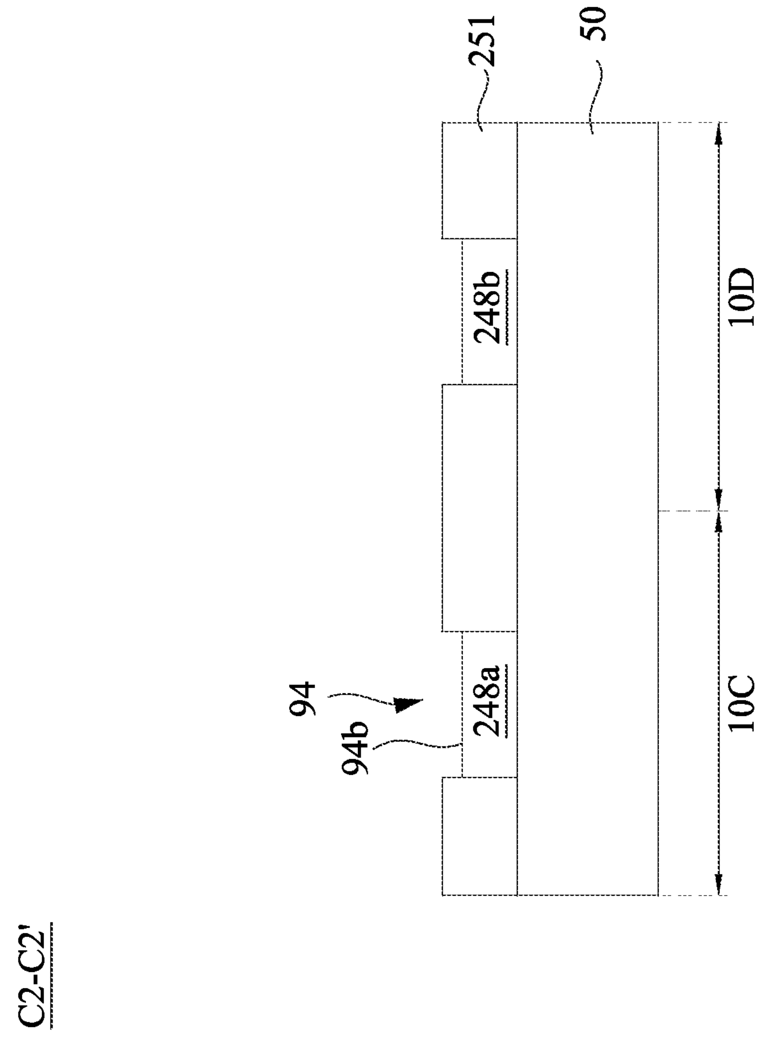
Figure 13C:
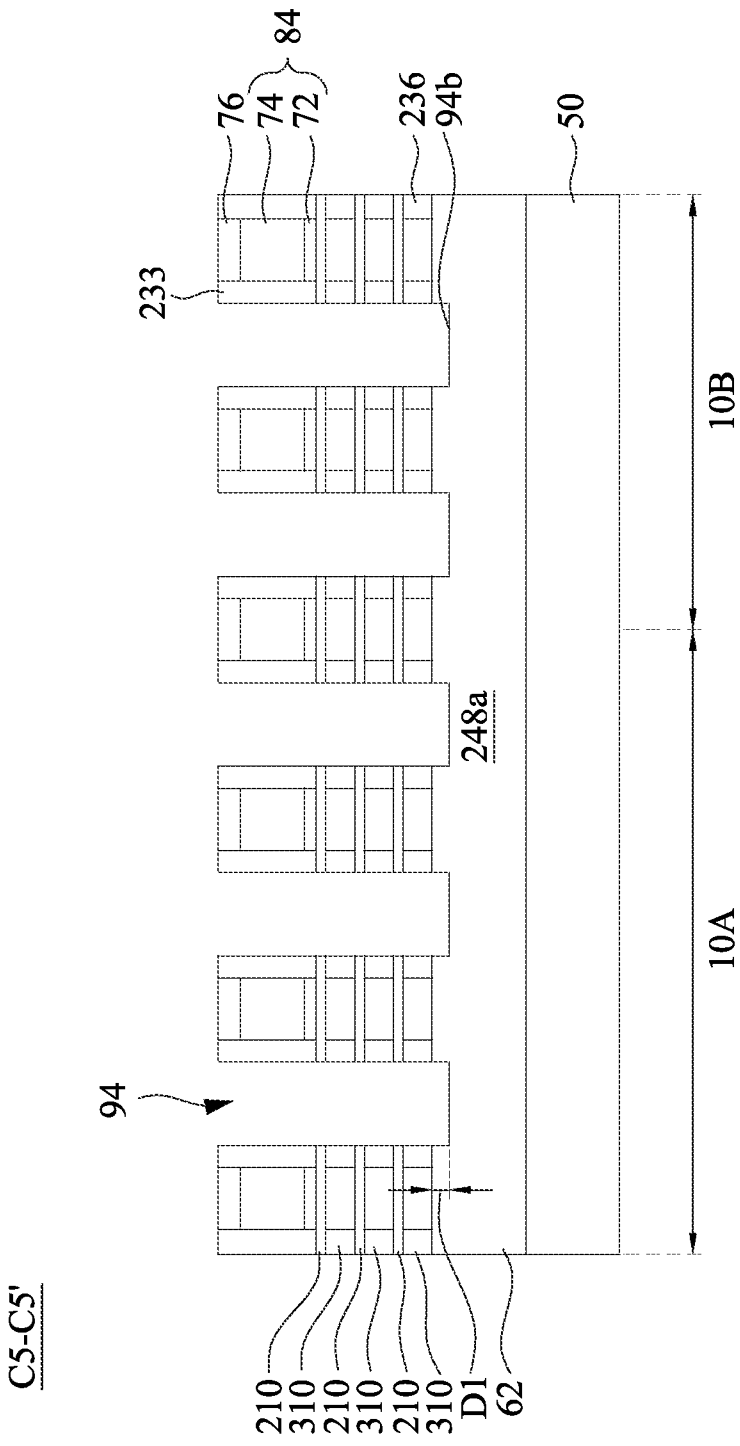

Reference is made to FIGS. 13A, 13B, and 13C. Source/drain recesses 94 are formed in the first and second semiconductor sheets 310, 210. In some embodiments, the source/drain recesses 94 extend through the first and second semiconductor sheets 310, 210 and into the fins 62. In some embodiments, the fins 62 may be etched such that bottom surfaces of the source/drain recesses 94 are disposed below the top surfaces of the STI structures 251. The source/drain recesses 94 may be formed by etching the first and second semiconductor sheets 310, 210 using an anisotropic etching process, such as a RIE, a NBE, or the like. The gate spacers 233 and the dummy gate structures 84 collectively mask portions of the fins 62 and/or the first and second semiconductor sheets 310, 210 during the etching processes used to form the source/drain recesses 94. A single etch process may be used to etch each of the first and second semiconductor sheets 310, 210, or multiple etch processes may be used to etch the first and second semiconductor sheets 310, 210. Timed etch processes may be used to stop the etching of the source/drain recesses 94 after the source/drain recesses 94 reach a desired depth. In some embodiments, the source/drain recess 94 has a bottom 94*b* that is in a position lower than a bottommost one of the second semiconductor sheets 210. By way of example but not limitation, the bottom 94*b* of the source/drain recess 94 is in a position lower than a bottommost one of the second semiconductor sheets 210 about 10 nm to about 60 nm, such as about 10, 20, 30, 40, 50, or 60 nm.

Subsequently, inner spacers 236 are formed on sidewalls of the remaining portions of the first semiconductor sheets 310, e.g., those sidewalls exposed by the source/drain recesses 94. As will be subsequently described in greater detail, source/drain regions will be subsequently formed in the source/drain recesses 94, and the first semiconductor sheets 310 will be subsequently replaced with corresponding gate structures. The inner spacers 236 act as isolation features between the subsequently formed source/drain regions and the subsequently formed gate structures. Further, the inner spacers 236 may be used to substantially prevent damage to the subsequently formed source/drain regions by subsequent etching processes, such as etching processes used to subsequently remove the first semiconductor sheets 310. In some embodiments, the inner spacers 236 can be interchangeably referred to lower gate spacers. In some embodiments, the inner spacers 236 may have a lateral dimension in a range from about 4 nm to about 12 nm.

As an example to form the inner spacers 236, the source/drain recesses 94 can be laterally expanded. Specifically, portions of the sidewalls of the first semiconductor sheets 310 exposed by the source/drain recesses 94 may be recessed. Although sidewalls of the first semiconductor sheets 310 are illustrated as being straight, the sidewalls may be concave or convex. The sidewalls may be recessed by any acceptable etching process, such as one that is selective to the material of the first semiconductor sheets 310 (e.g., selectively etches the material of the first semiconductor sheets 310 at a faster rate than the material of the second semiconductor sheets 210). The etching may be isotropic. For example, when the second semiconductor sheets 210 are formed of silicon and the first semiconductor sheets 310 are formed of silicon germanium, the etching process may be a wet etch using tetramethylammonium hydroxide (TMAH), ammonium hydroxide ($NH_4OH$), or the like. In another embodiment, the etching process may be a dry etch using a fluorine-based gas such as hydrogen fluoride (HF) gas. In some embodiments, the same etching process may be continually performed to both form the source/drain recesses 94 and recess the sidewalls of the first semiconductor sheets 310. The inner spacers 236 can then be formed by conformally forming an insulating material and subsequently etching the insulating material. The insulating material may be silicon nitride or silicon oxynitride, although any suitable material, such as low-dielectric constant (low-k) materials having a k-value less than about 3.5, may be utilized. In some embodiments, the inner spacer 236 may have a highery K (dielectric constant) value than the gate spacer 233. In some embodiments, the material of inner spacer is selected from a group including $SiO_2$, $Si_3N_4$, SiON, SiOC, SiOCN base dielectric material, air gap, or combinations thereof. The insulating material may be deposited by a conformal deposition process, such as ALD, CVD, or the like. The etching of the insulating material may be anisotropic. For example, the etching process may be a dry etch such as a RIE, a NBE, or the like. Although outer sidewalls of the inner spacers 236 are illustrated as being flush with respect to the sidewalls of the gate spacers 233, the outer sidewalls of the inner spacers 236 may extend beyond or be recessed from the sidewalls of the gate spacers 233. In other words, the inner spacers 236 may partially fill, completely fill, or overfill the sidewall recesses. Moreover, although the sidewalls of the inner spacers 236 are illustrated as being straight, the sidewalls of the inner spacers 236 may be concave or convex.

Figure 14A:
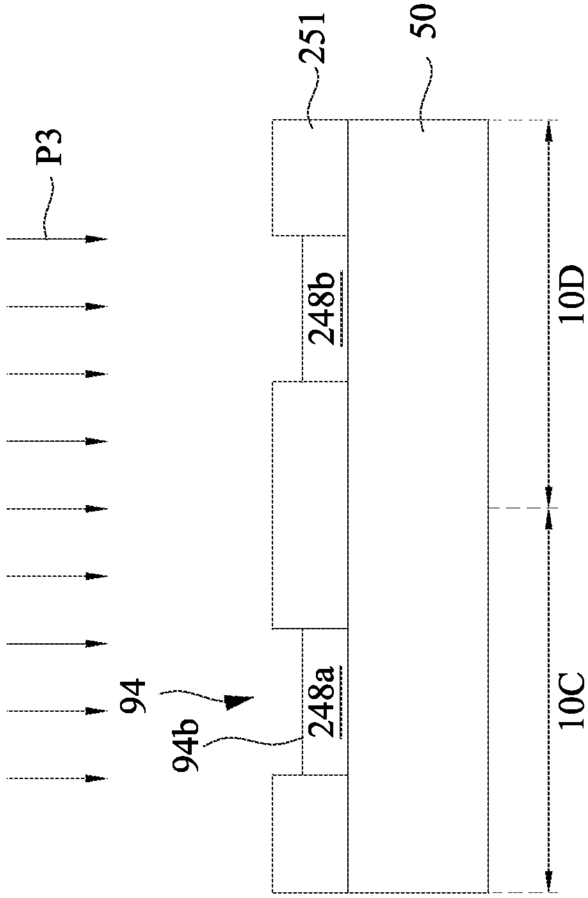
Figure 14B:
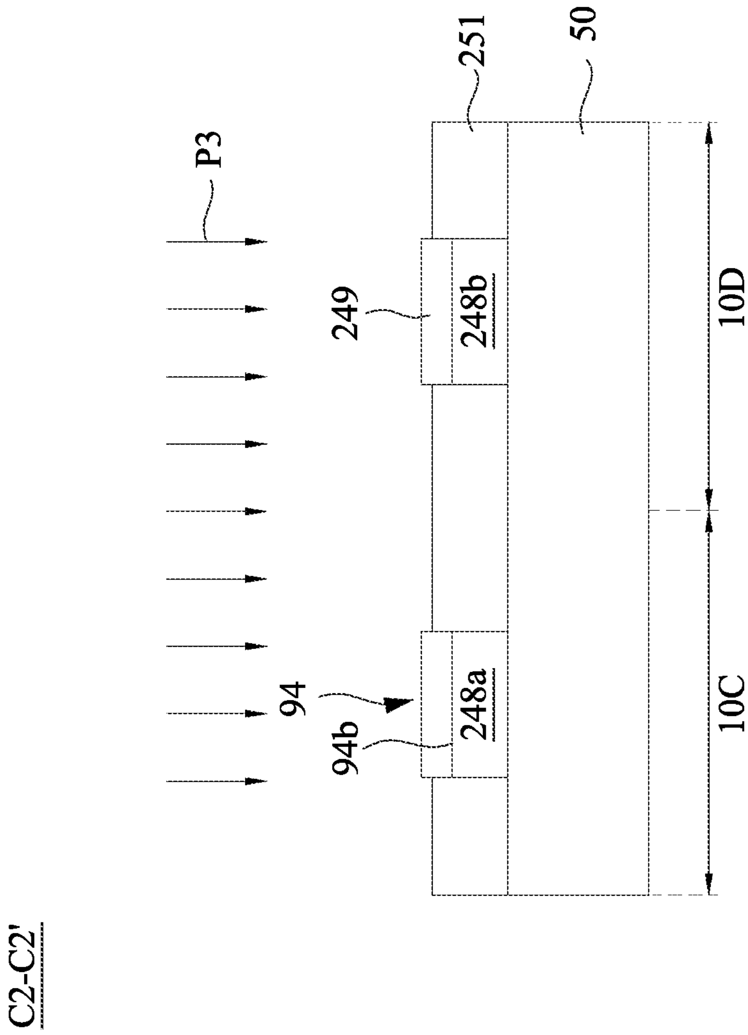
Figure 14C:
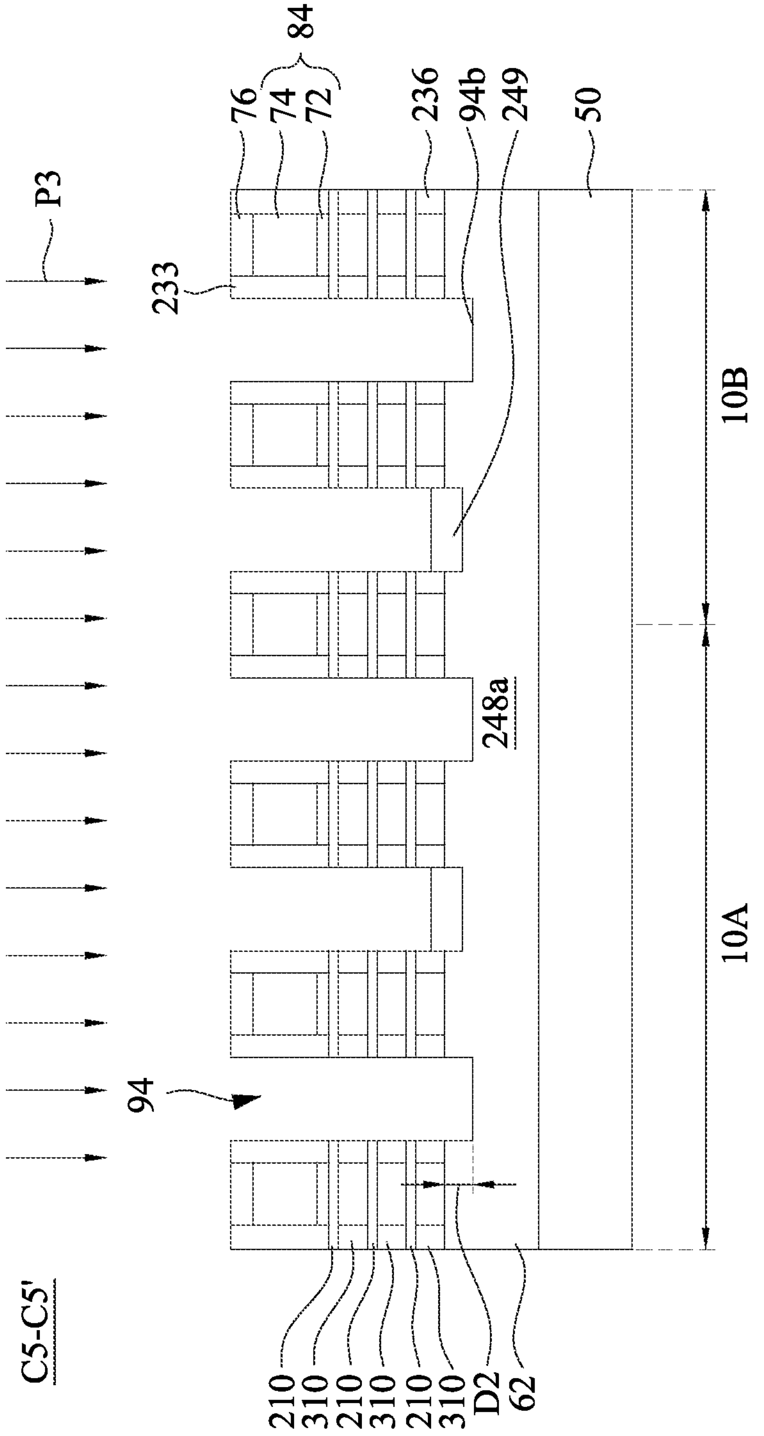

Reference is made to FIGS. 14A, 14B, and 14C. A dielectric layer 249 is formed on a bottom 94*b* of the source/drain recess 94 where a source/drain region 218*b* (see FIGS. 15B and 15C) that is not of Vdd node and Vss node will be subsequently formed thereon. Therefore, the source/drain regions 218*b* (see FIG. 27C) which are not of Vdd node and Vss node can be isolated from the doped semiconductive layers 248*a* and 248*b* by the dielectric layers 249 formed from the dielectric material.

Firstly, dielectric material is selective formed on all of the bottoms 94*b* of the source/drain recess 94 where source/drain regions 218*a* and 218*b* (see FIGS. 15A-15C) will be subsequently formed thereon. In particular, the selective deposition process P3 may include a deposition step to deposit the dielectric material over the substrate 50 and a sputter step to remove the dielectric material deposited on sidewalls of the recesses 94 and an upper surface above the substrate 50, so as to leave the deposited dielectric material on a lower surface above the substrate 50.

Specifically, the dielectric material may be selectively deposited on the bottom 94*b* of the source/drain recess 94 by a selective deposition process P3. In some embodiments, the selective deposition process P3 may be performed by an inductively coupled plasma (ICP) tool or a capactitively coupled plasma (CCP) tool. In some embodiments, the deposition gas used in the selective deposition process P3 may include, for example, a silicon source gas, such as silicon tetrachloride gas, $SiCl_4$, and an oxygen source gas, such as molecular oxygen gas, $O_2$, in plasma state to form a silicon oxide layer over the substrate 50. In some embodiments, the deposition gas used in the selective deposition process P3 may include, for example, a fluorocarbon ($C_xF_y$) source gas, such as $C_4F_6$ and/or $C_4F_8$, and an oxygen source gas, such as molecular oxygen gas, $O_2$, in plasma state to form a $C_xF_y$ layer over the substrate 105. In some embodiments, the deposition gas used in the selective deposition process P3 may include a mixture of $BCl_3$ and $N_2$ to deposit boron or boron nitride; a mixture of $BCl_3$, $CH_4$ and $H_2$ to deposit boron carbide. In some embodiments, sputter etching caused by plasmas in the selective deposition process P3 may provide a higher sputter etch rate at the dielectric material on the sidewalls of the recesses 94 and the upper surface above the substrate 50 than on the lower surface above the substrate 50, such that the net effect of the deposition and sputter etching in the selective deposition process P3 leads to the dielectric material remaining on the bottom 94*b* of the recesses 94 and absent on the sidewalls of the recesses 94 and the upper surface above the substrate 50. In some embodiments, the deposition and sputter etching in the selective deposition process P3 may be performed in-situ or ex-situ.

Secondly, the deposited dielectric material on the bottom 94*b* of the recess 94 where the source/drain region 218*a* (see FIGS. 15A and 15C) that is of Vdd node or Vss node will be subsequently formed thereon is removed. Specifically, a hard mask layer may be formed over the substrate 50. Subsequently, the hard mask layer can be patterned so that openings may be formed over the bottom 94*b* of the recess 94 where the source/drain region 218*a* (see FIGS. 15A and 15C) will be subsequently formed thereon. Subsequently, a removing process (e.g., a lithography patterning process) can be performed through the openings to remove the bottom 94*b* of the recess 94 where the source/drain region 218*a* (see FIGS. 15A and 15C) will be subsequently formed thereon, such that the dielectric material remaining on the bottom 94*b* of the recesses 94 underlying the hard mask layer forms the dielectric layers 249. After the formation of the dielectric layers 249, the patterned hard mask layer can be removed with a wet clean process, an ashing process, or the like. In some embodiments, the removing process may further etch the fin 62, such that the source/drain recess 94 shown in FIG. 14C may have a deeper depth D2 than a depth D1 of the source/drain recess 94 shown in FIG. 13C relative to a top surface of the fin 62. By way of example but not limiting the present disclosure, the bottom 94*b* of the source/drain recess 94 as shown in FIG. 14C may be in a position lower than the bottommost one of the second semiconductor sheets 210 about 10 nm to about 60 nm, such as about 10, 20, 30, 40, 50, or 60 nm. In some embodiments, the dielectric layer 249 is made of an oxide-containing material (e.g., $SiO_2$), a nitrogen-containing material (e.g., SiON, SiN, $Si_3N_4$), a carbon-containing material (e.g., SiOC, SIOCN), the like, or combinations thereof. In some embodiments, the dielectric layer 249 may be made of a material having a dielectric constant greater than about 7.9 (e.g., high dielectric constant (high-k) material). For example, the dielectric layer 249 may be made of a high dielectric constant (high-k) material, such as be hafnium oxide ($HfO_2$), zirconium oxide ($ZrO_2$), lanthanum oxide ($La_2O_3$), yttrium oxide ($Y_2O_3$), aluminum oxide ($Al_2O_3$), tantalum oxide ($Ta_2O_5$), titanium oxide ($TiO_2$), another applicable material, or combinations thereof.

Figure 15A:
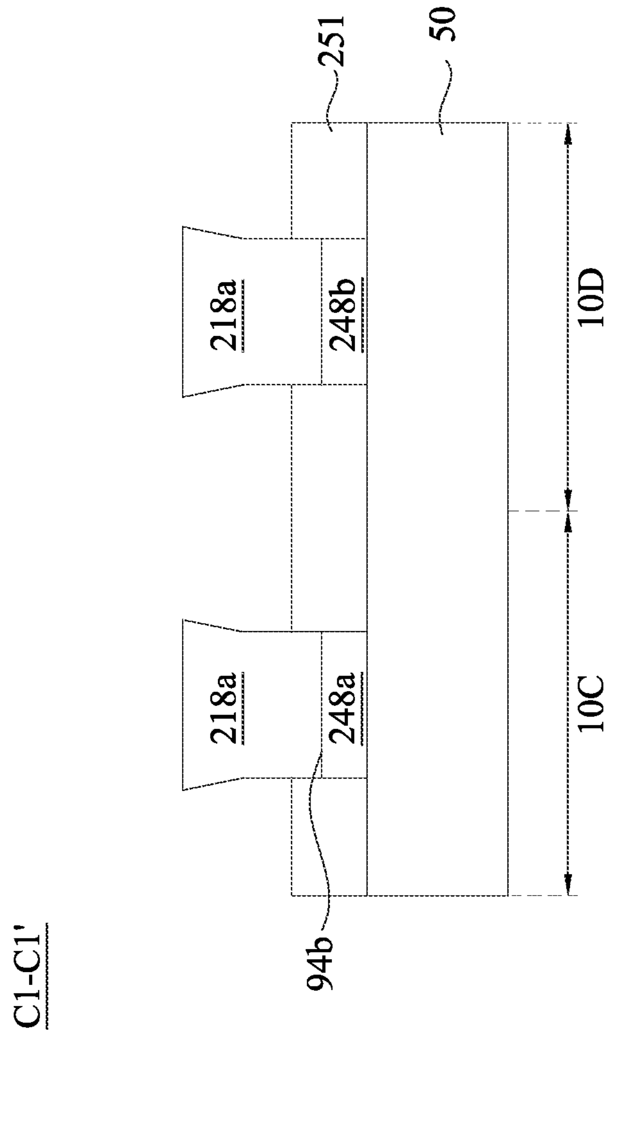
Figure 15B:
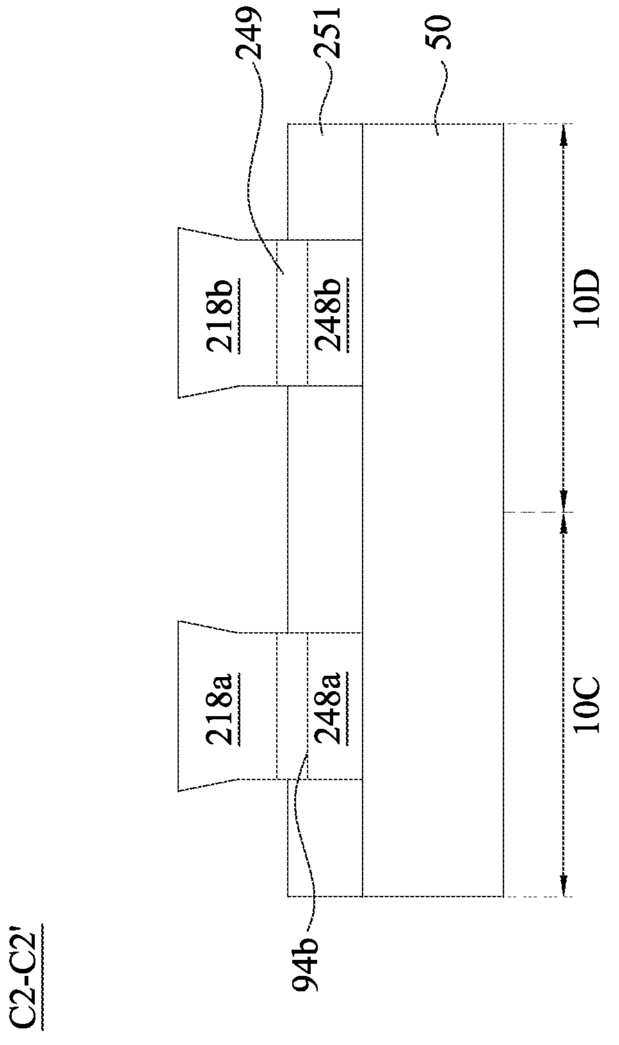
Figure 15C:
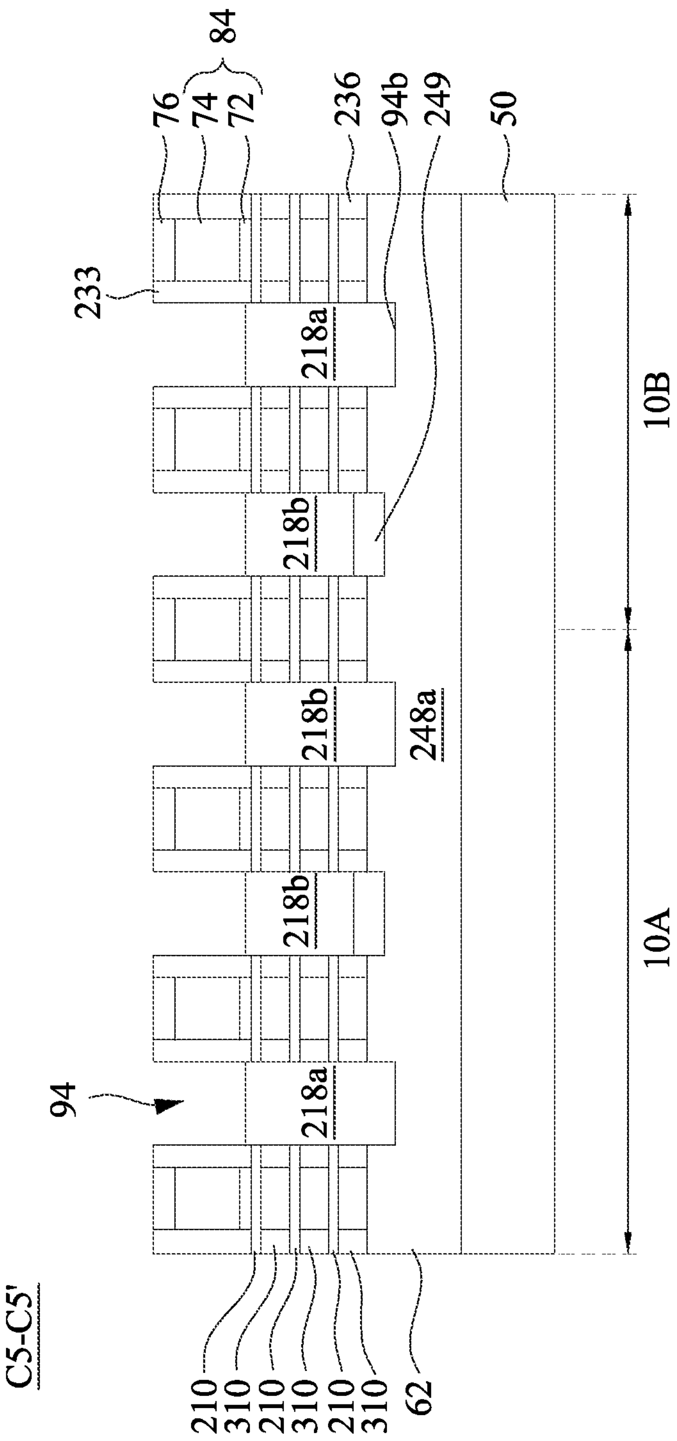

Reference is made to FIGS. 15A, 15B, and 15C. Epitaxial source/drain regions 218*a* and 218*b* are formed in the source/drain recesses 94, such that each dummy gate 84 (and corresponding channel regions) is disposed between respective adjacent pairs of the epitaxial source/drain regions 218*a* and 218*b*. In some embodiments, the gate spacers 233 and the inner spacers 236 are used to separate the epitaxial source/drain regions 218*a* and 218*b* from, respectively, the dummy gate structures 84 and the first semiconductor sheets 310 by an appropriate lateral distance so that the epitaxial source/drain regions 218*a* and 218*b* do not short out with subsequently formed gates of the resulting nano-FETs. A material of the epitaxial source/drain regions 218*a* and 218*b* may be selected to exert stress in the respective channel regions, thereby improving performance of the semiconductor structure.

The epitaxial source/drain regions 218*a* and 218*b* in the first conductivity type device region 10C may be formed by masking the second conductivity type device region 10D. Then, the epitaxial source/drain regions 218*a* and 218*b* in the first conductivity type device region 10C is epitaxially grown in the source/drain recesses 94 in the first conductivity type device regions 10C. The epitaxial source/drain regions 218*a* and 218*b* in the first conductivity type device region 10C may include any acceptable material appropriate for n-type devices. For example, the epitaxial source/drain regions 218*a* and 218*b* in the first conductivity type device region 10C may include materials exerting a tensile strain on the channel regions, such as silicon, silicon carbide, phosphorous doped silicon carbide, silicon phosphide, or the like. The epitaxial source/drain regions 218*a* and 218*b* in the first conductivity type device region 10C may be referred to as "n-type source/drain region." The epitaxial source/drain regions 218*a* and 218*b* in the first conductivity type device region 10C may have surfaces raised from respective surfaces of the fins 62 and the first and second semiconductor sheets 310, 210, and may have facets. In some embodiments, the source/drain regions 218*a* and 218*b* of the first conductivity type device region 10C may have a phosphorus concentration within a range from about 2E19/$cm^3$ to about 3E21/$cm^3$.

The epitaxial source/drain regions 218*a* and 218*b* in the second conductivity type device region 10D may be formed by masking the first conductivity type device region 10C. Then, the epitaxial source/drain regions 218*a* and 218*b* in the second conductivity type device region 10D can be epitaxially grown in the source/drain recesses 94 in the second conductivity type device region 10D. The epitaxial source/drain regions 218*a* and 218*b* in the second conductivity type device region 10D may include any acceptable material appropriate for p-type devices. For example, the epitaxial source/drain regions 218*a* and 218*b* in the second conductivity type device region 10D may include materials exerting a compressive strain on the channel regions, such as silicon germanium, boron doped silicon germanium, germanium, germanium tin, or the like. The epitaxial source/drain regions 218*a* and 218*b* in the second conductivity type device region 10D may be referred to as "p-type source/drain region." The epitaxial source/drain regions 218*a* and 218*b* in the second conductivity type device region 10D may have surfaces raised from respective surfaces of the fins 62 and the first and second semiconductor sheets 310, 210, and may have facets. In some embodiments, the source/drain regions 218*a* and 218*b* of the second conductivity type device region 10D may have a boron concentration within a range from about 1E19/$cm^3$ to about 6E20/$cm^3$. In some embodiments, the source/drain regions 218*a* and 218*b* of the second conductivity type device region 10D may have a Ge atomic percentage within a range of about 36% to about 85%.

Figure 16A:
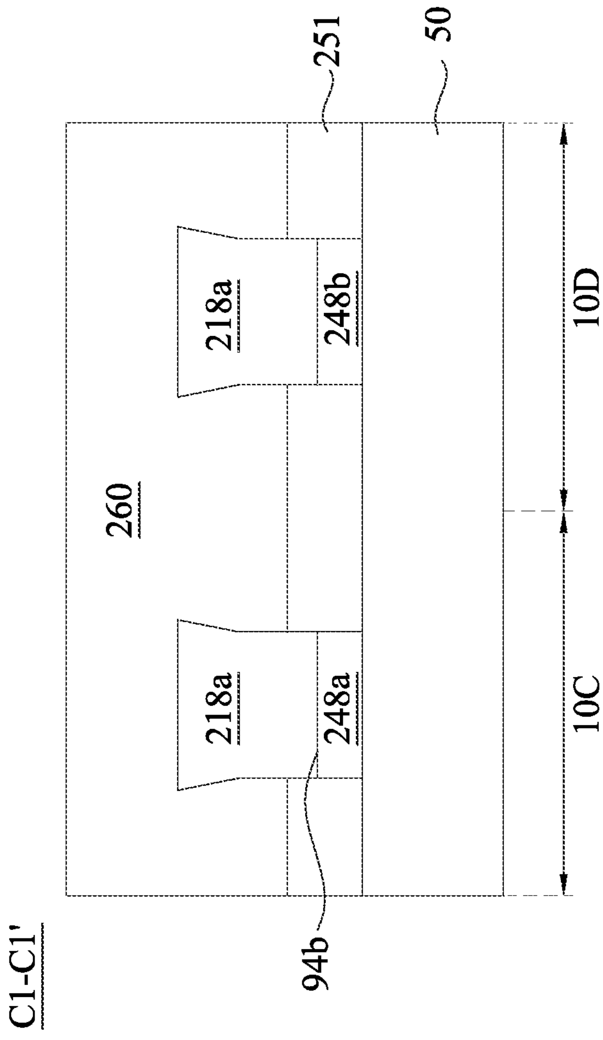
Figure 16B:
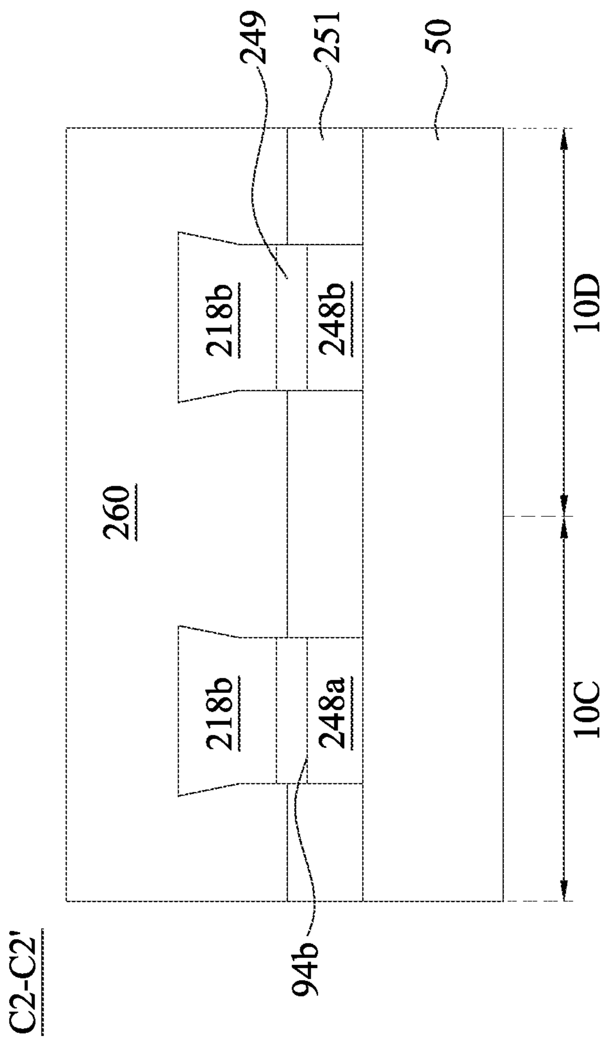
Figure 16C:
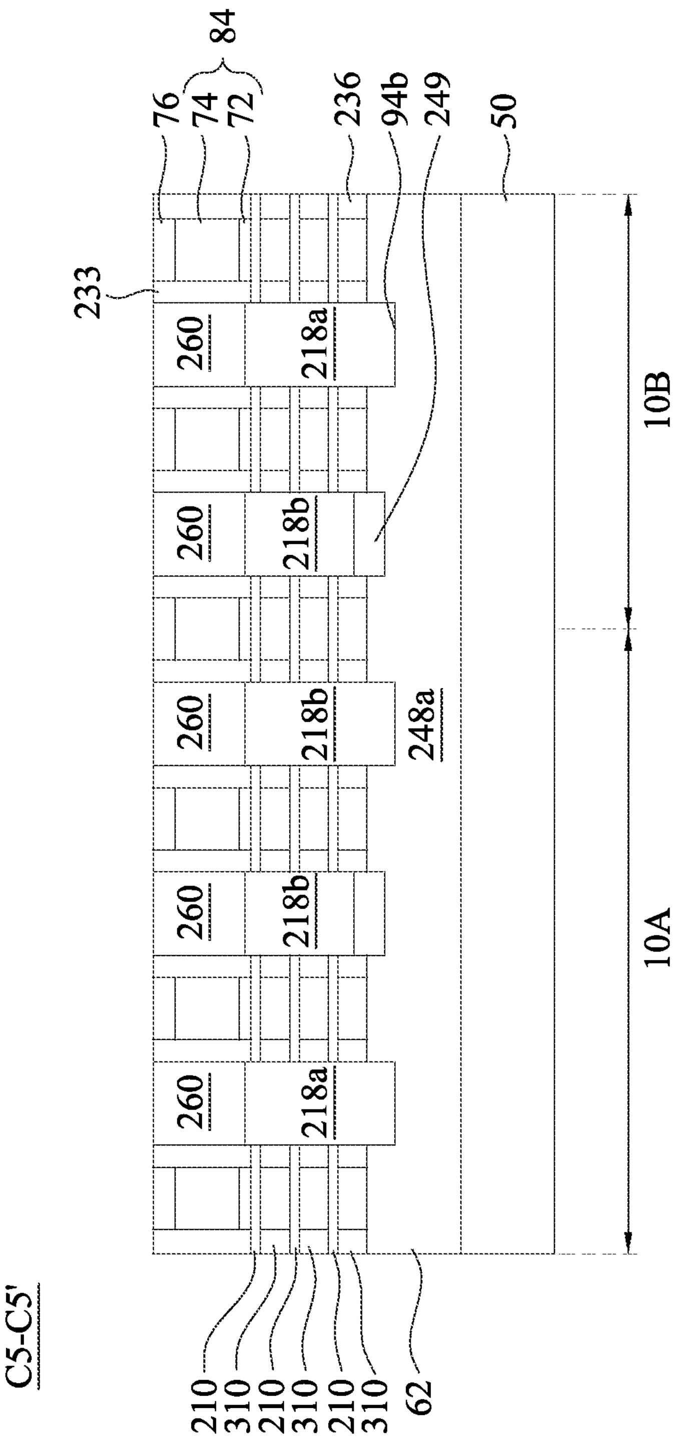

Reference is made to FIGS. 16A, 16B, and 16C. An inter-layer dielectric (ILD) layer 260 is deposited over the epitaxial source/drain regions 218*a* and 218*b*, the gate spacers 233, the dummy gate structures 84. The ILD layer 260 may be formed of a dielectric material, which may be deposited by any suitable method, such as CVD, plasma-enhanced CVD (PECVD), FCVD, or the like. Acceptable dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) is formed between the ILD layer 260 and the epitaxial source/drain regions 218*a* and 218*b*, the gate spacers 233, and the dummy gate structures 844. The CESL may be formed of a dielectric material, such as silicon nitride, silicon oxide, silicon oxynitride, or the like, having a high etching selectivity from the etching of the ILD 260. The CESL may be formed by an any suitable method, such as CVD, ALD, or the like.

Subsequently, a removal process is performed to level the top surfaces of the ILD layer 260 with the top surfaces of the dummy gate structures 84. In some embodiments, a planarization process such as a chemical mechanical polish (CMP), an etch-back process, combinations thereof, or the like may be utilized. The planarization process may also remove the masks 76 on the dummy gate structures 84, and portions of the gate spacers 233 along sidewalls of the masks 76. After the planarization process, the top surfaces of the gate spacers 233, the ILD layer 260, the CESL, and the dummy gate structures 84 are coplanar (within process variations). Accordingly, the top surfaces of the dummy gate structures 84 are exposed through the ILD layer 260. In some embodiments, the masks 76 remain, and the planarization process levels the top surfaces of the ILD layer 260 with the top surfaces of the masks 76.

Figure 17A:
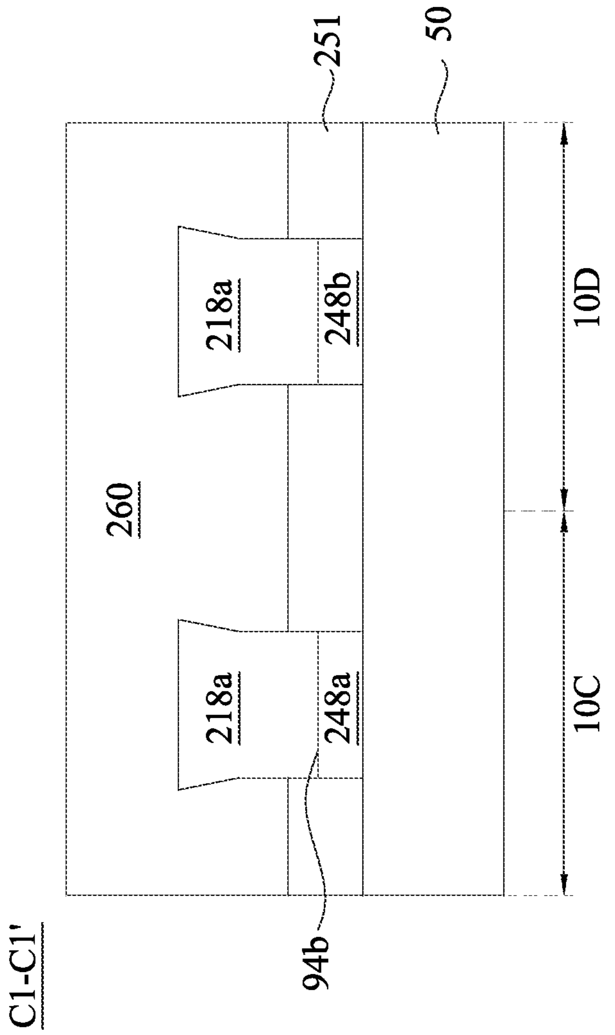
Figure 17B:
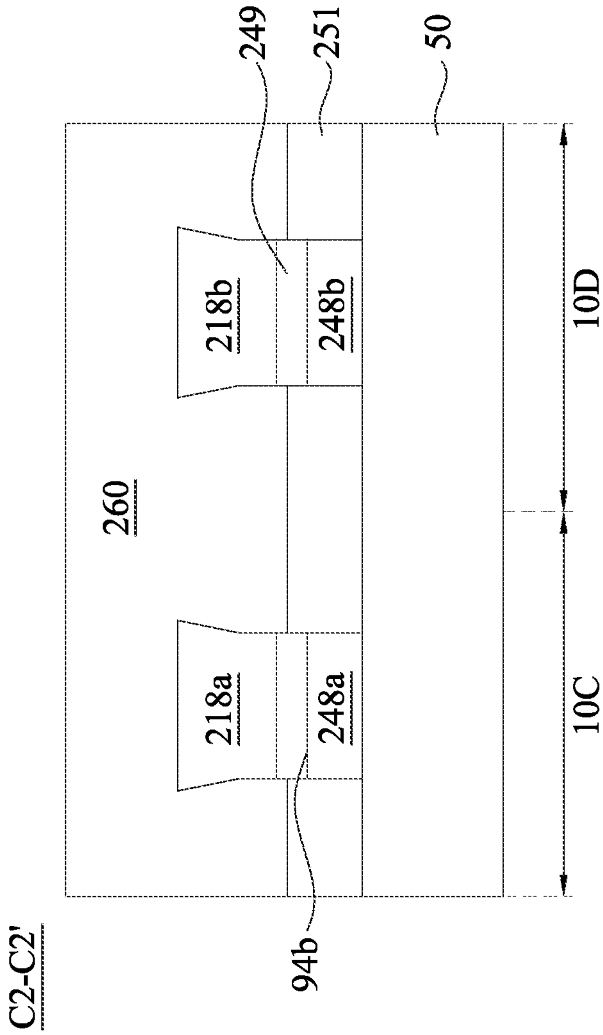
Figure 17C:
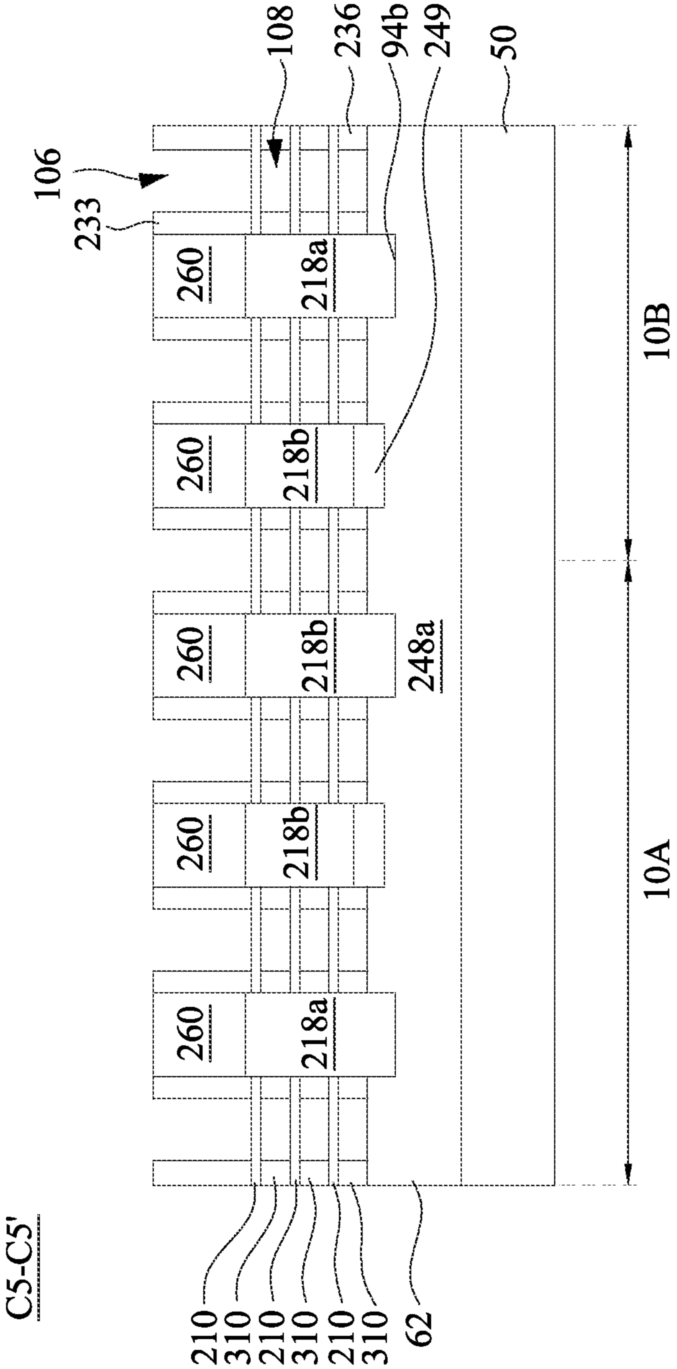

Reference is made to FIGS. 17A, 17B, and 17C. The dummy gate structures 84 are removed in an etching process, so that recesses 106 are formed. Portions of the dummy dielectrics 72 in the recesses 106 are also removed. In some embodiments, the dummy gate structures 84 are removed by an anisotropic dry etch process. For example, the etching process may include a dry etch process using reaction gas(es) that selectively etch the dummy gate structures 84 at a faster rate than the ILD layer 260 or the gate spacers 233. During the removal, the dummy dielectrics 72 may be used as etch stop layers when the dummy gate structures 84 are etched. The dummy dielectrics 72 are then removed. Each recess 106 exposes and/or overlies portions of the channel regions. Portions of the second semiconductor sheets 210 which act as the channel regions are disposed between adjacent pairs of the epitaxial source/drain regions 218*a* and 218*b*.

The remaining portions of the first semiconductor sheets 310 are then removed to expand the recesses 106, such that openings 108 are formed in regions between the second semiconductor sheets 210. The remaining portions of the first semiconductor sheets 310 can be removed by any acceptable etching process that selectively etches the material of the first semiconductor sheets 310 at a faster rate than the material of the second semiconductor sheets 210. The etching may be isotropic. For example, when the first semiconductor sheets 310 are formed of silicon germanium and the second semiconductor sheets 210 are formed of silicon, the etching process may be a wet etch using tetramethylammonium hydroxide (TMAH), ammonium hydroxide ($NH_4OH$), or the like. In some embodiments, a trim process (not separately illustrated) is performed to decrease the thicknesses of the exposed portions of the second semiconductor sheets 210. In some embodiments, the removing of the remaining portions of the first semiconductor sheets 310 can be interchangeably referred to as a channel releasing process. The second semiconductor sheets 210 can be interchangeably referred to as a vertically stacked multiple channels (sheets) and may have a vertically sheet pitch within a range of from about 10 nm to about 30 nm, such as about 10, 12, 14, 16, 18, 20, 22, 23, 24, 26, 28, or 30 nm. In some embodiments, the second semiconductor sheets 210 may have a thickness within a range from about 4 nm to about 10 nm, such as about 4, 5, 6, 7, 8, 9, or 10 nm. In some embodiments, the vertically sheet pitch of the between adjacent two of the second semiconductor sheets 210 may be within a range from about 6 to about 20 nm, such as about 6, 7, 8, 9, 10, 11, 12, 13, 14, 15, 16, 17, 18, 19, or 20 nm.

Figure 18A:
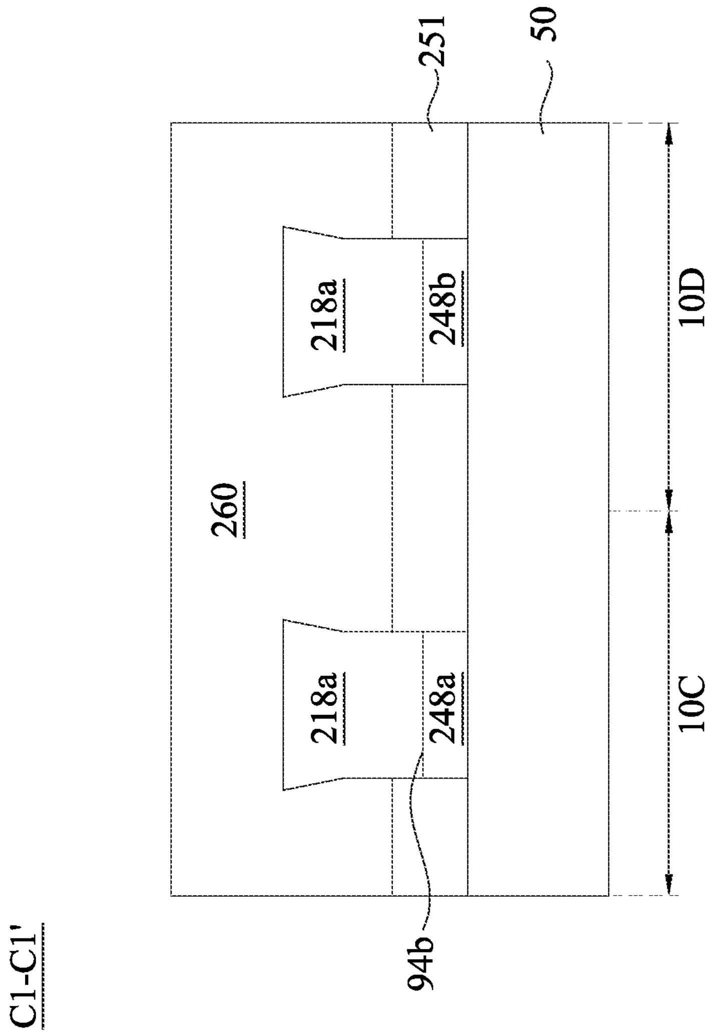
Figure 18B:
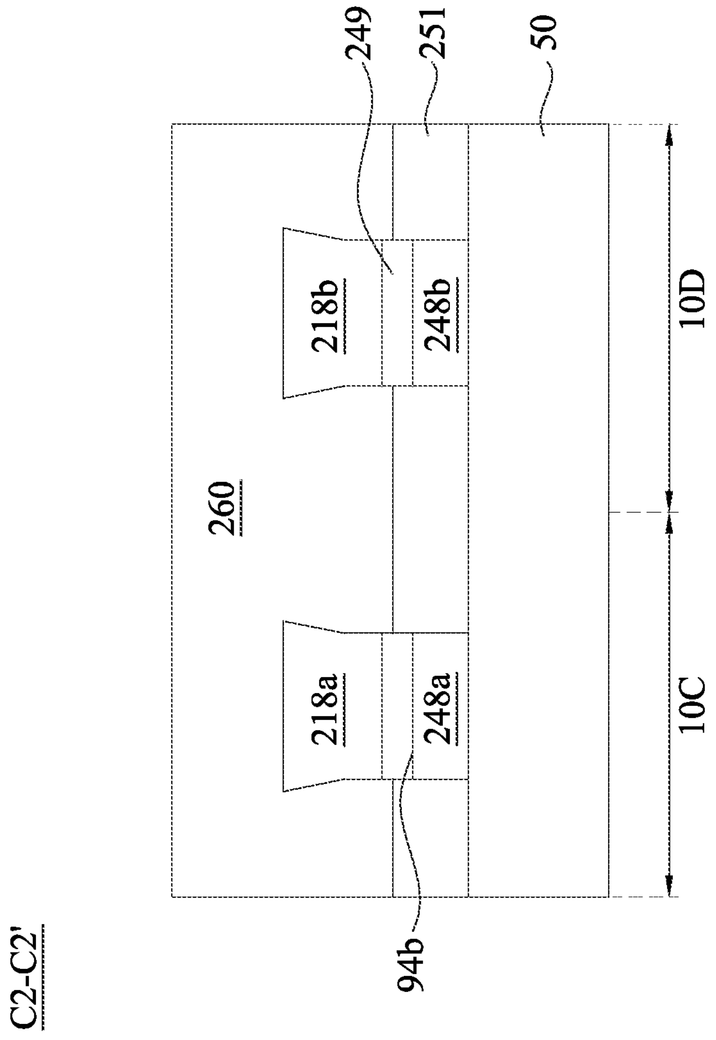
Figure 18C:
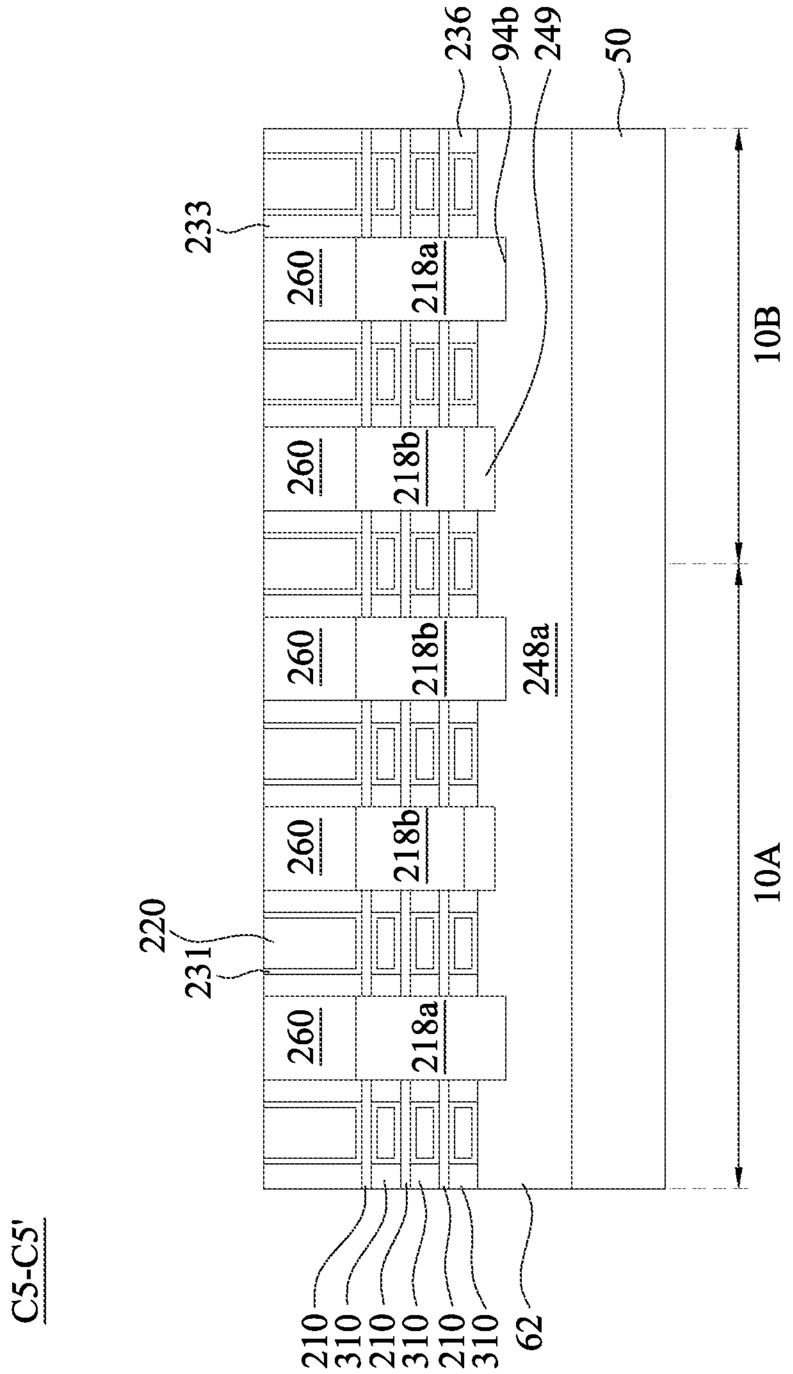

Reference is made to FIGS. 18A, 18B, and 18C. Gate structures are formed to wrap around the second semiconductor sheets 210. A gate dielectric layer 231 is formed in the recesses 106. Gate electrode layers 220 are formed on the gate dielectric layer 231. The gate dielectric layer 231 and the gate electrode layers 220 are layers for replacement gates, and each wrap around all (e.g., four) sides of the second semiconductor sheet 210. In some embodiments, the gate structure can be interchangeably referred to as a gate strip or a gate pattern.

The gate dielectric layer 231 is disposed on the sidewalls and/or the top surfaces of the fins 62; on the top surfaces, the sidewalls, and the bottom surfaces of the second semiconductor sheets 210; and on the sidewalls of the gate spacers 233. The gate dielectric layer 231 may include an oxide such as silicon oxide or a metal oxide, a silicate such as a metal silicate, combinations thereof, multi-layers thereof, or the like. The gate dielectric layer 231 may include a dielectric material having a k-value greater than about 7.0, such as a metal oxide or a silicate of hafnium, aluminum, zirconium, lanthanum, manganese, barium, titanium, lead, and combinations thereof. Although a single-layered gate dielectric layer 231 is illustrated in FIGS. 15B and 15C, as will be subsequently described in greater detail, the gate dielectric layer 231 may include any number of interfacial layers and any number of main layers.

The gate electrode layers 220 may include a metal-containing material such as titanium nitride, titanium oxide, tungsten, cobalt, ruthenium, aluminum, combinations thereof, multi-layers thereof, or the like. Although a single-layered gate electrode layers 220 is illustrated in FIGS. 15B and 15C, as will be subsequently described in greater detail, the gate electrode layer 220 may include any number of work function tuning layers, any number of barrier layers, any number of glue layers, and a fill material. In some embodiments, the gate electrode layers 220 may be made of a material selected from a group including TiN, TaN, TiAl, TiAlN, TaAl, TaAlN, TaAlC, TaCN, WNC, Co, Ni, Pt, W, or combinations thereof.

The formation of the gate dielectric layers 231 in the first conductivity type device region 10C and the second conductivity type device region 10D may form simultaneously such that the gate dielectric layers 231 in each region are formed of the same materials, and the formation of the gate electrode layers 220 may form simultaneously such that the gate electrode layers 220 in each region are formed of the same materials. In some embodiments, the gate dielectric layers 231 in each region may be formed by distinct processes, such that the gate dielectric layers 231 may be different materials and/or have a different number of layers, and/or the gate electrode layers 220 in each region may be formed by distinct processes, such that the gate electrode layers 220 may be different materials and/or have a different number of layers. Various masking steps may be used to mask and expose appropriate regions when using distinct processes. In the following description, at least portions of the gate electrode layers 220 in the first conductivity type device region 10C and the gate electrode layers 220 in the second conductivity type device region 10D are formed separately.

Subsequently, a removal process is performed to remove the excess portions of the materials of the gate dielectric layer 231 and the gate electrode layers 220, which excess portions are over the top surfaces of the ILD layer 260 and the gate spacers 233, thereby forming gate dielectric layer 231 and gate electrode layers 220. In some embodiments, a planarization process such as a chemical mechanical polish (CMP), an etch-back process, combinations thereof, or the like may be utilized. The gate dielectric layer 231, when planarized, has portions left in the recesses 106 (thus forming the gate dielectric layer 231). The gate electrode layers 220, when planarized, have portions left in the recesses 106 (thus forming the gate electrode layers 220). The top surfaces of the gate spacers 233; the CESL (not shown); the ILD layer 260; the gate dielectric layer 231, and the gate electrodes are coplanar (within process variations). The gate dielectric layer 231 and the gate electrode layers 220 form replacement gates of the resulting nano-FETs. Each respective pair of a gate dielectric layer 231 and a gate electrode layer 220 may be collectively referred to as a gate structure, a gate pattern, a gate strip, or a functional gate structure. The gate structures each extend along top surfaces, sidewalls, and bottom surfaces of a channel region of the second semiconductor sheet 210. In some embodiments, the gate electrode layers 220 each have a gate length in a range from about 6 nm to about 20 nm.

Figure 19A:
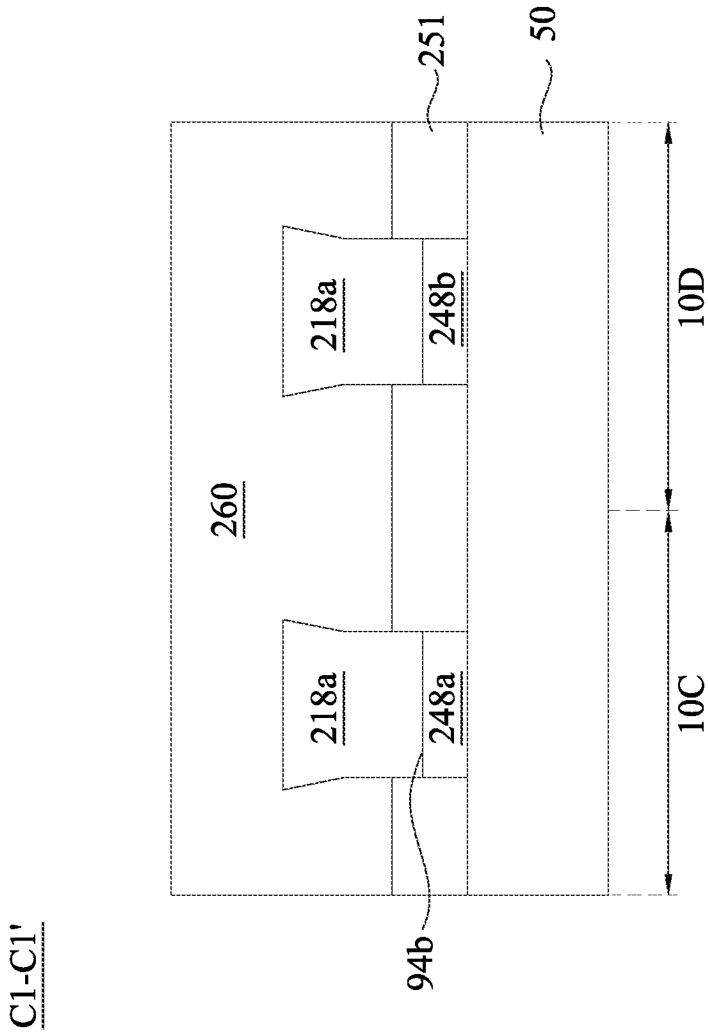
Figure 19B:
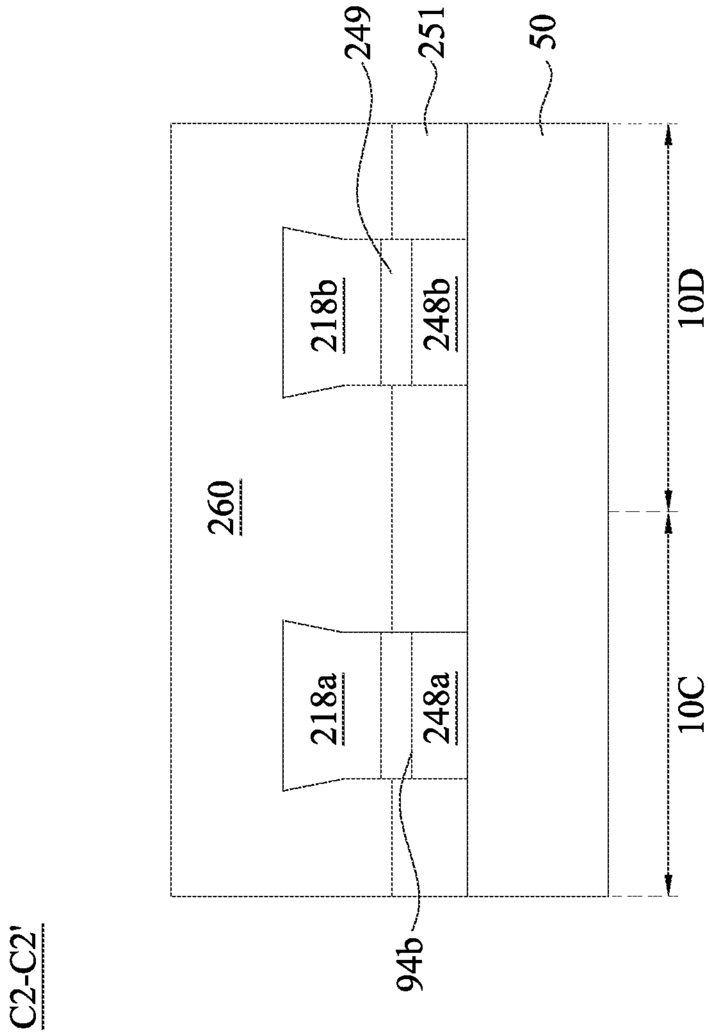
Figure 19C:
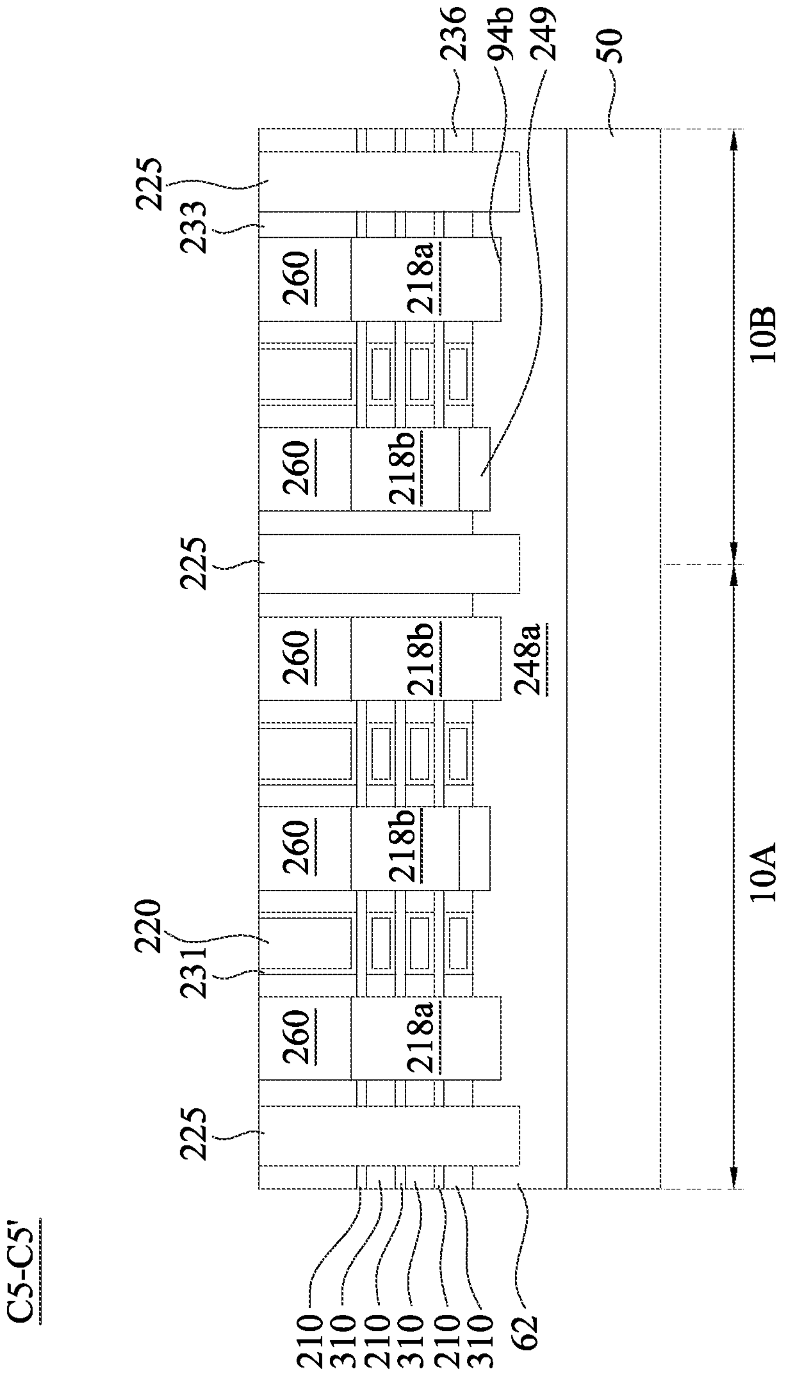

Reference is made to FIGS. 19A, 19B, and 19C. The gate electrode layers 220 and the gate dielectric layer 231 on the boundary of the first and second logic circuit regions 10A and 10B are removed to form isolation regions separating the source/drain regions of neighboring semiconductor devices from each other and separate different semiconductor devices. The isolation region may be formed by using an etching process. In the etching process, the gate electrode layers 220 and the gate dielectric layer 231 on the boundary of the first and second logic circuit regions 10A and 10B are etched anisotropically, until the underlying fins 62 are exposed. The fins 62 are then etched, and the etching continues down into the underlying doped semiconductive layer 248*a*/248*b* and deeper than the recess 94. In some embodiments, the etching may be stopped on the STI structures 251. Subsequently, a dielectric material is filled in the isolation region (i.e., spaces originally occupied by the gate electrode layers 220 and the gate dielectric layer 231 warping the gate electrode layers 220) to form dielectric-base gates 225. As shown in FIGS. 2A and 2B, the dielectric-base gates 225 extend in the Y-direction and being dummy gates. The gate electrodes 220 are arranged between the dielectric-base gates 225. The material of the dielectric-base gates 225 is different from that of the gate electrodes 220. In some embodiments, the dielectric-base gates 225 can be made of silicon oxide ($SiO_x$), silicon nitride ($Si_xN_y$), silicon oxynitride (SiON), dielectric material(s), other suitable material, or a combination thereof. In some embodiments, the dielectric-base gates 225 can be formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

Figure 20A:
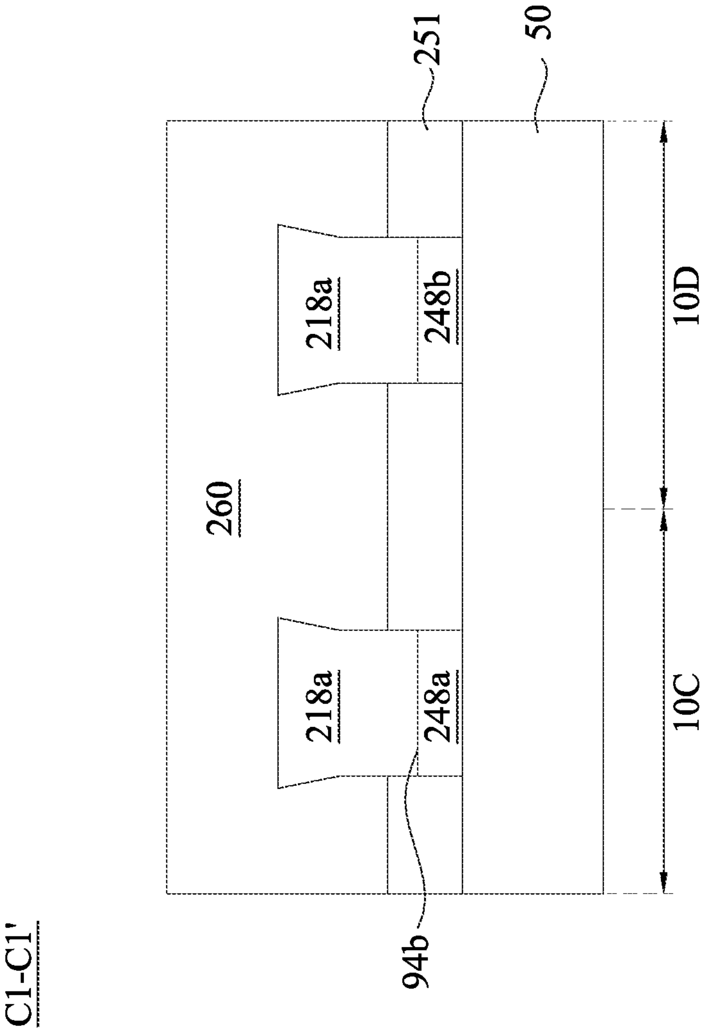
Figure 20B:
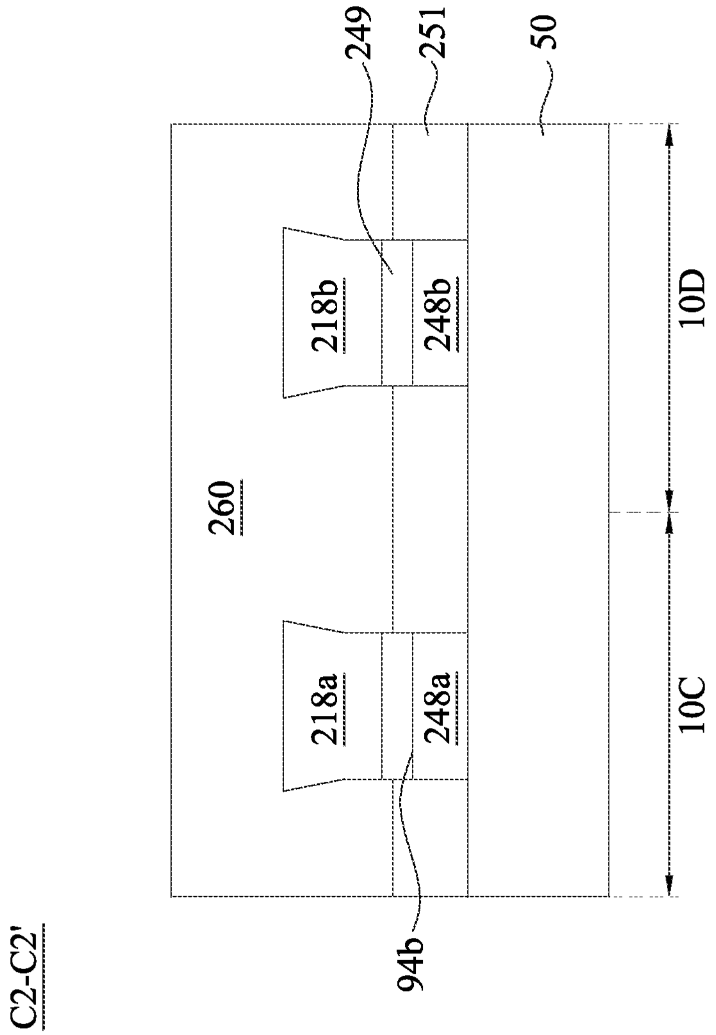
Figure 20C:
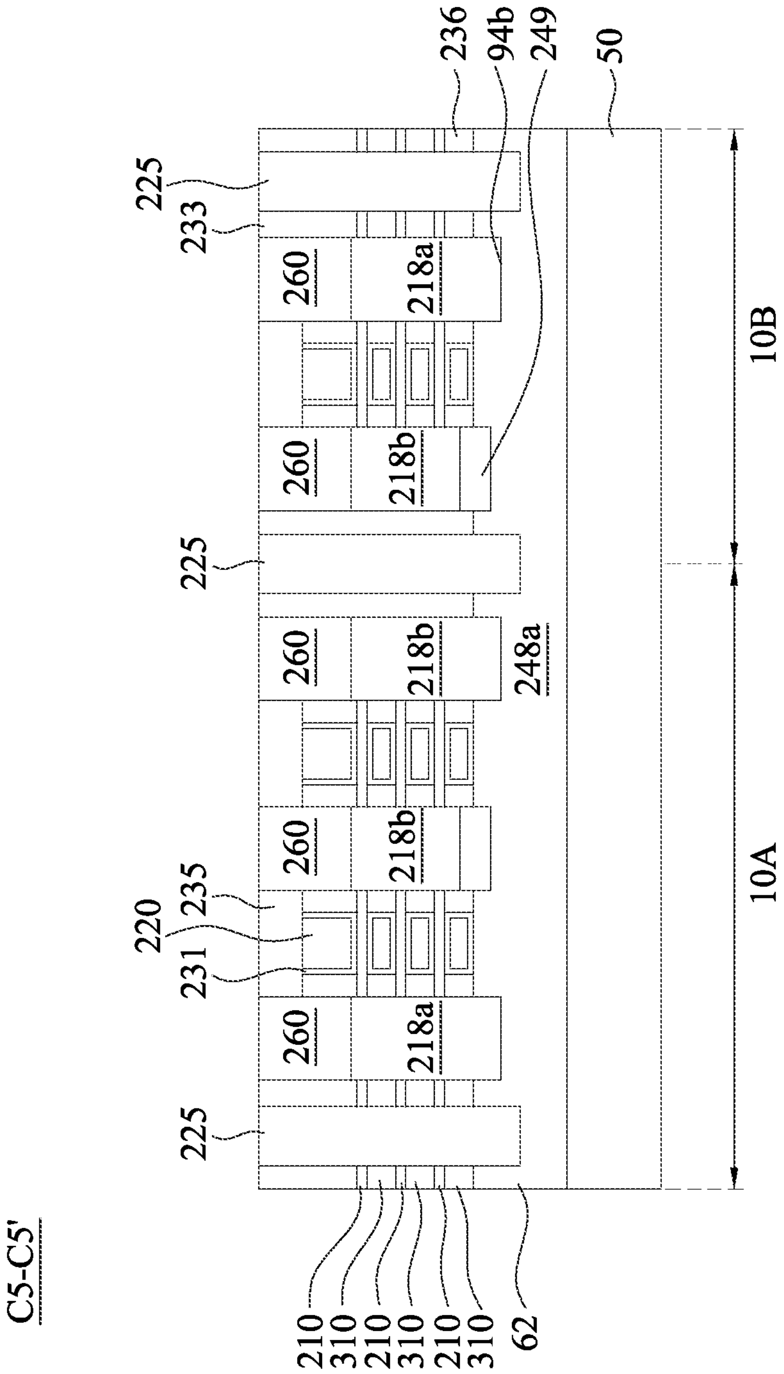

Reference is made to FIGS. 20A, 20B, and 20C. An etch back process is performed on the gate electrode layers 220 and the gate dielectric layer 231 to scale down the gate electrode layers 220 and the gate dielectric layer 231. The etch back process may include a bias plasma etching step. The bias plasma etching step may be performed to remove portions of the gate electrode layers 220 and the gate dielectric layer 231. Portions of the gate trenches may reappear with shallower depth. Top surfaces of the gate electrode layers 220 and the gate dielectric layer 231 may be no longer level with the ILD layer 260. Sidewalls of the gate spacers 233 are then exposed from the gate electrode layers 220 and the gate dielectric layer 231. In some embodiments, the bias plasma etching step may use a gas mixture of $Cl_2$, $O_2$, $BCl_3$, and Ar with a bias in a range from about 25V to about 1200V.

Subsequently, a hard mask layer 235 is formed over the gate electrode layers 220 and the gate dielectric layer 231 using, for example, a deposition process to deposit a dielectric material over the substrate 50, followed by a CMP process to remove excess dielectric material above the spacers 233 and the ILD layer 260. In some embodiments, source/drain contacts 240 and power supply voltage contacts 244 (see FIGS. 19A and 19C) formed subsequently are formed by a self-aligned contact process using the hard mask layer 235 as a contact etch protection layer. In some embodiments, the hard mask layer 235 may have a thickness in a range from about 2 nm to about 60 nm. In some embodiments, the hard mask layer 235 may be made of a nitride-based material, such as $Si_3N_4$, SiON, or a carbon-based material, such as SiC, SiOC, SiOCN, or combinations thereof. In some embodiments, the hard mask layer 235 may include $SiO_x$, SiBN, SiCBN, other suitable dielectric materials, or combinations thereof. In some embodiments, the hard mask layer 235 may include a metal oxide, such as be hafnium oxide ($HfO_2$), zirconium oxide ($ZrO_2$), lanthanum oxide ($La_2O_3$), yttrium oxide ($Y_2O_3$), aluminum oxide ($Al_2O_3$), tantalum oxide ($Ta_2O_5$), titanium oxide ($TiO_2$), another applicable material, or combinations thereof. The hard mask layer 235 has different etch selectivity than the spacers 233 and/or the ILD layer 260, so as to selective etch back the hard mask layer 235. By way of example, if the hard mask layer 235 is made of silicon nitride, the spacers 233 and/or the ILD layer 260 may be made of a dielectric material different from silicon nitride. If the hard mask layer 235 is made of silicon carbide (SiC), the spacers 233 and/or the ILD layer 260 may be made of a dielectric material different from silicon carbide. Therefore, the hard mask layer 235 can be used to define self-aligned gate contact region and thus referred to as a self-aligned contact (SAC) structure or a SAC layer. In some embodiments, the hard mask layer 235 may have a thickness in a range from about 2 nm to about 60 nm, such as about 2, 5, 10, 15, 20, 25, 30, 35, 40, 45, 50, 55, or 60 nm. In some embodiments, the hard mask layer 235 can be interchangeably referred to a gate-top dielectric layer.

Figure 21:
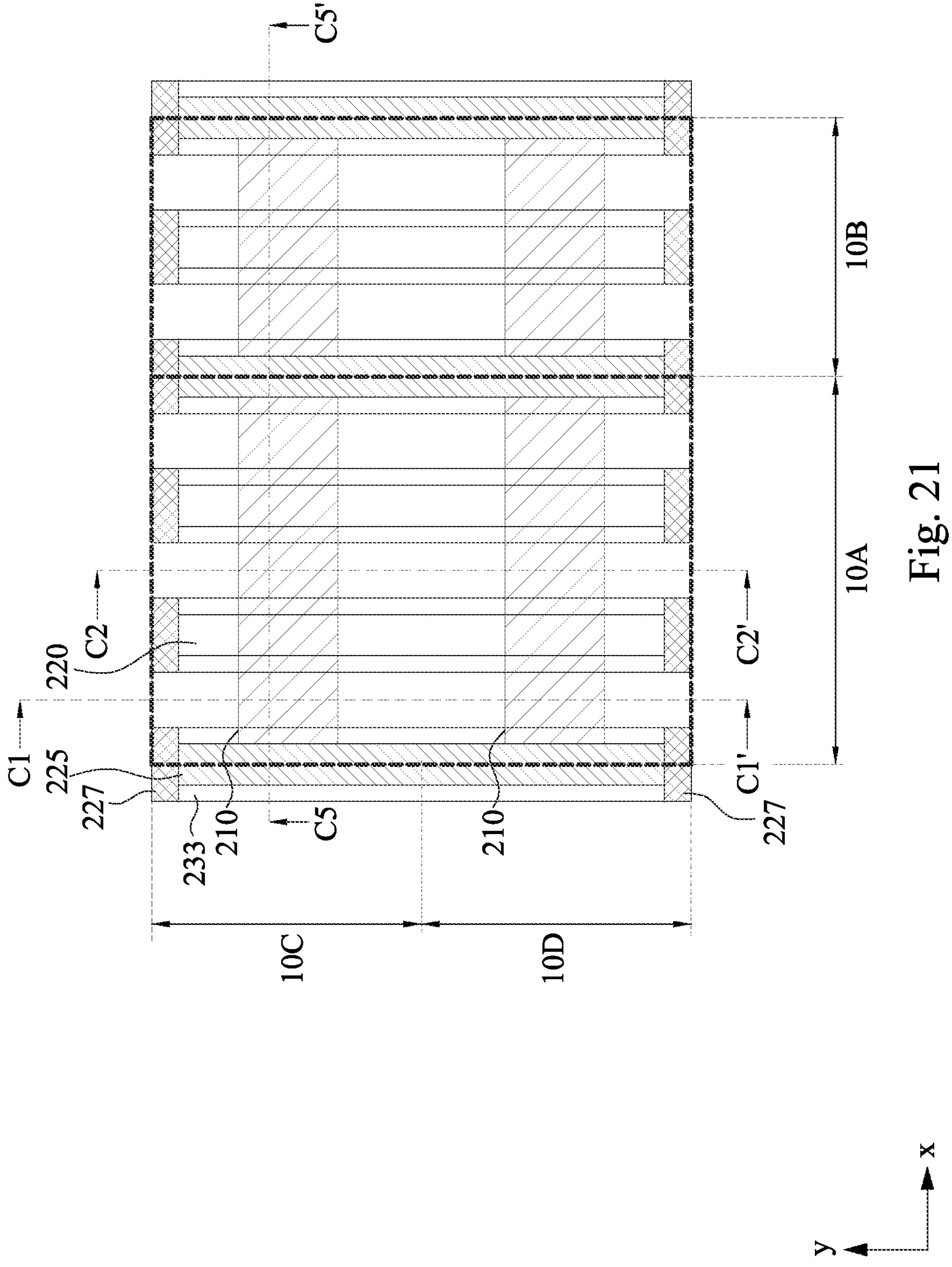

Reference is made to FIG. 21. The dielectric regions 227 are formed on opposite ends of the gate electrode layers 220. In some embodiments, each dielectric region 227 is a gate-cut structure for the gate structure, and the gate-cut structure is formed by a cut metal gate (CMG) process. In some embodiments, the dielectric region 227 can be interchangeably referred to a gate end dielectric. Specifically, the opposite ends the gate electrode layers 220 are removed to form gate trenches. The ends of the gate electrode layers 220 may be removed by dry etching, wet etching, or a combination of dry and wet etching. For example, a wet etching process may include exposure to a hydroxide containing solution (e.g., ammonium hydroxide), deionized water, and/or other suitable etchant solutions. Subsequently, a dielectric material is deposited into the gate trenches, followed by a planarization process to remove excess portions of the dielectric material. The remaining dielectric material forms the dielectric regions 227. By way of example but not limiting the present disclosure, the dielectric region 227 can have a vertical dimension D4 (see FIG. 3C) in the STI structure 251 about 5 nm to about 60 nm, such as about 6, 10, 15, 20, 25, 30, 35, 40, 45, 50, 55, or 60 nm.

In some embodiments, the deposition of the dielectric material of the dielectric regions 227 is performed using a conformal deposition process such as ALD, which may be PEALD, thermal ALD, or the like. The dielectric material may be formed of or comprise $SiO_2$. SiOC, SiOCN, or the like, or combinations thereof. In some embodiments, the dielectric region 227 may be made of a nitride-based material, such as $Si_3N_4$, or a carbon-based material, such as SiOCN, or combinations thereof. In some embodiments, the dielectric region 227 may be made of a material having a dielectric constant greater than about 9 (e.g., high dielectric constant (high-k) material). For example, the dielectric region 227 may be made of a high dielectric constant (high-k) material, such as be hafnium oxide ($HfO_2$), zirconium oxide ($ZrO_2$), lanthanum oxide ($La_2O_3$), yttrium oxide ($Y_2O_3$), aluminum oxide ($Al_2O_3$), tantalum oxide ($Ta_2O_5$), titanium oxide ($TiO_2$), another applicable material, or combinations thereof. The dielectric regions 227 may be formed of a homogenous material, or may have a composite structure including more than one layer. The dielectric regions 227 may include dielectric liners, which may be formed of, for example, silicon oxide. In some embodiments, the dielectric material of the dielectric regions 227 comprises SiN, and the deposition is performed using process gases including dichlorosilane and ammonia. Hydrogen ($H_2$) may or may not be added.

Figure 22A:
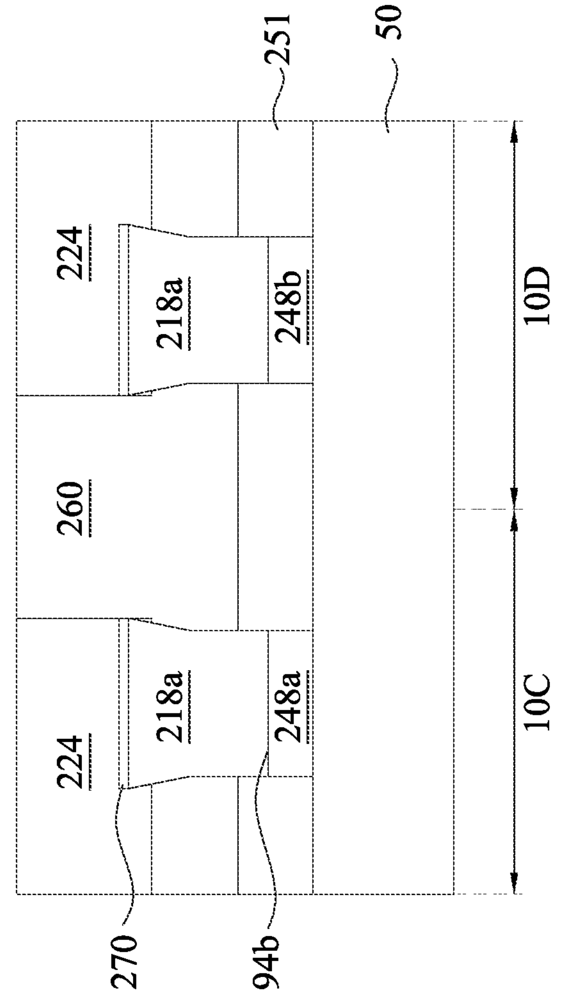
Figure 22B:
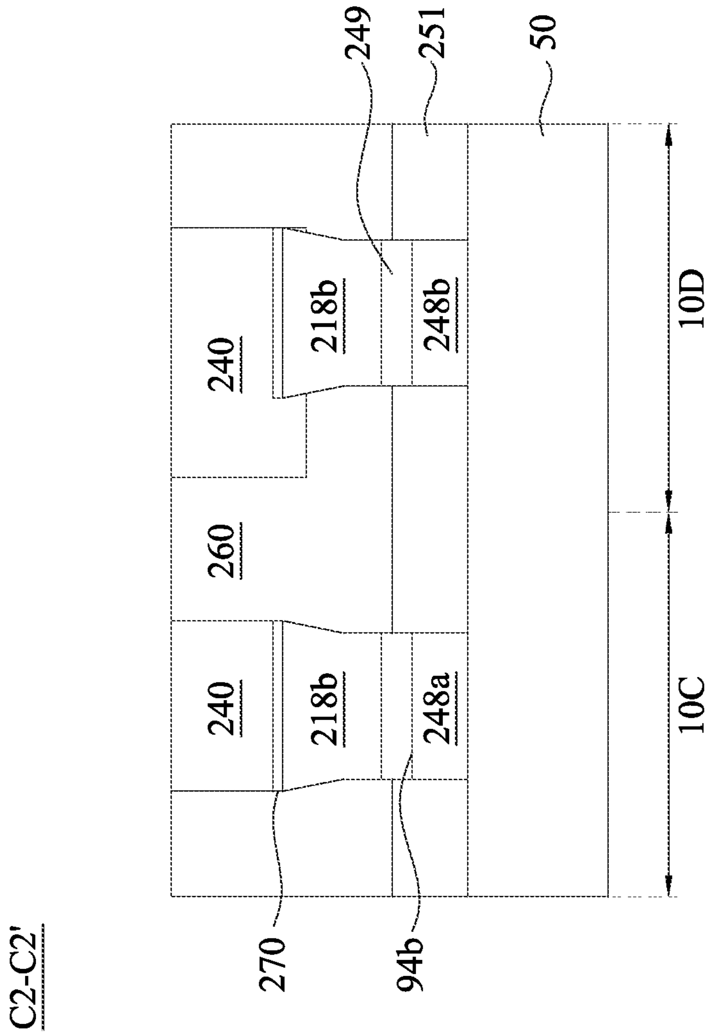
Figure 22C:
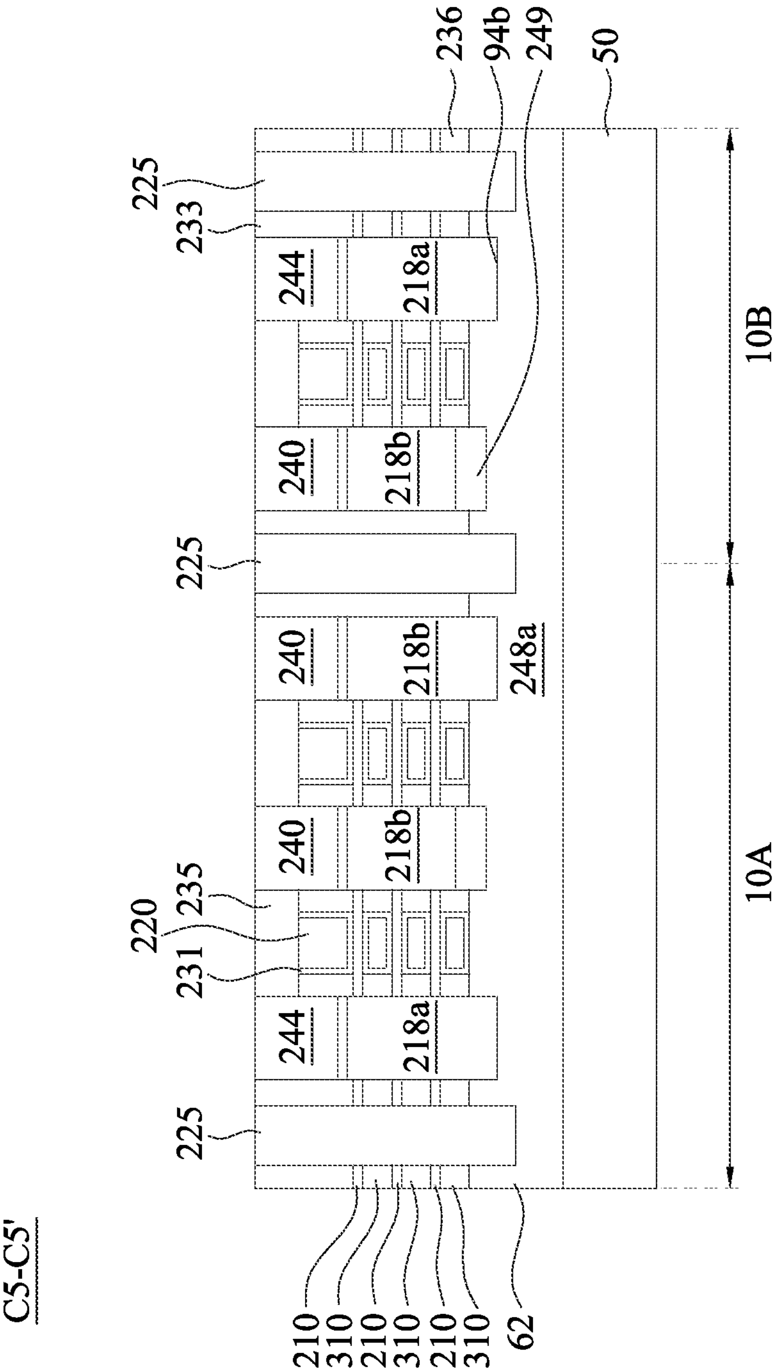

Reference is made to FIGS. 22A, 22B, and 22C. Source/drain contacts 240 and power supply voltage contacts 244 are formed in the ILD layer 260 and on the source/drain regions 218*a* and 218*b*. In some embodiments, the power supply voltage contacts 244 can be interchangeably referred to source/drain contacts. In some embodiments, the source/drain silicide regions 270 can be formed between the source/drain contacts 240 and the source/drain regions 218*b* and between the power supply voltage contacts 244 and the source/drain regions 218*a*. In some embodiments, materials of the source/drain contacts 240 and the power supply voltage contacts 244 may include Cu, Co, Ru, Pt, Al, W, Ti, TaN, TiN, Molybdenum (Mo), Ruthenium (Ru), Iridium (Ir), rhodium (Rh), or any combinations thereof.

Reference is made to FIGS. 23A, 23B, 23C, and 23D. An ILD layer 262 is deposited over the ILD layer 260. Subsequently, source/drain vias 242 are formed in the ILD layer 262 and land on the source/drain contacts 240, and the conductive vias 246 are formed in the ILD layer 262 and land on the power supply voltage contact 244. In some embodiments, the conductive vias 246 can be interchangeably referred to source/drain vias. Gate vias 250 are formed to pass through the ILD layer 262 and the hard mask layer 235 and land on the gate electrode layers 220. The source/drain vias 242, conductive vias 246, and the gate vias 250 may include a metal-containing material such as titanium nitride, titanium oxide, tungsten, cobalt, ruthenium, aluminum, copper, combinations thereof, multi-layers thereof, or the like. The ILD layer 262 may be made of an oxide, such as silicon oxide, a nitride, such as silicon nitride, the like, or a combination thereof, which may be formed by a chemical vapor deposition (CVD) process, such as high density plasma CVD (HDP-CVD), flowable chemical vapor deposition (FCVD), the like, or a combination thereof.

Subsequently, a front-side interconnect structure is formed over the front-side gate vias 250, the front-side source/drain vias 242, and the front-side conductive vias 246. The interconnect structure includes a plurality of metallization layers with a plurality of metallization vias or interconnects. Other embodiments may contain more or fewer metallization layers and corresponding more or fewer number of vias. The metal line illustrated here just for an example, and the metal line may be otherwise oriented (rotated 90 degrees or at other orientations). The front-side interconnect structure may include metal lines F-M1 and power supply voltage lines F-M1-Vdd, F-M1-Vss formed in a first front-side metallization layer. The metal lines F-M1 and the power supply voltage lines F-M1-Vdd, F-M1-Vss are in an IMD (inter-metal dielectric) layer 264. The front-side metal layers F-M1 are electrically connected to the gate electrode layers 220 through the gate vias 250 and electrically connected to the source/drain regions 218*a* and 218*b* through the source/drain vias 242 and the source/drain contacts 240. The power supply voltage lines F-M1-Vdd, F-M1-Vss are electrically connected to the source/drain regions 218*a* and 218*b* through the conductive vias 246 and the power supply voltage contact 244. In some embodiments, materials of the metal lines F-M1, the power supply voltage lines F-M1-Vdd, F-M1-Vss, and/or the gate via 250 may include Cu, Co, Ru, Pt, Al, W, Ti, TaN, TiN, Molybdenum (Mo), Ruthenium (Ru), Iridium (Ir), rhodium (Rh), or any combinations thereof. In some embodiments, the IMD layer 264 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like. Subsequently, a protection layer (not shown) can be formed over the front-side interconnect structure. The protection layer can be a single layer, some embodiments may utilize multiple dielectric layers. In some embodiments, the protection layer can be a poly layer, or a silicon substrate.

Figure 23A:
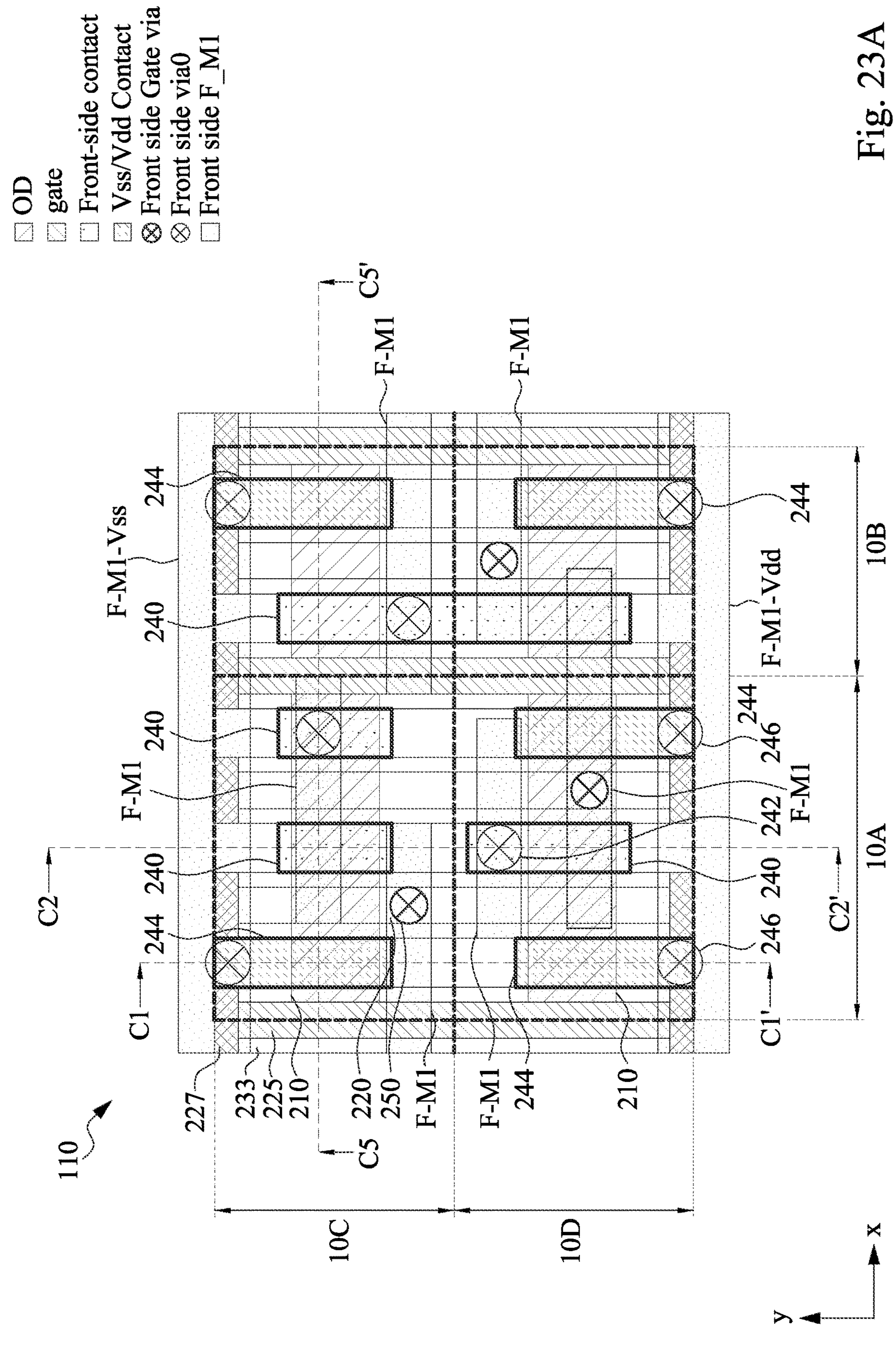
Figure 23B:
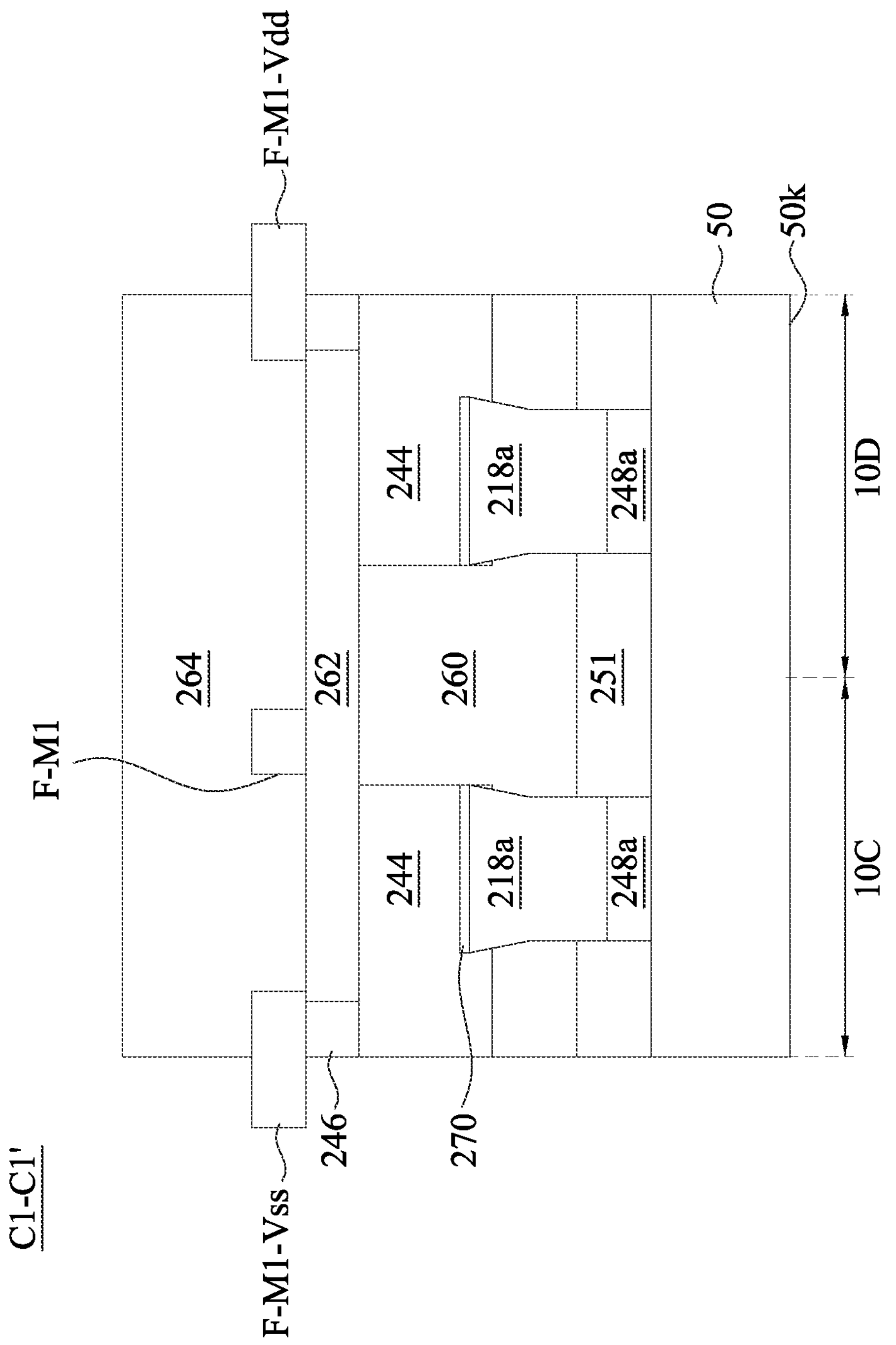
Figure 23C:
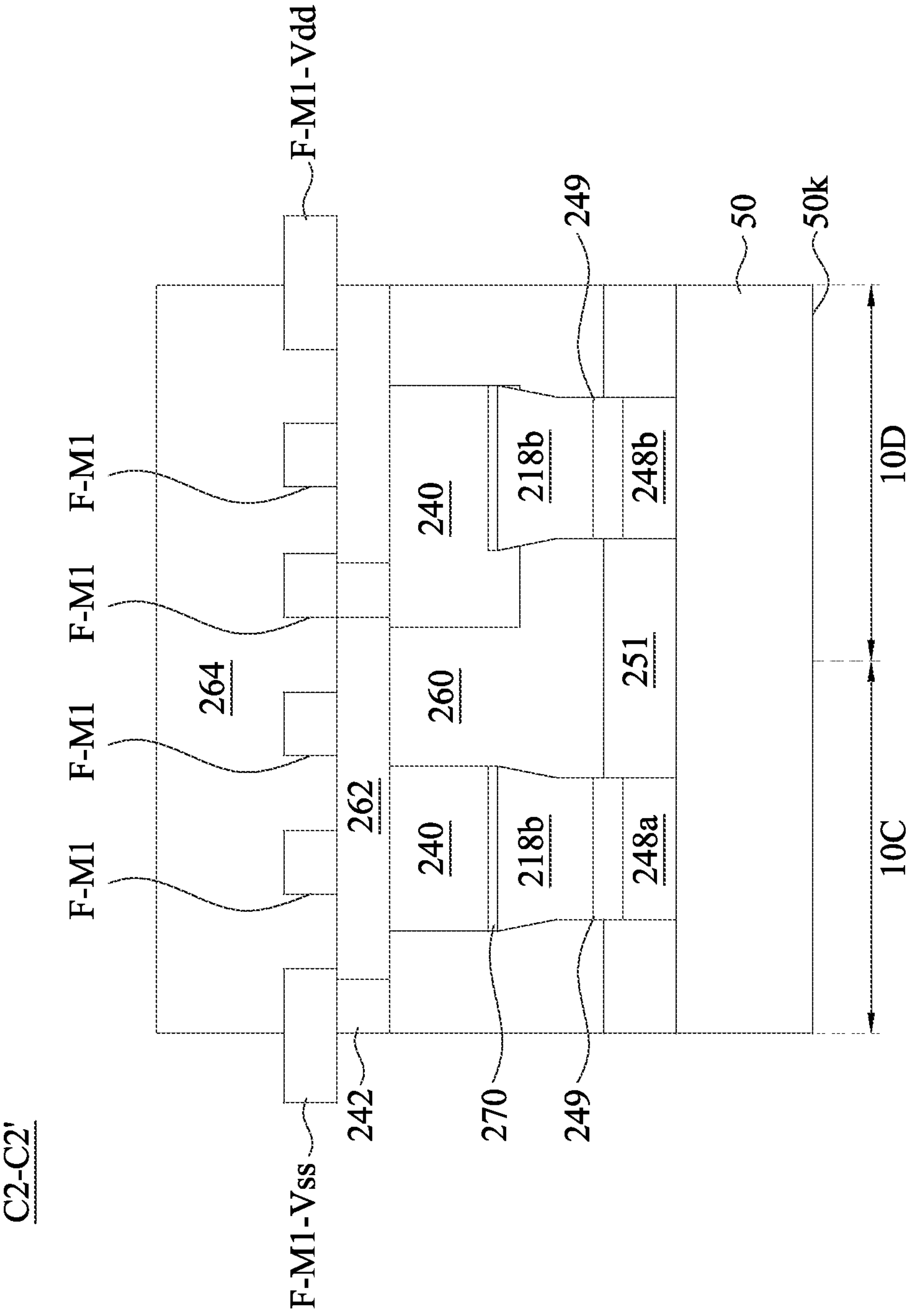
Figure 23D:
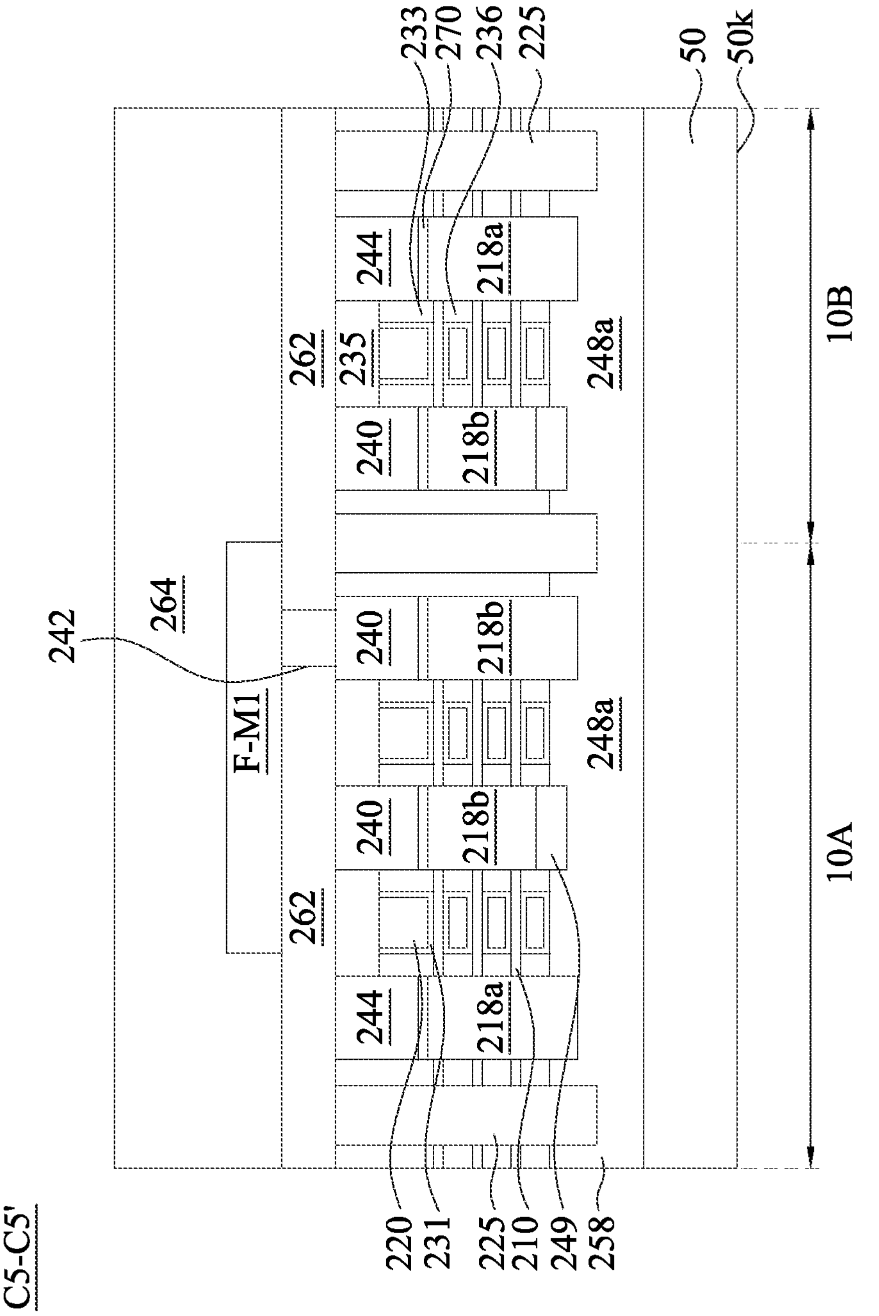
Figure 24A:
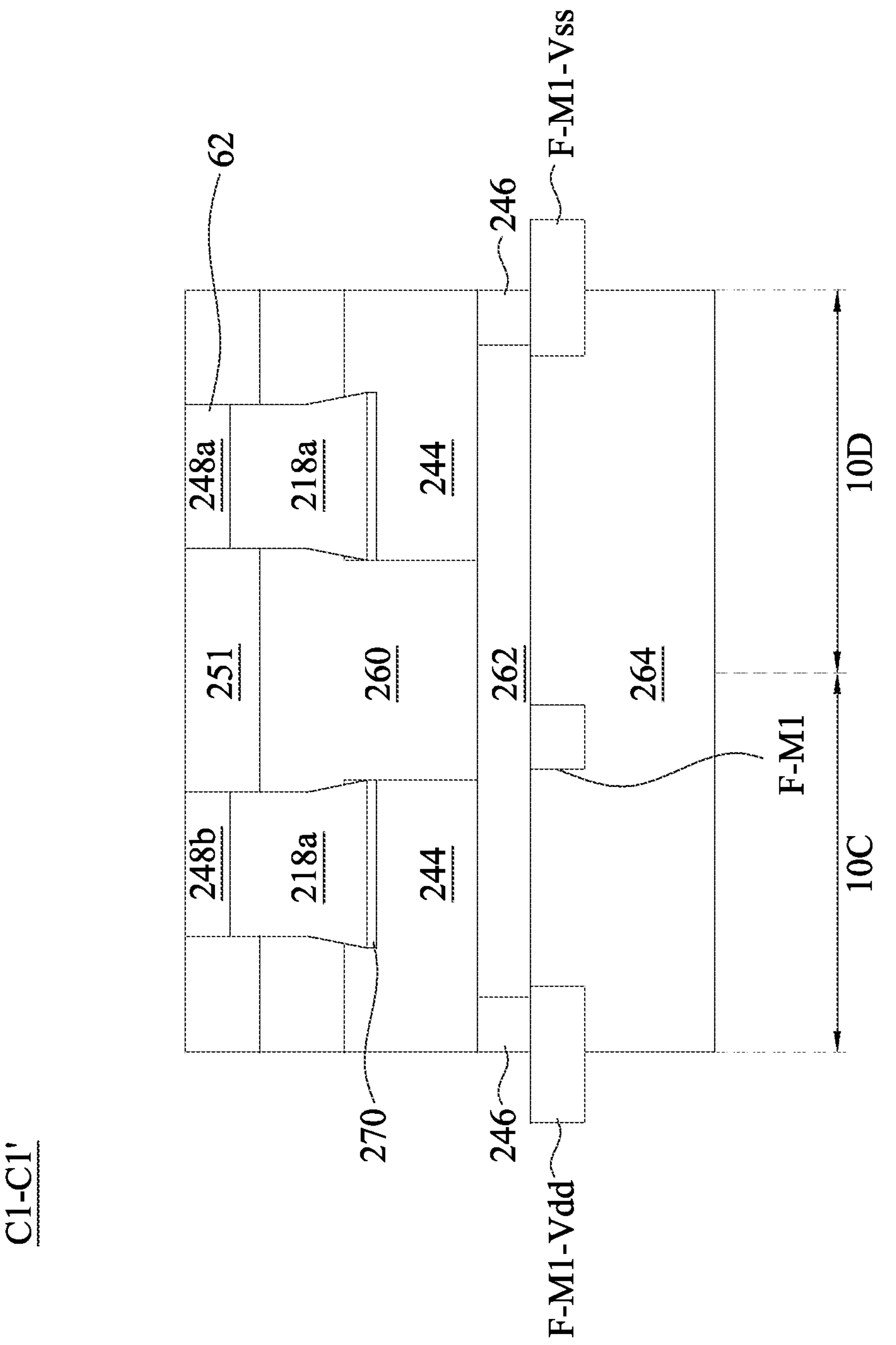
Figure 24B:
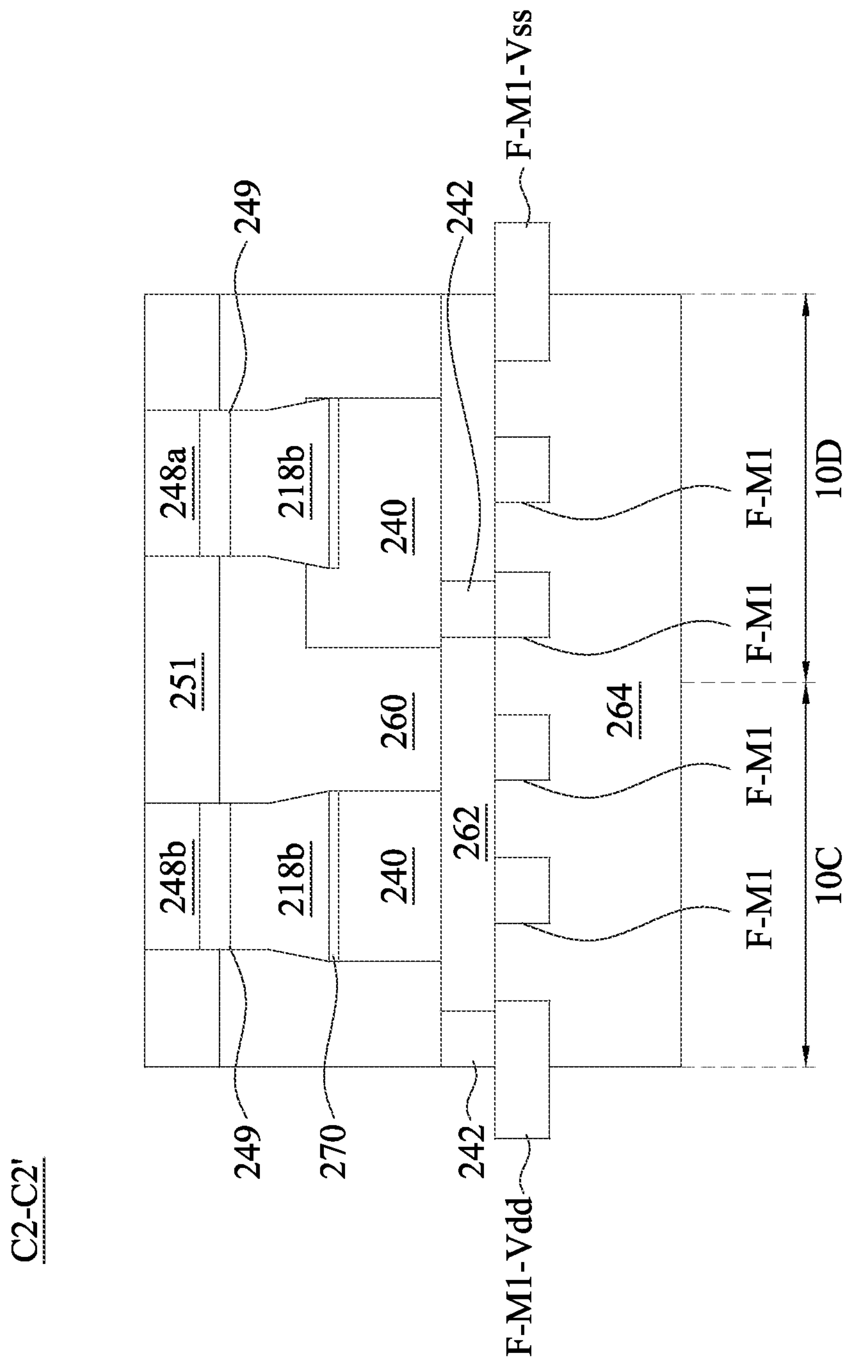
Figure 24C:
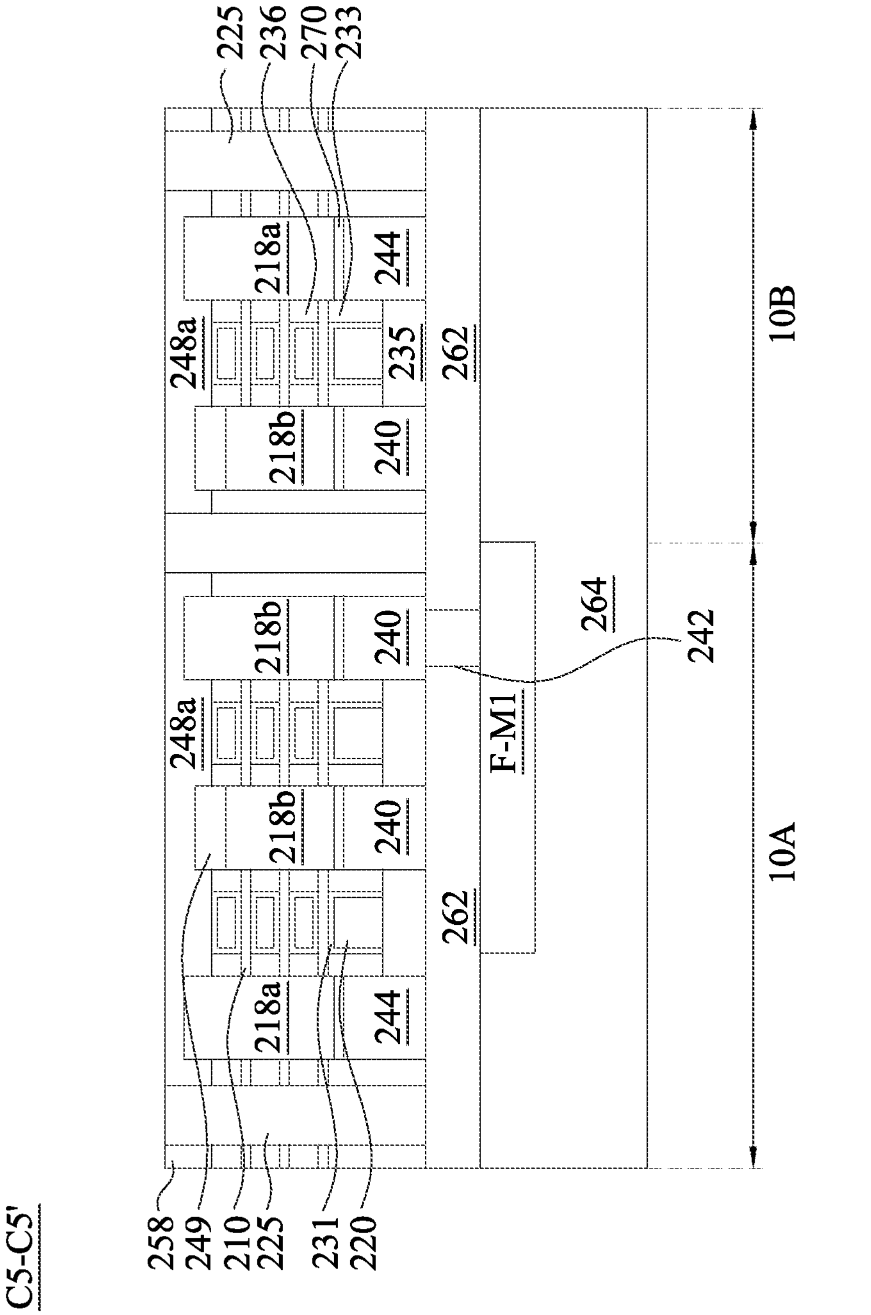
Figure 25A:
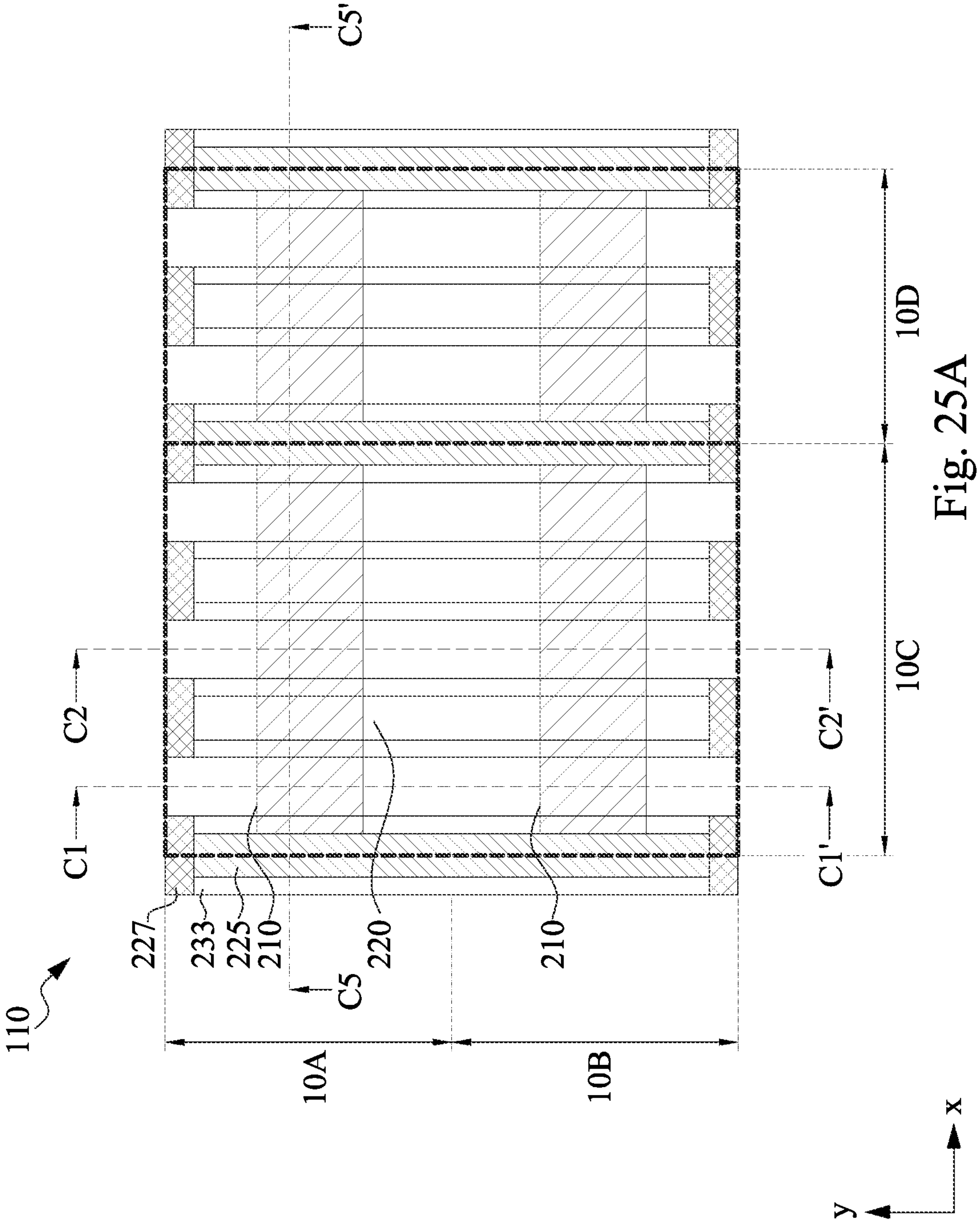
FIGS. 25A-25D illustrate cross-sectional views of an intermediate stage in the formation of a semiconductor structure in accordance with some embodiments.
Figure 25B:
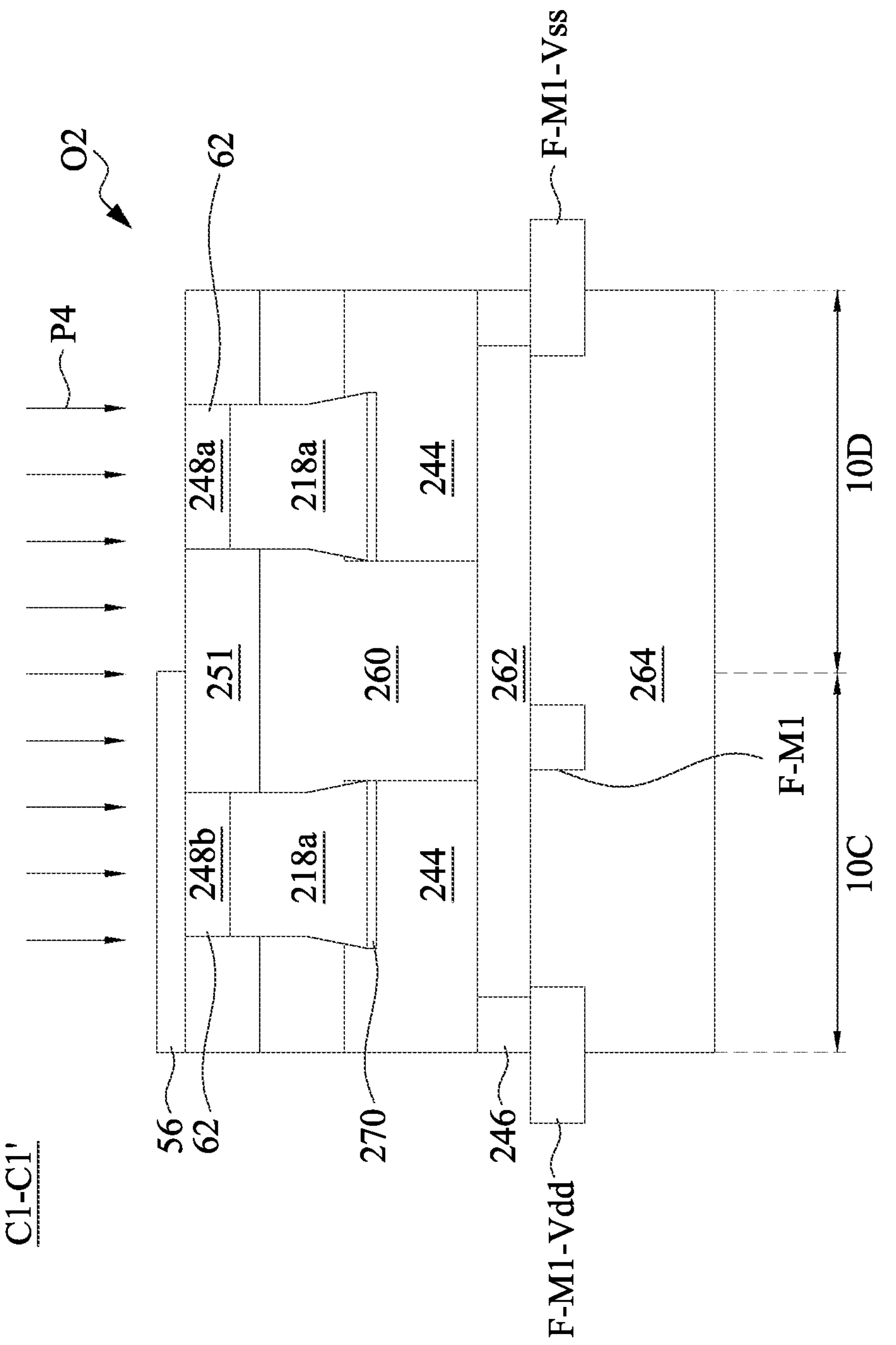
Figure 25C:
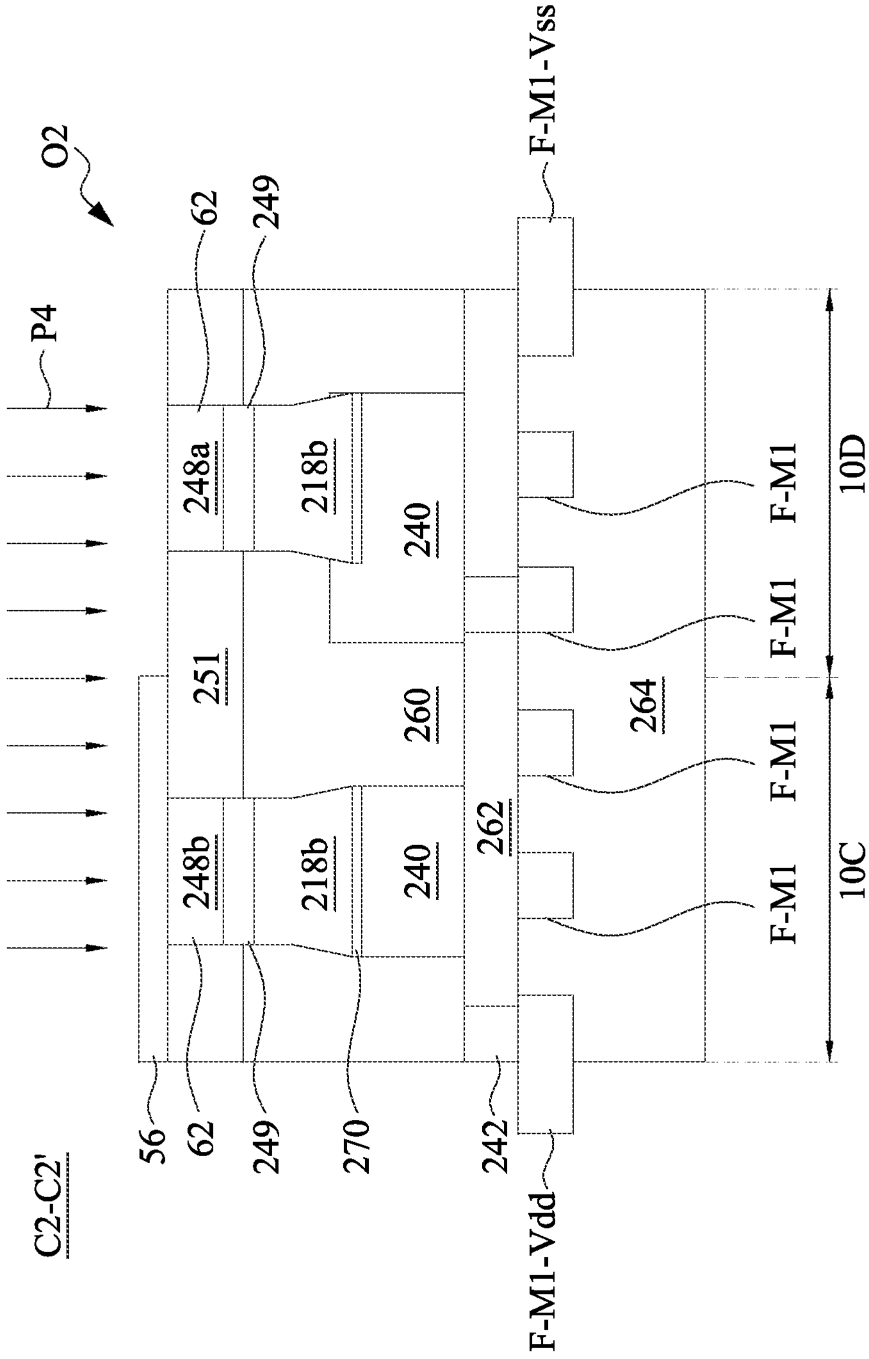
Figure 25D:
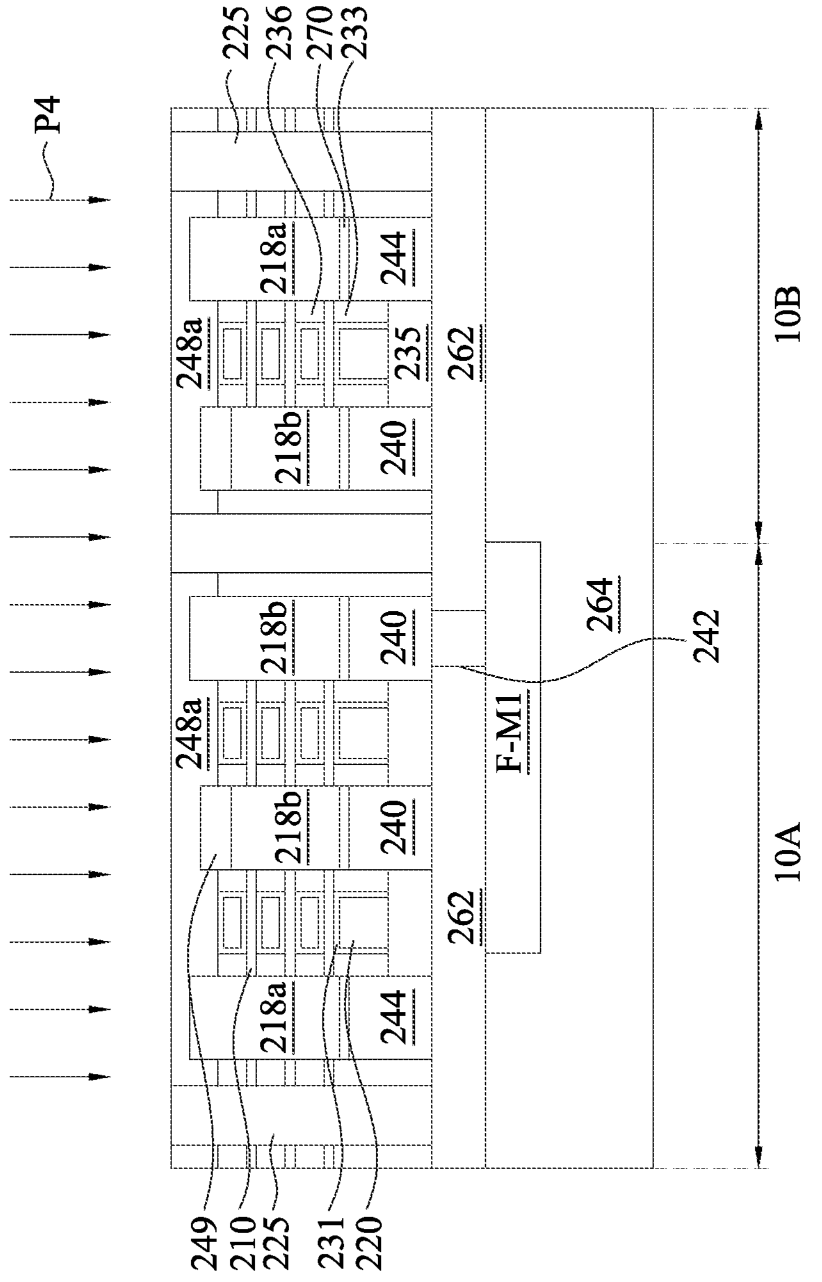

Reference is made to FIGS. 24A, 24B, and 24C. The structures of FIGS. 23B-23D are "flipped" upside down, and the substrate 50 is removed. The substrate 50 may be removed in a plurality of process operations, for example, CMP, HNA, and/or TMAH etching from the back-side 50*k* (see FIGS. 23B-23D) of the substrate 50, which stops at the STI structure 251 or the doped semiconductive layer 248*a*/248*b*. After the removal process, the STI structure 251 and the doped semiconductive layers 248*a* and 248*b* are exposed as shown in FIGS. 24A-24C.

In some embodiments, an additional third implantation process P4 may be provided after the operation as shown in FIGS. 24A-24C and the first implantation process P1 (see FIGS. 7A-7D) can be eliminated with the additional of the third implantation process P4. As shown in FIGS. 25A-25D, the back-side of the fin 62 in the first conductivity type device region 10C may be lightly doped with an n-type impurity by the third implantation process P4. This is described in greater detail, a hard mask layer 56 may be formed over the back-side of the second conductivity type device region 10D. In accordance with some embodiments, the hard mask layer 56 can be patterned so that an opening O2 may be formed over the back-side of the first conductivity type device region 10C. Subsequently, the third implantation process P4 can be performed through the opening O2 to dope an n-type dopant in the fin 62. In some embodiments, fin 62 in the conductivity type device region 10C is exposed from the opening O2 because the hard mask layer 56 can act as an implant mask. In some embodiments, the n-type dopant may include arsenic (As), antimony (Sb), phosphorous (P), or the like. In some embodiments, the third implantation process P4 may have an implanting energy in a range from about 10 keV to 120 keV. In some embodiments, the third implantation process P4 may have a total dose in a range from about 1E14 to 5E14 atoms/cm$^2$. In some embodiments, the fin 62 can have a dopant concentration that is in a range from about $5\times10^{16}$ atoms/cm$^3$ to about $1\times10^{19}$ atoms/cm$^3$. The implantation region may extend to the source/drain regions 218*a*. After the formation of first conductivity type device region 10C, the hard mask layer 56 can be removed with a wet clean process, an ashing process, or the like.

Subsequently, the fin 62 in the second conductivity type device region 10D may be lightly doped with a p-type impurity by a fourth implantation process. This is described in greater detail, a hard mask layer (not shown) may be formed over the back-side of the first conductivity type device region 10C. In accordance with some embodiments, the hard mask layer can be patterned so that an opening may be formed over the back-side of the second conductivity type device region 10D. Subsequently, the fourth implantation can be performed through the opening to dope a p-type dopant in the fin 62. In some embodiments, the fin 62 of the second conductivity type device region 10D is exposed from the opening because the photoresist layer can act as an implant mask. In some embodiments, the p-type dopant may include boron (B), or the like. In some embodiments, the second implantation may have an implanting energy in a range from about 5 keV to 50 keV. In some embodiments, the second implantation may have a total dose in a range from about 1E14 to 5E14 atoms/cm$^2$. In some embodiments, the second conductivity type device region 10D can have a dopant concentration that is in a range from about $5\times10^{16}$ atoms/cm$^3$ to about $1\times10^{19}$ atoms/cm$^3$. The implantation region may extend to the source/drain regions 218*a*. After the formation of second conductivity type device region 10D, the photoresist layer can be removed with a wet clean process, an ashing process, or the like.

Subsequently, an annealing process including a flash anneal (micro-second annealing, ussA) followed by a rapid thermal anneal (RTA) is performed on the fin 62. In some embodiments, the RTA can be interchangeably referred to a spike anneal. The flash anneal is mainly performed to repair silicon interstitial defects and the RTA is mainly performed to activate the dopants in the fin 62 within the first conductivity type device region 10C and the second conductivity type device region 10D after the silicon interstitial defects are eliminated by the flash anneal. This is described in greater detail, the flash anneal of the annealing process which can be performed to repair silicon interstitial defects may include a preheat step and a annealing step following the preheat step. The preheat step is used to preheat the fin 62. The annealing step following the preheat step is used to quickly heat up the fin 62 to a defect removal temperature. A temperature ramp-up rate of the preheat step is lower than the temperature ramp-up rate of the annealing step. In some embodiments, after the flash anneal of the annealing process P2 performed on the fin 62 is complete, the first conductivity type device region 10C and the second conductivity type device region 10D can be defect-free.

Figure 26A:
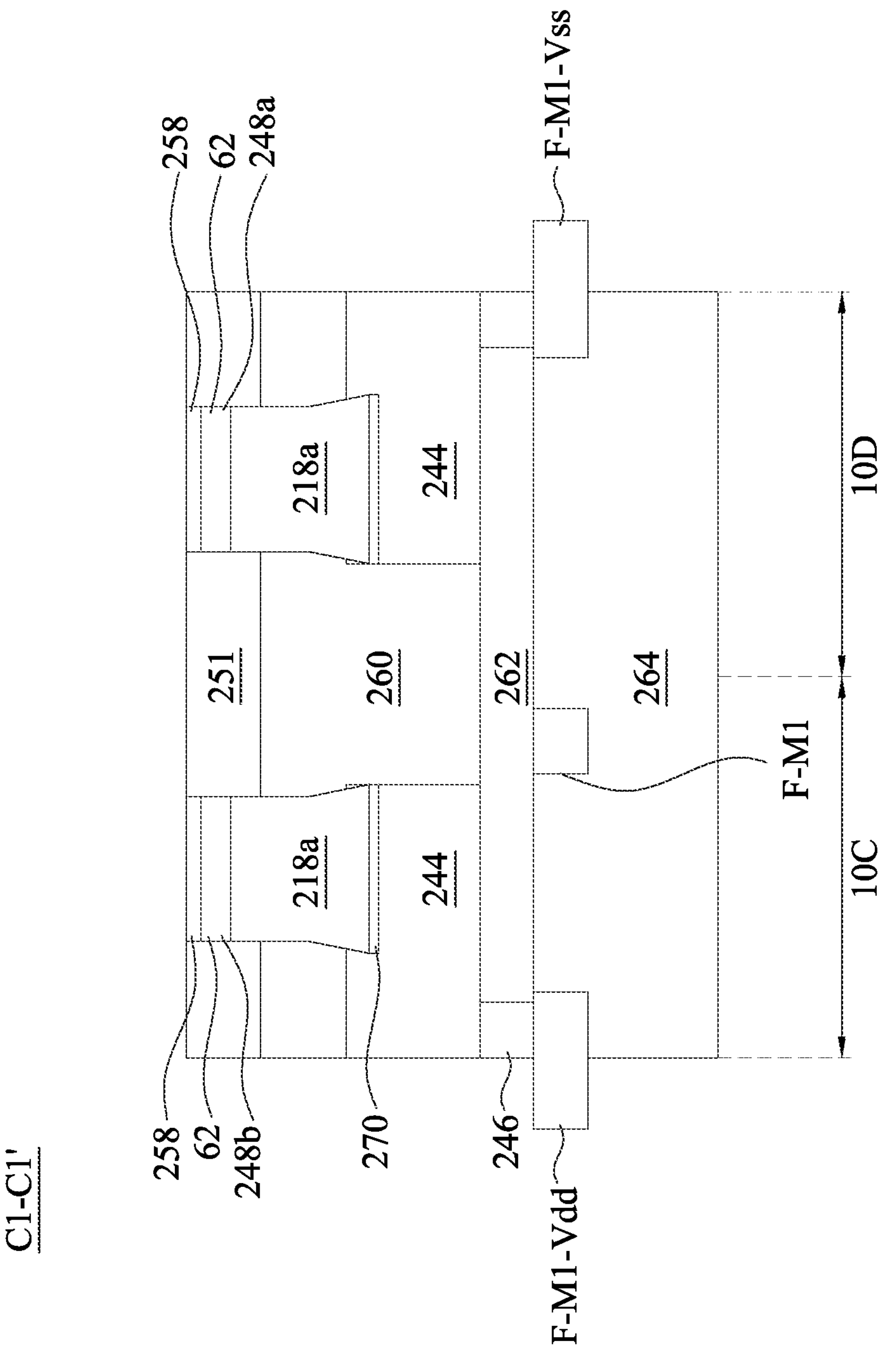
Figure 26B:
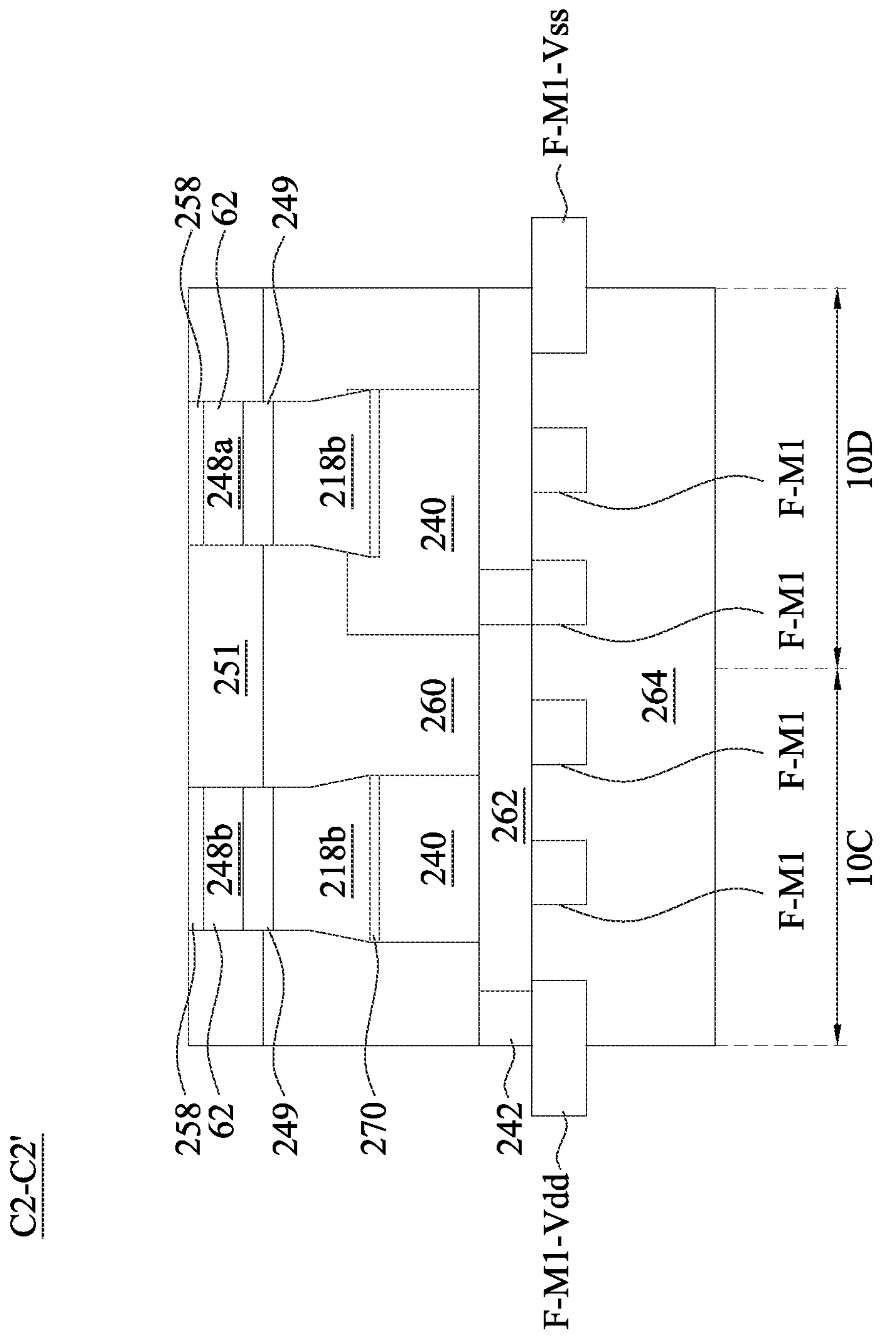
Figure 26C:
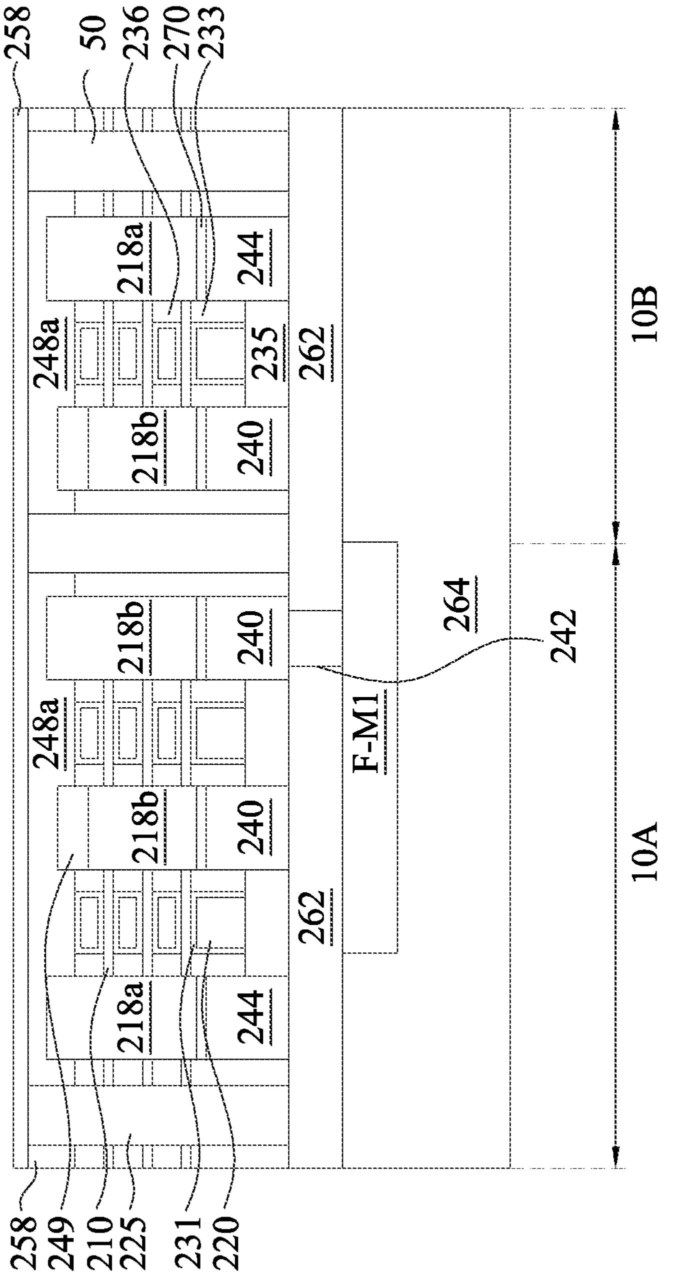
Figure 27A:
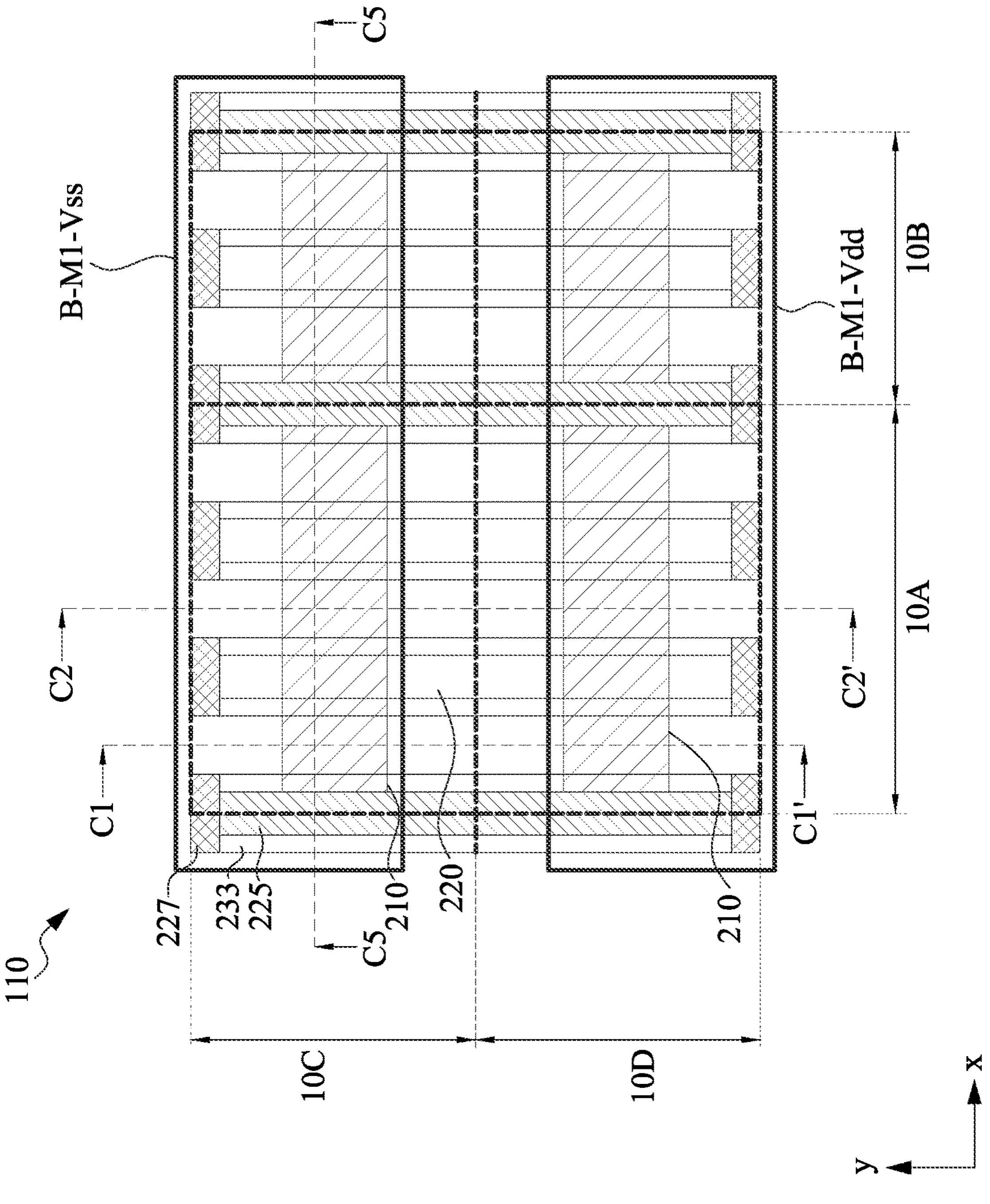
Figure 27B:
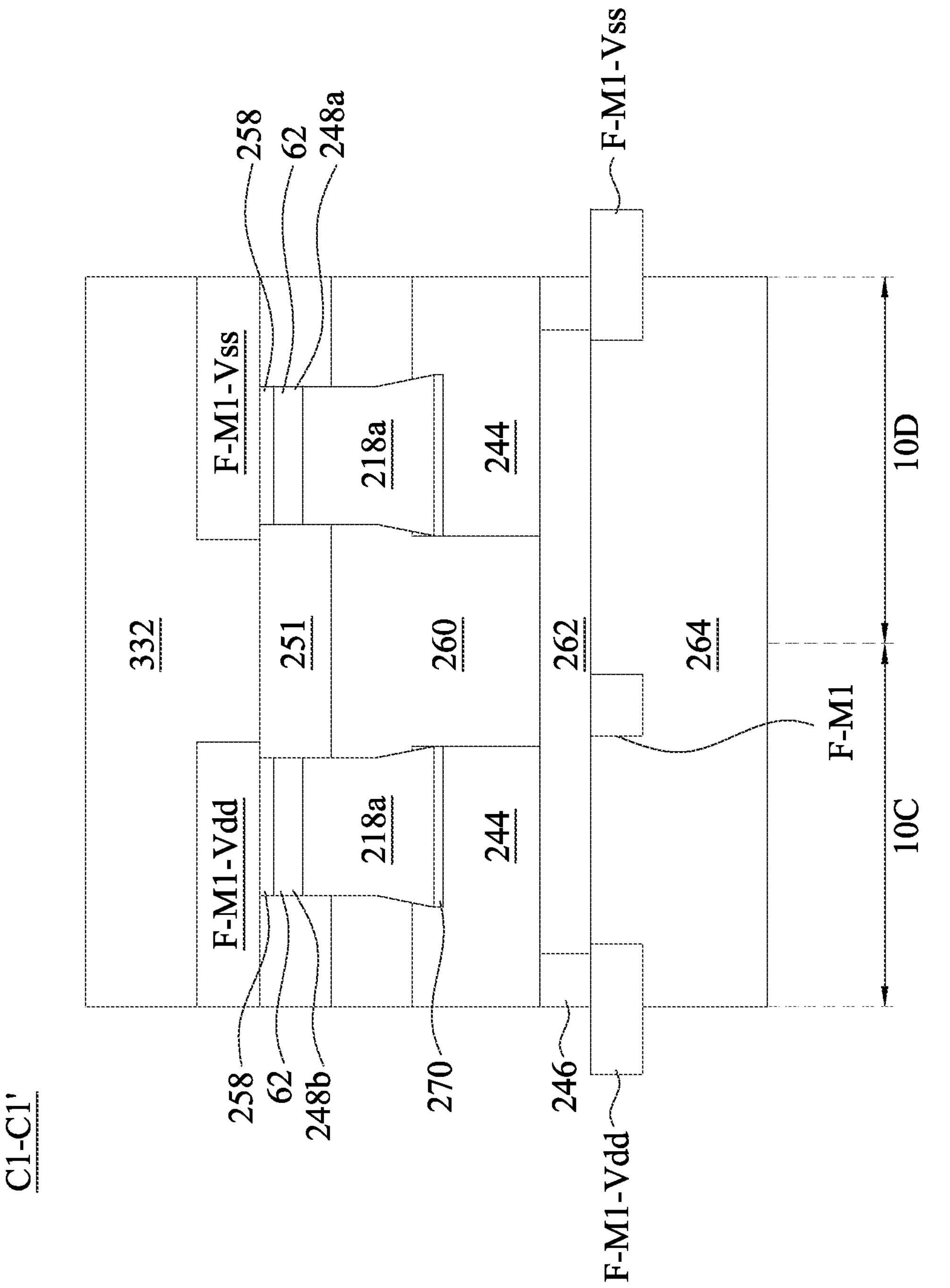
Figure 27C:
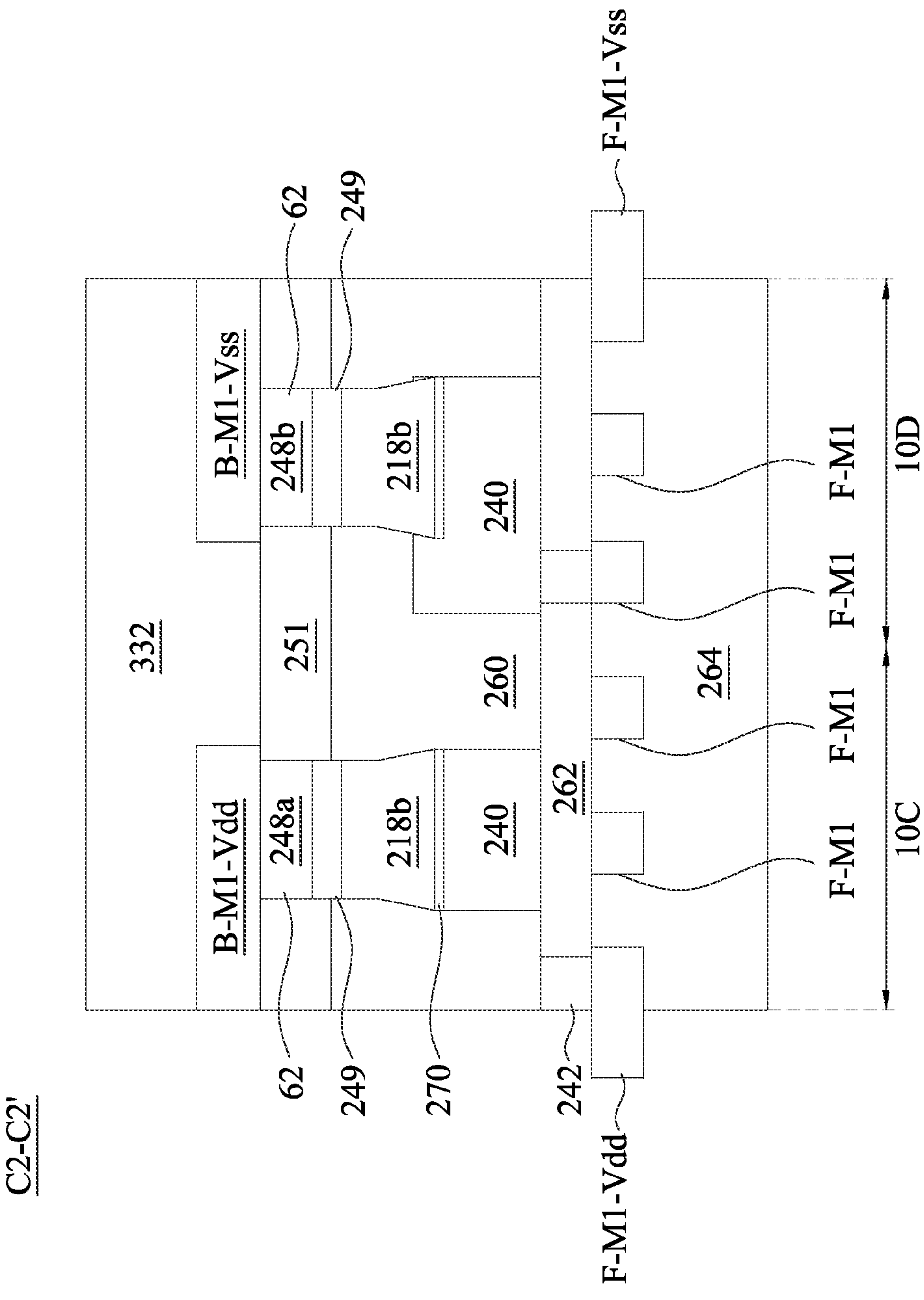
Figure 27D:
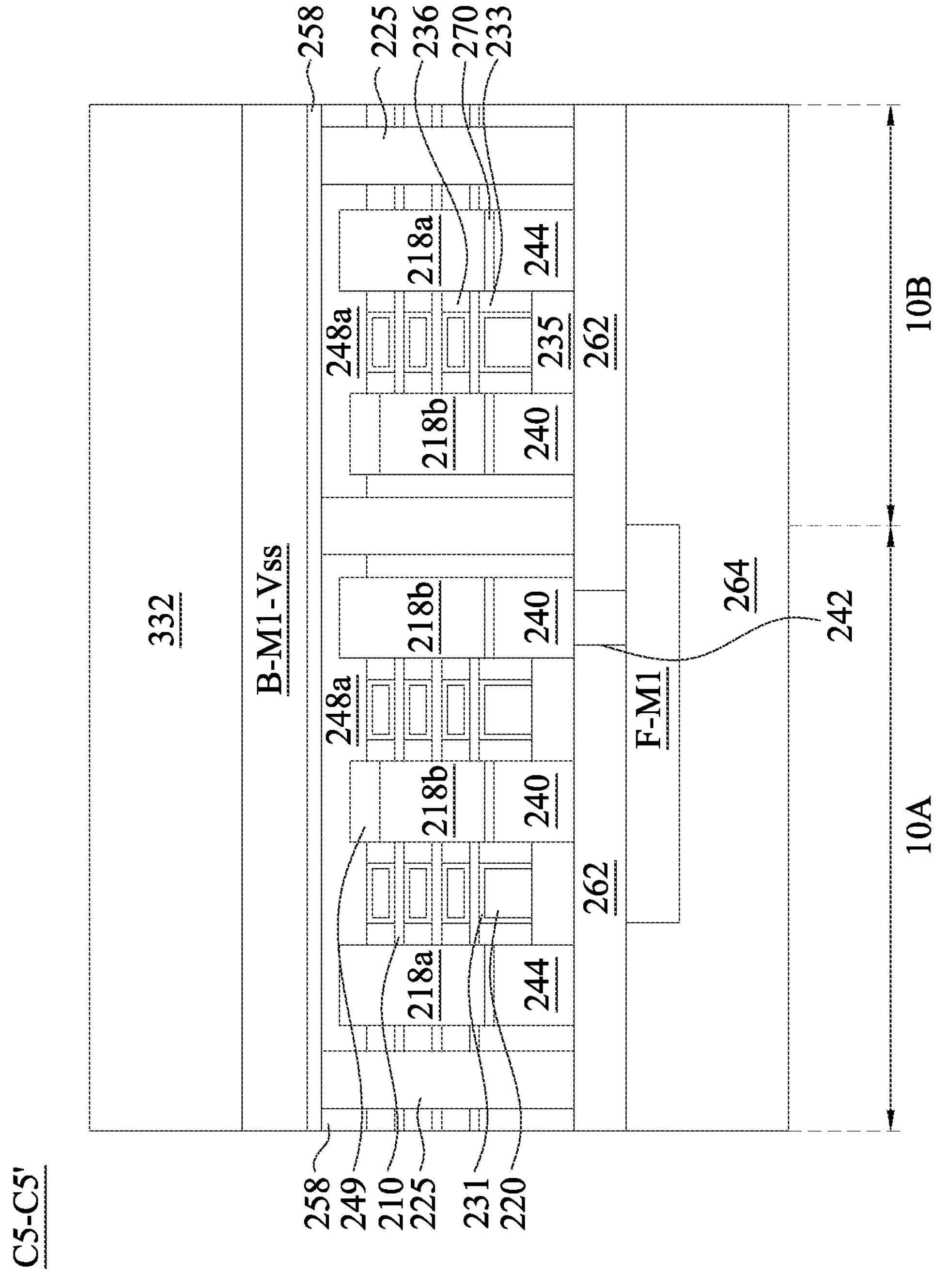

Reference is made to FIGS. 26A, 26B, and 26C. A back-side silicide region 258 is formed on the wafea metal silicidation process P5. The metal silicidation process P5 is to make a reaction between metal and silicon (or polycrystalline silicon). A metal layer is formed on the back-side of the doped semiconductive layer 248*a*/248*b*. Subsequently, regarding the metal silicidation process P5, a first rapid thermal annealing (RTA) process may be performed in, for example, Ar, He, N2 or other inert atmosphere at a first temperature, such as lower than 200~300° C., to convert the deposited metal layer into metal silicide. This is followed by an etching process to remove the unreacted metal layer from. The etching process may include a wet etch, a dry etch, and/or a combination thereof. As an example, the etchant of the wet etching may include a mixed solution of $H_2SO_4$, $H_2O_2$, $H_2O$, and/or other suitable wet etching solutions, and/or combinations thereof. Subsequently, a second annealing or RTA step at a second temperature higher than the first temperature, such as 400~500° C., thereby forming the back-side silicide region 258 with low resistance on the doped semiconductive layer 248*a*/248*b*. In some embodiments, the back-side silicide region 258 may include titanium silicide (TiSi), nickel silicide (NiSi), cobalt silicide (CoSi), Ni—Pt, CoSi2, PtSi, MoSi, MOSi2, or combinations thereof. In some embodiments, the back-side silicide region 258 can be interchangeably referred to a silicide layer or a metal silicide.

Reference is made to FIGS. 27A, 27B, 27C, and 27D. A back-side interconnect structure is formed over the doped semiconductive layer 248*a*/248*b*. The back-side interconnect structure includes a plurality of metallization layers with a plurality of metallization vias or interconnects. Other embodiments may contain more or fewer metallization layers and corresponding more or fewer number of vias. The metal line illustrated here just for an example, and the metal line may be otherwise oriented (rotated 90 degrees or at other orientations). The back-side interconnect structure may include the power supply voltage lines B-M1-Vss, B-M1-Vdd in a first back-side metallization layer formed in an IMD layer 332. The power supply voltage lines B-M1-Vss. B-M1-Vdd are electrically connected to the source/drain regions 218*a* and 218*b* through the doped semiconductive layers 248*a* and 248*b*. In some embodiments, materials of the power supply voltage lines B-M1-Vss, B-M2-Vdd may include Cu, Co, Ru, Pt, Al, W, Ti, TaN, TiN, Molybdenum (Mo), Ruthenium (Ru), Iridium (Ir), rhodium (Rh), or any combinations thereof. In some embodiments, the IMD layer 332 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like. In some embodiments, after the forming of the back-side interconnect structure, a backside to front side connection module formation (not shown) can be formed on the IC structure, such as a tap structure formation. Subsequently, backside bump pads formation (not shown) and passivation layer formation (not shown) can be formed on the back-side interconnect structure.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a metal line routing method to improve the functional density and operation performance on the IC structure. A doped semiconductive layer is formed to underlie the semiconductor sheet and extending along a lengthwise direction of the semiconductor sheet. Specifically, the doped semiconductive layer is formed by doping a fin-like structure underlying the semiconductor sheet with a dopant having a same conductivity type as the source/drain region formed overlying thereof. Subsequently, the source/drain region formed on the semiconductor sheet can self-align with the doped semiconductive layer. The source/drain region can be electrically connected to the back-side metal line through the doped semiconductive layer acting a power conductor path, and thus a manufacturing of a back-side power conductive via can be omitted and the doped semiconductive layer can be interchangeably referred to as a self-aligned connection structure. The fabrication of the doped semiconductive layer will not result in additional back-side power conductive via process and hence additional cost, such that an isolation margin issue of back-side power conductive via to gate electrode can be solved, which in turn allows for scaling the contacted poly pitch (CPP).

In some embodiments, a method includes forming a plurality of semiconductor sheets on a front-side of a semiconductive layer; forming a gate strip surrounding each of the semiconductor sheets; forming a plurality of source/drain structures on either side of each of the semiconductor sheets; doping the semiconductive layer with a dopant, the dopant has a same conductivity type as the source/drain structures; forming a power supply voltage line on a back-side of the doped semiconductive layer. In some embodiments, doping the semiconductive layer is performed from the back-side of the semiconductive layer after forming the source/drain structures. In some embodiments, doping the semiconductive layer is performed from the front-side of the semiconductive layer prior to forming the semiconductor sheets. In some embodiments, the semiconductive layer is in contact with one of the source/drain structures. In some embodiments, the method further includes after forming the gate strip and prior to forming the source/drain structures, forming a dielectric layer on the front-side of the semiconductive layer and at a first side of the gate strip. In some embodiments, forming the dielectric layer includes conformally depositing a dielectric material on the front-side of the semiconductive layer and the gate strip; removing the dielectric material on a second side of the gate strip opposite to the first side, while remaining the dielectric material on the first side of the gate strip to form the dielectric layer. In some embodiments, the method further includes forming a silicide layer on the back-side of the semiconductive layer. In some embodiments, the method further includes after doping the semiconductive layer, performing an annealing process on the semiconductive layer. In some embodiments, the dopant is an n-type dopant, and the source/drain structures are n-type source/drain structures. In some embodiments, the dopant is a p-type dopant, and the source/drain structures are p-type source/drain structures.

In some embodiments, a method includes forming a plurality of nanostructures arranged in a vertical direction on a semiconductor strip on a front-side of a substrate; forming a functional gate pattern across the nanostructures from a top view; growing epitaxial patterns on opposite sides of the nanostructures; performing a planarization process on a back-side of the substrate to expose the semiconductor strip; performing an implantation process on the semiconductor strip with a dopant, the dopant has a same conductivity type as the epitaxial patterns; forming a power supply voltage line on a back-side of the doped semiconductor strip. In some embodiments, the method further includes forming a metal silicide on the back-side of the doped semiconductor strip. In some embodiments, the method further includes forming a leakage barrier sandwiched between the semiconductor strip and one of the epitaxial patterns. In some embodiments, the method further includes forming a dummy gate pattern extending in parallel with a lengthwise direction of the functional gate pattern from the top view, wherein the dummy gate pattern has a back-side portion interrupting the semiconductor strip from a cross sectional view. In some embodiments, the method further includes forming a dummy gate pattern extending in parallel with a lengthwise direction of the functional gate pattern from the top view, wherein the dummy gate pattern has a back-side portion inlaid in the semiconductor strip from a cross sectional view.

In some embodiments, a semiconductor structure includes a transistor, a doped silicon layer, a front-side power supply voltage line, and a back-side power supply voltage line. The transistor includes a channel region, a first gate structure surrounding the channel region, and a plurality of source/drain regions on opposite sides of the first gate structure. The doped silicon layer is on a back-side of a first one of the source/drain regions and extends along a lengthwise direction of the channel region. The doped silicon layer has a same conductivity type as the source/drain regions. The front-side power supply voltage line is electrically connected to a first one of the source/drain regions. The back-side power supply voltage line is electrically connected to the doped silicon layer. In some embodiments, the semiconductor structure further includes a shallow trench isolation structure laterally surrounding the doped silicon layer. In some embodiments, the semiconductor structure further includes a dielectric barrier between the doped silicon layer and a second one of the source/drain regions. In some embodiments, the doped silicon layer extends across the first gate structure. In some embodiments, the semiconductor structure further includes a second gate structure extending in parallel with a lengthwise direction of the first gate structure. The doped silicon layer laterally extends across the second gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a plurality of semiconductor sheets on a front side of a semiconductive layer;

forming a gate strip surrounding at least one of the semiconductor sheets;

forming a plurality of source/drain structures on either side of at least one of the semiconductor sheets;

forming a dielectric gate adjacent the gate strip, the dielectric gate extending from a first elevation below a bottommost surface of the gate strip to a second elevation above an uppermost surface of the gate strip;

doping the semiconductive layer through a back side thereof with a dopant, yielding a doped semiconductive layer, the dopant having a same conductivity type as a conductivity type of the plurality of source/drain structures, the dopant implanting into the dielectric gate through a back side thereof; and forming a power supply voltage line on a back side of the doped semiconductive layer.

2. The method of claim 1, wherein doping the semiconductive layer is performed from the back side of the semiconductive layer after forming the source/drain structures.

3. The method of claim 1, comprising:

doping the semiconductive layer from the front side of the semiconductive layer prior to forming the semiconductor sheets.

4. The method of claim 1, wherein the semiconductive layer is in contact with one of the source/drain structures.

5. The method of claim 1, comprising:

after forming the gate strip and prior to forming the source/drain structures, forming a dielectric layer on the front side of the semiconductive layer and at a first side of the gate strip.

6. The method of claim 5, wherein forming the dielectric layer comprises:

conformally depositing a dielectric material on the front side of the semiconductive layer and the gate strip; and removing the dielectric material on a second side of the gate strip opposite to the first side, while the dielectric material on the first side of the gate strip remains thereon to form the dielectric layer.

7. The method of claim 1, comprising:

forming a silicide layer on the back side of the semiconductive layer.

8. The method of claim 1, comprising:

after doping the semiconductive layer, performing an annealing process on the semiconductive layer.

9. The method of claim 1, wherein the dopant is an n-type dopant, and the source/drain structures are n-type source/drain structures.

10. The method of claim 1, wherein the dopant is a p-type dopant, and the source/drain structures are p-type source/drain structures.

11. A method, comprising:

forming a plurality of nanostructures arranged in a vertical direction on a semiconductor strip on a front side of a substrate;

forming a functional gate pattern across at least one of the nanostructures from a top view;

forming a dielectric gate adjacent the functional gate pattern, the dielectric gate extending from a first elevation below a bottommost nanostructure of the plurality of nanostructures to a second elevation above an uppermost nanostructure of the plurality of nanostructures;

growing epitaxial patterns on opposite sides of at least one of the nanostructures;

performing a planarization process on a back side of the substrate to expose the semiconductor strip and the dielectric gate;

performing an implantation process on the semiconductor strip with a dopant yielding a doped semiconductor strip, the dopant having a same conductivity type as conductivity type of the epitaxial patterns, the dopant implanting into the dielectric gate from a back side thereof; and forming a power supply voltage line on a back side of the doped semiconductor strip.

12. The method of claim 11, comprising:

forming a metal silicide on the back side of the doped semiconductor strip.

13. The method of claim 11, comprising:

forming a leakage barrier sandwiched between the semiconductor strip and one of the epitaxial patterns.

14. The method of claim 11, comprising:

forming a dummy gate pattern extending in parallel with a lengthwise direction of the functional gate pattern from the top view, wherein the dummy gate pattern has a back-side portion interrupting the semiconductor strip from a cross-sectional view.

15. The method of claim 11, comprising:

forming a dummy gate pattern extending in parallel with a lengthwise direction of the functional gate pattern from the top view, wherein the dummy gate pattern has a back-side portion inlaid in the semiconductor strip from a cross-sectional view.

16. A method, comprising:

forming a first stack of nanostructures, a second stack of nanostructures, and a third stack of nanostructures over a semiconductor layer, the second stack positioned between the first stack and the third stack;

forming an isolation structure adjacent the semiconductor layer;

forming a source/drain region between the first stack and the second stack;

removing portions of the nanostructures of the second stack yielding an opening extending into the semiconductor layer, the opening further extending into the isolation structure;

forming a dielectric gate in the opening;

performing a planarization operation, such that a first bottommost surface of the semiconductor layer, a second bottommost surface of the isolation structure, and a third bottommost surface of the dielectric gate are exposed; and performing dopant implantation through the first bottommost surface, the second bottommost surface, and the third bottommost surface, yielding a doped semiconductor layer having a same conductivity type as a conductivity type of the source/drain region, wherein dopants of the dopant implantation are implanted into the dielectric gate from a back side thereof.

17. The method of claim 16, comprising:

forming a conductive line under the doped semiconductor layer.

18. The method of claim 17, comprising:

prior to forming the conductive line, forming a silicide layer under the doped semiconductor layer, the conductive line being formed over the silicide layer.

19. The method of claim 18, wherein forming the silicide layer comprises:

forming the silicide layer having an upper surface contiguous with a bottom surface of the dielectric gate.

20. The method of claim 16, wherein forming the dielectric gate comprises:

forming the dielectric gate to extend partially into the isolation structure.

* * * * *